US012801804B2

(12) United States Patent
Bologna et al.

(10) Patent No.: US 12,801,804 B2
(45) Date of Patent: Nov. 17, 2026

(54) DATA COLLECTION, PROCESSING AND FITMENT SYSTEM FOR A PROTECTIVE SPORTS HELMET

(71) Applicant: Riddell, Inc., Des Plaines, IL (US)

(72) Inventors: Vittorio Bologna, Des Plaines, IL (US); Joseph Levene, Des Plaines, IL (US)

(73) Assignee: Riddell, Inc., Des Plaines, IL (US)

( * ) Notice: Subject to any disclaimer, the term of this patent is extended or adjusted under 35 U.S.C. 154(b) by 0 days.

(21) Appl. No.: 18/599,162

(22) Filed: Mar. 7, 2024

(65) Prior Publication Data

US 2024/0296259 A1 Sep. 5, 2024

Related U.S. Application Data

(63) Continuation of application No. PCT/US2022/042966, filed on Sep. 8, 2022.

(Continued)

(51) Int. Cl.

*G06F 30/17* (2020.01)
*A42C 2/00* (2006.01)
*G06T 19/20* (2011.01)

(52) U.S. Cl.

CPC .............. *G06F 30/17* (2020.01); *A42C 2/007* (2013.01); *G06T 19/20* (2013.01); *G06T 2219/2004* (2013.01)

(58) Field of Classification Search

None

See application file for complete search history.

(56) References Cited

U.S. PATENT DOCUMENTS 9,545,127 B1 1/2017 Sandifer
11,213,736 B2 * 1/2022 Bologna ................ A42C 2/002

(Continued)

FOREIGN PATENT DOCUMENTS

WO WO-2018072017 A1 * 4/2018 ............. A42B 3/124
WO WO-2025088277 A1 * 5/2025 ............. A42C 2/007

OTHER PUBLICATIONS

Ellena, Thierry, et al. "A design framework for the mass customisation of custom-fit bicycle helmet models." International Journal of Industrial Ergonomics 64 (2018): 122-133. (Year: 2018) (Year: 2018).*

(Continued)

*Primary Examiner* — Zhengxi Liu
(74) *Attorney, Agent, or Firm* — Barnes & Thornburg LLP

(57) ABSTRACT

A data collection, processing and fitment system for a protective sports helmet that is designed to improve: (i) the comfort and fit of the helmet, (ii) the efficiency of the design, selection and build process, and (iii) how the helmet responds when an impact or series of impacts are received by the helmet when worn by a player. In general terms, the system selects a combination of pre-manufactured energy attenuation components from a larger collection of pre-manufactured energy attenuation components that best fit the head of the player that will wear the helmet based upon data collected from the player. The system features other steps, including: creating a head model of the specific player's head from the obtained anatomical head data within a computer software program; providing a computerized helmet template that includes a helmet template reference point and a plurality of energy attenuation surfaces; aligning the head model of the player's head within the computerized helmet template; determining a plurality of energy attenuation coordinates; determining a player coordinate; determin- (Continued)

ing a plurality of fit values by calculating the distance from the player coordinate to each of the plurality of energy attenuation coordinates; comparing the fit values contained in the plurality of fit values to a predefined ideal fit value; selecting the fit value that is closes to the predefined ideal fit value; identifying the pre-manufactured energy attenuation component that is associated with the selected fit value; and then installing the identified pre-manufactured energy attenuation component within the protective sports helmet.

23 Claims, 65 Drawing Sheets

Related U.S. Application Data

(60) Provisional application No. 63/242,010, filed on Sep. 8, 2021.

(56) References Cited

U.S. PATENT DOCUMENTS

| | | | | |
|---|---|---|---|---|
| 11,399,589 | B2 * | 8/2022 | Bologna | A42B 3/046 |
| 11,712,615 | B2 | 8/2023 | Bologna et al. | |
| 11,857,378 | B1 * | 1/2024 | Bojarski | G06F 3/013 |
| 12,104,892 | B2 | 10/2024 | King | |
| 2012/0036620 | A1 * | 2/2012 | Harris | A42B 3/127<br>2/414 |
| 2013/0211774 | A1 | 8/2013 | Bentley et al. | |
| 2014/0201889 | A1 | 7/2014 | Pietrzak et al. | |
| 2020/0188733 | A1 * | 6/2020 | Beckwith | A42B 3/0433 |
| 2020/0215415 | A1 * | 7/2020 | Bologna | A63B 71/10 |
| 2021/0001207 | A1 | 1/2021 | Bologna et al. | |
| 2021/0055711 | A1 * | 2/2021 | Pietrzak | A42C 2/007 |
| 2021/0283855 | A1 * | 9/2021 | Bologna | A61B 5/6803 |
| 2023/0354944 | A1 * | 11/2023 | Petre | A42B 3/127 |

OTHER PUBLICATIONS

Zuckerman, Scott L., et al. "A football helmet prototype that reduces linear and rotational acceleration with the addition of an outer shell." Journal of neurosurgery 130.5 (2018): 1634-1641. (Year: 2018) (Year: 2018).*

Van Den Bosch, Henricus Lambertus Antonius. "Crash helmet testing and design specifications." (2006). (Year: 2006) (Year: 2006).*

Zhang, Jie, et al. "Customize my helmet: A novel algorithmic approach based on 3D head prediction." Computer-Aided Design 150 (2022): 103271. (Year: 2022) (Year: 2022).*

Chang, Chia-Yuan, Chih-Hsiang Ho, and San-Yi Chang. "Design of a Helmet." ME 499 (2003): 599. (Year: 2003) (Year: 2003).*

Meyer, David G., and John Hauser. "Modeling and exploration of an active helmet design." 2013 American Control Conference. IEEE, 2013. (Year: 2013) (Year: 2013).*

Tan, Long Bin, et al. "Performance of an advanced combat helmet with different interior cushioning systems in ballistic impact: Experiments and finite element simulations." International Journal of Impact Engineering 50 (2012): 99-112. (Year: 2012) (Year: 2012).*

Johnston, James M., et al. "Simulation, fabrication and impact testing of a novel football helmet padding system that decreases rotational acceleration." Sports Engineering 18.1 (2015): 11-20. (Year: 2015) (Year: 2015).*

* cited by examiner 226.2, 226,4

230

207.2.99, 209.2.99

232,232.2, 232.4

| POINT ID | BLUE THRESHOLD | | | ORIGIN POINTS | | | LINE LENGTH |
|---|---|---|---|---|---|---|---|
| | X | Y | Z | X | Y | Z | |
| 0 | BX0 | BY0 | BZ0 | OX | OY | OZ | B0 |
| 1 | BX1 | BY1 | BZ1 | OX | OY | OZ | B1 |
| 2 | BX2 | BY2 | BZ2 | OX | OY | OZ | B2 |
| 3 | BX3 | BY3 | BZ3 | OX | OY | OZ | B3 |
| 4 | BX4 | BY4 | BZ4 | OX | OY | OZ | B4 |
| 5 | BX5 | BY5 | BZ5 | OX | OY | OZ | B5 |
| 6 | BX6 | BY6 | BZ6 | OX | OY | OZ | B6 |
| 7 | BX7 | BY7 | BZ7 | OX | OY | OZ | B7 |
| 8 | BX8 | BY8 | BZ8 | OX | OY | OZ | B8 |
| 9 | BX9 | BY9 | BZ9 | OX | OY | OZ | B9 |
| 10 | BX10 | BY10 | BZ10 | OX | OY | OZ | B10 |
| 11 | BX11 | BY11 | BZ11 | OX | OY | OZ | B11 |
| 12 | BX12 | BY12 | BZ12 | OX | OY | OZ | B12 |
| 13 | BX13 | BY13 | BZ13 | OX | OY | OZ | B13 |
| 14 | BX14 | BY14 | BZ14 | OX | OY | OZ | B14 |
| 15 | BX15 | BY15 | BZ15 | OX | OY | OZ | B15 |
| 16 | BX16 | BY16 | BZ16 | OX | OY | OZ | B16 |
| 17 | BX17 | BY17 | BZ17 | OX | OY | OZ | B17 |
| 18 | BX18 | BY18 | BZ18 | OX | OY | OZ | B18 |
| 19 | BX19 | BY19 | BZ19 | OX | OY | OZ | B19 |
| 20 | BX20 | BY20 | BZ20 | OX | OY | OZ | B20 |
| 21 | BX21 | BY21 | BZ21 | OX | OY | OZ | B21 |
| 22 | BX22 | BY22 | BZ22 | OX | OY | OZ | B22 |
| 23 | BX23 | BY23 | BZ23 | OX | OY | OZ | B23 |

4

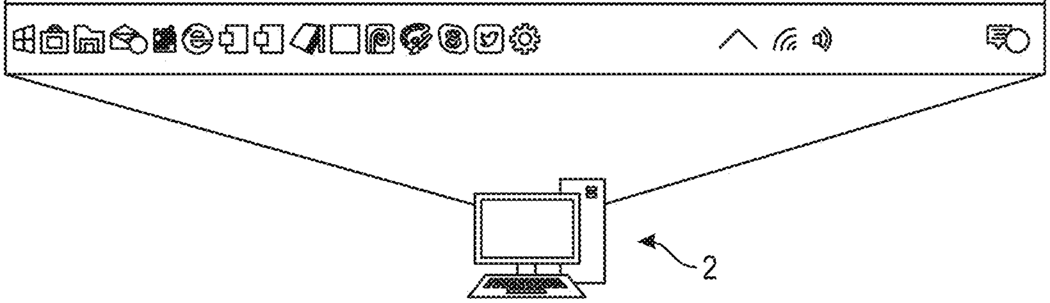

2

FIG. 19

264.2, 226.2, 266.4

207.2.99, 207.4.99

272.2, 272.4 272

| POINT ID | ENERGY MANAGEMENT MEMBER LOWER FRONT 0 | | | ORIGIN POINTS | | | LINE LENGTH |
|---|---|---|---|---|---|---|---|
| | X | Y | Z | X | Y | Z | |
| 0 | EM0X0 | EM0Y0 | EM0Z0 | OX | OY | OZ | 00 |
| 1 | EM0X1 | EM0Y1 | EM0Z1 | OX | OY | OZ | 01 |
| 2 | NA | NA | NA | OX | OY | OZ | NA |
| 3 | NA | NA | NA | OX | OY | OZ | NA |
| 4 | NA | NA | NA | OX | OY | OZ | NA |
| 5 | NA | NA | NA | OX | OY | OZ | NA |
| 6 | NA | NA | NA | OX | OY | OZ | NA |
| 7 | NA | NA | NA | OX | OY | OZ | NA |
| 8 | NA | NA | NA | OX | OY | OZ | NA |
| 9 | NA | NA | NA | OX | OY | OZ | NA |
| 10 | NA | NA | NA | OX | OY | OZ | NA |
| 11 | NA | NA | NA | OX | OY | OZ | NA |
| 12 | NA | NA | NA | OX | OY | OZ | NA |
| 13 | NA | NA | NA | OX | OY | OZ | NA |
| 14 | NA | NA | NA | OX | OY | OZ | NA |
| 15 | NA | NA | NA | OX | OY | OZ | NA |
| 16 | NA | NA | NA | OX | OY | OZ | NA |
| 17 | NA | NA | NA | OX | OY | OZ | NA |
| 18 | NA | NA | NA | OX | OY | OZ | NA |
| 19 | NA | NA | NA | OX | OY | OZ | NA |
| 20 | NA | NA | NA | OX | OY | OZ | NA |
| 21 | EM0X21 | EM0Y21 | EM0Z21 | OX | OY | OZ | 021 |
| 22 | EM0X22 | EM0Y22 | EM0Z22 | OX | OY | OZ | 022 |
| 23 | NA | NA | NA | OX | OY | OZ | NA |

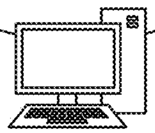

2

FIG.29

| POINT ID | LOWER FRONT | | | | | | | | | |
|---|---|---|---|---|---|---|---|---|---|---|
| | CENTER | | | LEFT SIDE | | | FAR LEFT SIDE | | | $LF_{TOTAL}$ |
| | 0 | 1 | $LF_1$ | 21 | 22 | $LF_2$ | 42 | 43 | $LF_3$ | |
| 0 | 00 | 01 | 0A1 | 021 | 022 | 0A2 | 042 | 043 | 0A3 | MLF0 |
| 1 | 10 | 11 | 1A1 | 121 | 122 | 1A2 | 142 | 143 | 1A3 | MLF1 |
| 2 | 20 | 21 | 2A1 | 221 | 222 | 2A2 | 242 | 243 | 2A3 | MLF2 |
| 3 | 30 | 31 | 3A1 | 321 | 322 | 3A2 | 342 | 343 | 3A3 | MLF3 |
| 4 | 40 | 41 | 4A1 | 421 | 422 | 4A2 | 442 | 443 | 4A3 | MLF4 |
| 5 | 50 | 51 | 5A1 | 521 | 522 | 5A2 | 542 | 543 | 5A3 | MLF5 |
| 6 | 60 | 61 | 6A1 | 621 | 622 | 6A2 | 642 | 643 | 6A3 | MLF6 |
| 7 | 70 | 71 | 7A1 | 721 | 722 | 7A2 | 742 | 743 | 7A3 | MLF7 |

274.2.2
274.2.4
274.2.6
274.2.8
274.2.10
274.2.12
274.2.14
274.2.16

8:19 AM
4/23/2019

290

SMALL

| CONFIGURATION | LOWER FRONT | UPPER FRONT | CROWN | REAR | OCCIPITAL | SIDE | FRONT BOSS | JAW |
|---|---|---|---|---|---|---|---|---|
| 0 | SLF0 | SUF0 | SC0 | SR0 | SO0 | SS0 | SF0 | SJ0 |
| 1 | SLF1 | SUF1 | SC1 | SR1 | SO1 | SS1 | SF1 | SJ1 |
| 2 | SLF2 | SUF2 | SC2 | SR2 | SO2 | SS2 | SF2 | SJ2 |
| 3 | SLF3 | SUF3 | SC3 | SR3 | SO3 | SS3 | SF3 | SJ3 |
| 4 | SLF4 | SUF4 | SC4 | SR4 | SO4 | SS4 | SF4 | SJ4 |
| 5 | SLF5 | SUF5 | SC5 | SR5 | SO5 | SS5 | SF5 | SJ5 |
| 6 | SLF6 | SUF6 | SC6 | SR6 | SO6 | SS6 | SF6 | SJ6 |
| 7 | SLF7 | SUF7 | SC7 | SR7 | SO7 | SS7 | SF7 | SJ7 |

MEDIUM

| CONFIGURATION | LOWER FRONT | UPPER FRONT | CROWN | REAR | OCCIPITAL | SIDE | FRONT BOSS | JAW |
|---|---|---|---|---|---|---|---|---|
| 0 | MLF0 | MUF0 | MC0 | MR0 | MO0 | MS0 | MF0 | MJ0 |
| 1 | MLF1 | MUF1 | MC1 | MR1 | MO1 | MS1 | MF1 | MJ1 |
| 2 | MLF2 | MUF2 | MC2 | MR2 | MO2 | MS2 | MF2 | MJ2 |
| 3 | MLF3 | MUF3 | MC3 | MR3 | MO3 | MS3 | MF3 | MJ3 |
| 4 | MLF4 | MUF4 | MC4 | MR4 | MO4 | MS4 | MF4 | MJ4 |
| 5 | MLF5 | MUF5 | MC5 | MR5 | MO5 | MS5 | MF5 | MJ5 |
| 6 | MLF6 | MUF6 | MCC6 | MR6 | MO6 | MS6 | MF6 | MJ6 |
| 7 | MLF7 | MUF7 | MC7 | MR7 | MO7 | MS7 | MF7 | MJ7 |

274.16.2

274.16.16

LARGE

| CONFIGURATION | LOWER FRONT | UPPER FRONT | CROWN | REAR | OCCIPITAL | SIDE | FRONT BOSS | JAW |
|---|---|---|---|---|---|---|---|---|
| 0 | LLF0 | LUF0 | LC0 | LR0 | LO0 | LS0 | LF0 | LJ0 |
| 1 | LLF1 | LUF1 | LC1 | LR1 | LO1 | LS1 | LF1 | LJ1 |
| 2 | LLF2 | LUF2 | LC2 | LR2 | LO2 | LS2 | LF2 | LJ2 |
| 3 | LLF3 | LUF3 | LC3 | LR3 | LO3 | LS3 | LF3 | LJ3 |
| 4 | LLF4 | LUF4 | LC4 | LR4 | LO4 | LS4 | LF4 | LJ4 |
| 5 | LLF5 | LUF5 | LC5 | LR5 | LO5 | LS5 | LF5 | LJ5 |
| 6 | LLF6 | LUF6 | LC6 | LR6 | LO6 | LS6 | LF6 | LJ6 |
| 7 | LLF7 | LUF7 | LC7 | LR7 | LO7 | LS7 | LF7 | LJ7 |

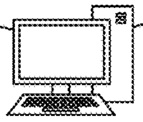

2

FIG. 38

420.2, 420.4

207.2.99, 207.4.99

440.2, 440.4, 440

| POINT ID | ENERGY MANAGEMENT MEMBER LOWER FRONT 0 | | | ORIGIN POINTS | | | LINE LENGTH |
|---|---|---|---|---|---|---|---|
| | X | Y | Z | X | Y | Z | |
| 0 | HX0 | HY0 | HZ0 | OX | OY | OZ | H0 |
| 1 | HX1 | HY1 | HZ1 | OX | OY | OZ | H1 |
| 2 | HX2 | HY2 | HZ2 | OX | OY | OZ | H2 |
| 3 | HX3 | HY3 | HZ3 | OX | OY | OZ | H3 |
| 4 | HX4 | HY4 | HZ4 | OX | OY | OZ | H4 |
| 5 | HX5 | HY5 | HZ5 | OX | OY | OZ | H5 |
| 6 | HX6 | HY6 | HZ6 | OX | OY | OZ | H6 |
| 7 | HX7 | HY7 | HZ7 | OX | OY | OZ | H7 |
| 8 | HX8 | HY8 | HZ8 | OX | OY | OZ | H8 |
| 9 | HX9 | HY9 | HZ9 | OX | OY | OZ | H9 |
| 10 | HX10 | HY10 | HZ10 | OX | OY | OZ | H10 |
| 11 | HX11 | HY11 | HZ11 | OX | OY | OZ | H11 |
| 12 | HX12 | HY12 | HZ12 | OX | OY | OZ | H12 |
| 13 | HX13 | HY13 | HZ13 | OX | OY | OZ | H13 |
| 14 | HX14 | HY14 | HZ14 | OX | OY | OZ | H14 |
| 15 | HX15 | HY15 | HZ15 | OX | OY | OZ | H15 |
| 16 | HX16 | HY16 | HZ16 | OX | OY | OZ | H16 |
| 17 | HX17 | HY17 | HZ17 | OX | OY | OZ | H17 |
| 18 | HX18 | HY18 | HZ18 | OX | OY | OZ | H18 |
| 19 | HX19 | HY19 | HZ19 | OX | OY | OZ | H19 |
| 20 | HX20 | HY20 | HZ20 | OX | OY | OZ | H20 |
| 21 | HX21 | HY21 | HZ21 | OX | OY | OZ | H21 |
| 22 | HX22 | HY22 | HZ22 | OX | OY | OZ | H22 |
| 23 | HX23 | HY23 | HZ23 | OX | OY | OZ | H23 |

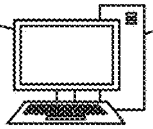

FIG. 45

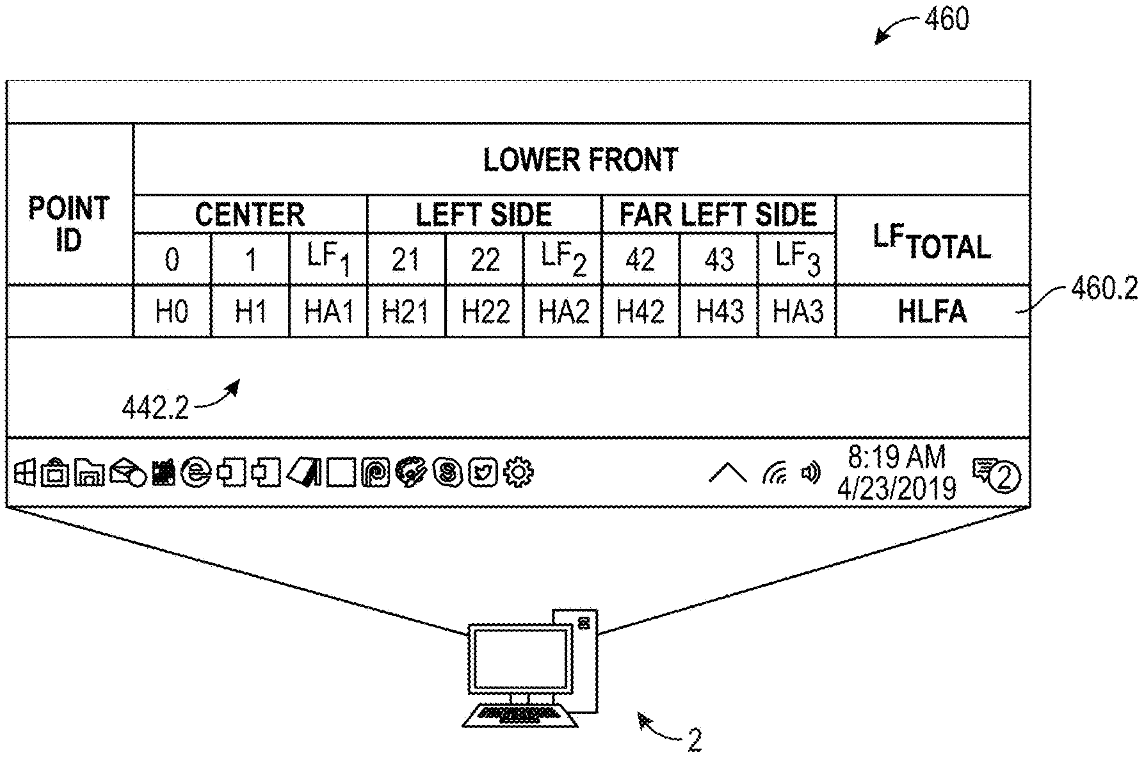

| POINT ID | LOWER FRONT | | | | | | | | | |
|---|---|---|---|---|---|---|---|---|---|---|
| | CENTER | | | LEFT SIDE | | | FAR LEFT SIDE | | | $LF_{TOTAL}$ |
| | 0 | 1 | $LF_1$ | 21 | 22 | $LF_2$ | 42 | 43 | $LF_3$ | |
| | H0 | H1 | HA1 | H21 | H22 | HA2 | H42 | H43 | HA3 | **HLFA** |

FIG. 46

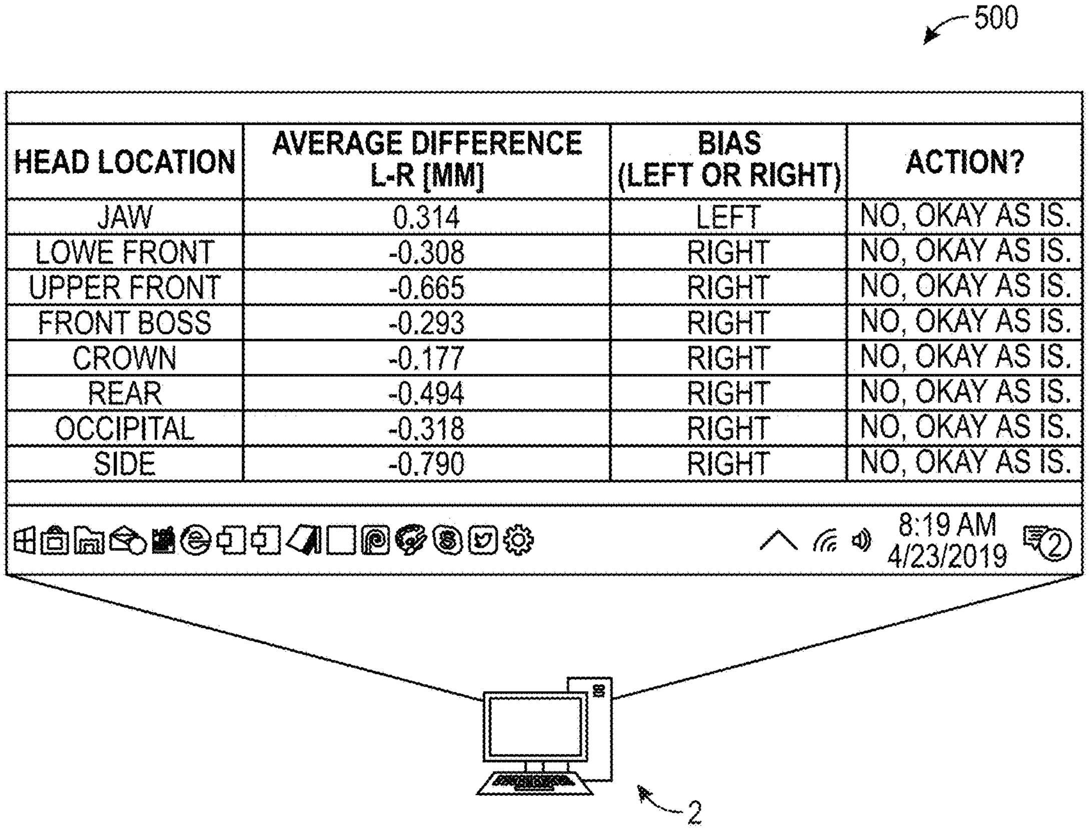

| HEAD LOCATION | AVERAGE DIFFERENCE L-R [MM] | BIAS (LEFT OR RIGHT) | ACTION? |
|---|---|---|---|
| JAW | 0.314 | LEFT | NO, OKAY AS IS. |
| LOWE FRONT | -0.308 | RIGHT | NO, OKAY AS IS. |
| UPPER FRONT | -0.665 | RIGHT | NO, OKAY AS IS. |
| FRONT BOSS | -0.293 | RIGHT | NO, OKAY AS IS. |
| CROWN | -0.177 | RIGHT | NO, OKAY AS IS. |
| REAR | -0.494 | RIGHT | NO, OKAY AS IS. |
| OCCIPITAL | -0.318 | RIGHT | NO, OKAY AS IS. |
| SIDE | -0.790 | RIGHT | NO, OKAY AS IS. |

FIG. 48

| POINT ID | HEAD | THRESHOLD |
|---|---|---|
| BLUE | HSA | BSA |
| | HRA | BRA |
| | HOA | BOA |
| GREEN | HSA | GSA |
| | HRA | GRA |
| | HOA | GOA |

630

| SMALL | MEDIUM | LARGE |
|---|---|---|
| HSA < BSA | HSA > BSA AND HSA < GSA | HSA > GSA |
| HRA < BSA | HRA > BRA AND HRA < GRA | HRA > GRA |
| HOA < BOA | HOA > BOA AND HOA < GOA | HOA > GOA |

| LINE LENGTHS | CONFIGURATION | LOWER FRONT | UPPER FRONT | CROWN | REAR | OCCIPITAL | SIDE | FRONT BOSS | JAW |
|---|---|---|---|---|---|---|---|---|---|
| AVERAGE **PLAYER** LINE LENGTHS | - | HLFA 460.2 | HUFA 460.4 | HCA 460.6 | HRA 460.8 | HOA 460.10 | HAS 460.12 | HFBA 460.14 | HJA 460.16 |
| AVERAGE **PAD** LINE LENGTHS | 0 | MLF0 274.2.2 | MUF0 | MC0 | MR0 | MO0 | MS0 | MFB0 | MJ0 |
| | 1 | MLF1 274.2.4 | MUF1 | MC1 | MR1 | MO1 | MS1 | MFB1 | MJ1 |
| | 2 | MLF2 274.2.6 | MUF2 | MC2 | MR2 | MO2 | MS2 | MFB2 | MJ2 |
| | 3 | MLF3 274.2.8 | MUF3 | MC3 | MR3 | MO3 | MS3 | MFB3 | MJ3 |
| | 4 | MLF4 274.2.10 | MUF4 | MC4 | MR4 | MO4 | MS4 | MFB4 | MJ4 |
| | 5 | MLF5 274.2.12 | MUF5 | MC5 | MR5 | MO5 | MS5 | MFB5 | MJ5 |
| | 6 | MLF6 274.2.14 | MUF6 | MC6 | MR6 | MO6 | MS6 | MFB6 | MJ6 |
| | 7 | MLF7 274.2.16 | MUF7 | MC7 | MR7 | MO7 | MS7 | MFB7 | MJ7 |

8:19 AM
4/23/2019

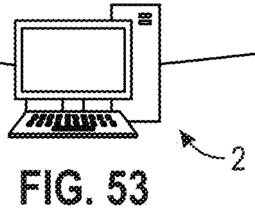

FIG. 53

| POINT ID | LOWER FRONT | | |
|---|---|---|---|
| | HEAD | EMM | PLF |
| 0 | HLFA 460.2 | MLF0 274.2.2 | PLF0 = HLFA-MLF0 710.2 |
| 1 | HLFA 460.2 | MLF1 274.2.4 | PLF1 = HLFA-MLF1 710.4 |
| 2 | HLFA 460.2 | MLF2 274.2.6 | PLF2 = HLFA-MLF2 710.6 |
| 3 | HLFA 460.2 | MLF3 274.2.8 | PLF3 = HLFA-MLF3 710.8 |
| 4 | HLFA 460.2 | MLF4 274.2.10 | PLF4 = HLFA-MLF4 710.10 |
| 5 | HLFA 460.2 | MLF5 274.2.12 | PLF5 = HLFA-MLF5 710.12 |
| 6 | HLFA 460.2 | MLF6 274.2.14 | PLF6 = HLFA-MLF6 710.14 |
| 7 | HLFA 460.2 | MLF7 274.2.16 | PLF7 = HLFA-MLF7 710.16 |

710,760

| HEAD-TO-PAD INTERFERENCE | CONFIGURATION | LOWER FRONT | UPPER FRONT | CROWN | REAR | OCCIPITAL | SIDE | FRONT BOSS | JAW |
|---|---|---|---|---|---|---|---|---|---|
| | 0 | PLF0 | PUF0 | PC0 | PR0 | PO0 | PS0 | PFB0 | PJ0 |
| | 1 | PLF1 | PUF1 | PC1 | PR1 | PO1 | PS1 | PFB1 | PJ1 |
| | 2 | PLF2 | PUF2 | PC2 | PR2 | PO2 | PS2 | PFB2 | PJ2 |
| | 3 | PLF3 | PUF3 | PC3 | PR3 | PO3 | PS3 | PFB3 | PJ3 |
| | 4 | PLF4 | PUF4 | PC4 | PR4 | PO4 | PS4 | PFB4 | PJ4 |
| | 5 | PLF5 | PUF5 | PC5 | PR5 | PO5 | PS5 | PFB5 | PJ5 |
| | 6 | PLF6 | PUF6 | PC6 | PR6 | PO6 | PS6 | PFB6 | PJ6 |
| | 7 | PLF7 | PUF7 | PC7 | PR7 | PO7 | PS7 | PFB7 | PJ7 |

720, 770

| CONFIGURATION | LOWER FRONT | UPPER FRONT | CROWN | REAR | OCCIPITAL | SIDE | FRONT BOSS | JAW |
|---|---|---|---|---|---|---|---|---|
| 0 | 0 | 0 | 0 | 0 | 0 | 0 | 0 | 0 |
| 1 | 0 | 0 | 0 | 0 | 0 | 0 | 0 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 1 |
| 5 | 0 | 1 | 1 | 0 | 0 | 1 | 1 | 0 |
| 6 | 1 | 0 | 0 | 0 | 0 | 0 | 0 | 0 |
| 7 | 0 | 0 | 0 | 1 | 1 | 0 | 0 | 0 |
| SUM | 1 | 1 | 1 | 1 | 1 | 1 | 1 | 1 |

8:19 AM
4/23/2019

740, 790

| GOALS | ACTUAL | OVER/UNDER | UNDER LIMIT | PASS/FAIL | OVER LIMIT | PASS/FAIL |
|---|---|---|---|---|---|---|
| LOWER FRONT | PLF6 | O/ULF=PLF6 - I | ULH | O/ULF<ULH | OLH | O/ULF>OLH |
| UPPER FRONT | PLF5 | O/UUF=PLF5 - I | ULH | O/UUF<ULH | OLH | O/UUF>OLH |
| CROWN | PC5 | O/UC=PC5 - I | ULH | O/UC<ULH | OLH | O/UC>OLH |
| REAR | PR7 | O/UR=PR7 - I | ULH | O/UR<ULH | OLH | O/UR>OLH |
| OCCIPITAL | PO7 | O/UO=PO7 - I | ULH | O/UO<ULH | OLH | O/UO>OLH |
| SIDE | PS5 | O/US=PS5 - I | ULH | O/US<ULH | OLH | O/US>OLH |
| FRONT BOSS | PFB5 | O/UFB=PFB5 - I | ULH | O/UFB<ULH | OLH | O/UFB>OLH |
| JAW | PJ4 | O/UJ=PJ4 - I | ULJ | O/UJ<ULJ | OLJ | O/UUJ>OLJ |

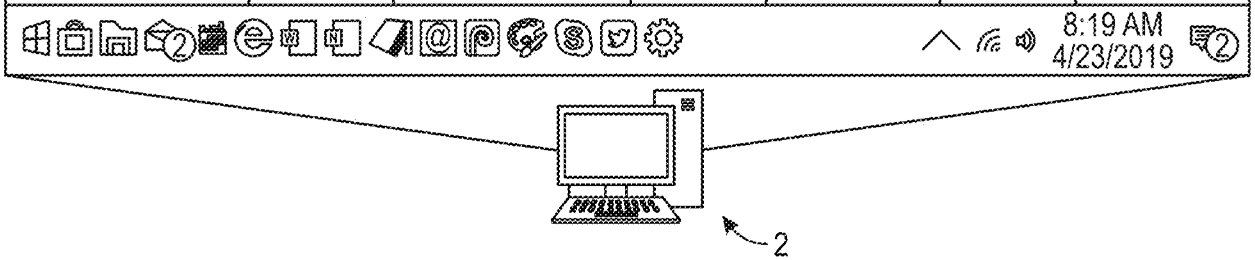

2

FIG. 58

DATA COLLECTION, PROCESSING AND FITMENT SYSTEM FOR A PROTECTIVE SPORTS HELMET

CROSS-REFERENCE TO RELATED APPLICATIONS

This application claims priority from U.S. Provisional Patent Application No. 63/242,010, filed Sep. 8, 2021, all of which is incorporated herein by referenced and made a part hereof.

TECHNICAL FIELD

The invention relates to a data collection, processing and fitment system that improves: (i) the comfort and/or fit of a protective sports helmet, and (ii) how the helmet responds when an impact or series of impacts are received by said helmet when worn by a player. Specifically, the disclosed data collection, processing and fitment system facilitates the design and manufacture of a protective sports helmet by selecting a combination of pre-manufactured components (e.g., internal energy attenuation component) from pluralities of pre-manufactured components (e.g., internal energy attenuation component) based upon data that is collected from the player that will wear the helmet during the course of playing the contact sport.

BACKGROUND OF THE INVENTION

Protective sports helmets, including those worn during the play of a contact sports, such as football, hockey, and lacrosse, typically include an outer shell, an internal pad assembly coupled to an interior surface of the shell, a faceguard or face mask, and a chin protector or strap that releasably secures the helmet on the wearer's head. However, most, if not all, traditional protective sports helmets do not use advanced techniques to select certain components that best fits the player's anatomical features from a plurality of pre-manufactured components to generate a protective sports helmet that best fits the player's anatomical features.

The description provided in the background section should not be assumed to be prior art merely because it is mentioned in or associated with the background section. Furthermore, the background section may describe one or more aspects of the inventive system and technology.

BRIEF DESCRIPTION OF THE DRAWINGS

The drawing figures depict one or more implementations in accord with the present teachings, by way of example only, not by way of limitation. In the figures, like reference numerals, refer to the same or similar elements.

FIG. 19 shows the electronic device displaying a file that contains: (i) the helmet template reference points, (ii) the threshold intersection locations, and (iii) the determined threshold line lengths, which extend between the helmet template reference point(s) and the threshold intersection locations;

FIG. 29 shows the electronic device displaying a file that contains: (i) the helmet template reference point(s), (ii) the energy attenuation intersection locations, and (iii) the determined energy attenuation line lengths, which extend between the helmet template reference points and the energy attenuation intersection locations;

FIG. 38 shows the electronic device displaying a file that contains the average energy attenuation line lengths for each energy attenuation surface associated with each helmet shell size (e.g., small, medium and large);

FIG. 45 shows the electronic device displaying a file that contains: (i) the helmet template reference point(s), (ii) the player intersection locations, and (iii) the determined player line lengths, which extend between the player intersection locations and the helmet template reference points;

FIG. 46 shows the electronic device displaying a file that illustrates how the average player line lengths for the lower front extent of the player head data is calculated;

FIG. 48 shows the electronic device displaying an inquiry to the system operator to ensure that the player head data is properly aligned within the computerized helmet template;

FIG. 53 shows the electronic device displaying a file that contains: (i) the average player line lengths and (ii) average energy attenuation line lengths for the selected helmet shell size;

FIG. 58 shows the electronic device displaying considerations that may be reviewed by the operator of the system to ensure that the proper configuration of energy management members was selected for the specific player and for installation within the helmet;

DETAILED DESCRIPTION

Figure 1B:
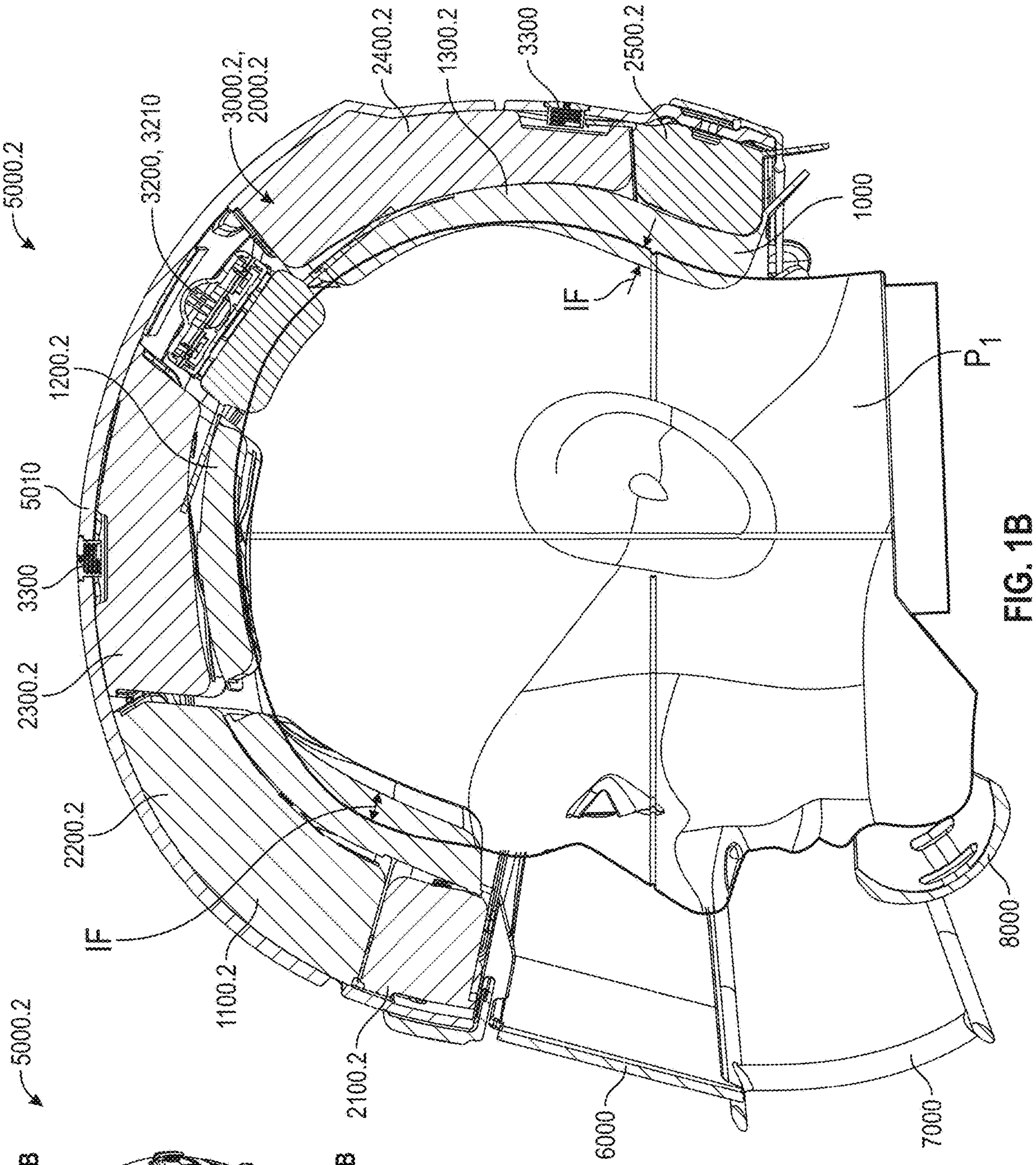
FIG. 1B shows a cross-sectional view of FIG. 1A taken along line 1B-1B, showing (i) a fixed layer, and (ii) a variable layer, wherein the fixed layer resides against the player's head and the variable layer resides between the fixed layer and the helmet shell.

In the following detailed description, numerous specific details are set forth by way of examples in order to provide a thorough understanding of the relevant teachings. However, it should be apparent to those skilled in the art that the present teachings may be practiced without such details. In other instances, well-known methods, procedures, components, and/or circuitry have been described at a relatively high-level, without detail, in order to avoid unnecessarily obscuring aspects of the present disclosure.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspects of the disclosed concepts to the embodiments illustrated. As will be realized, the disclosed methods and systems are capable of other and different configurations and several details are capable of being modified all without departing from the scope of the disclosed methods and systems. For example, one or more of the following embodiments, in part or whole, may be combined consistent with the disclosed methods and systems. As such, one or more steps from the flow charts or components in the Figures may be selectively omitted and/or combined consistent with the disclosed methods and systems. Additionally, one or more steps from the flow charts may be performed in a different order. Accordingly, the drawings, flow charts and detailed description are to be regarded as illustrative in nature, not restrictive or limiting.

A. INTRODUCTION

This Application discloses an inventive data collection, processing and fitment system 10 for a protective sports helmet, where the system 10 is purposely designed to improve: (i) the comfort and fit of the helmet, (ii) the efficiency of the design, selection and build process of the helmet, and (iii) how the helmet responds when an impact or series of impacts are received by the helmet when worn by a player. To accomplish these improvements, the system 10 selects a combination of pre-manufactured helmet components from pluralities of pre-manufactured helmet components based upon data collected from the player that will wear the helmet. In general terms and as detailed below, the system 10 obtains data from a player and then creates a digital model of the anatomical features of the player's head H (i.e., player's head model). After generating the player's head model, the system 10 determines distances between: (i) an outer surface of the player's head model and (ii) a plurality of pre-manufactured components, in order to select an optimal combination of pre-manufactured components that "best fit" the player's head. H The optimal combination of pre-manufactured components that "best fit" the player's head provides a "desirable interference fit" between the selected pre-manufactured components and the player's head H when the helmet is worn by the player. The desirable interference fit ("IF") is predefined and tailored by the helmet designer to ensure that pressure selectively applied to regions of the player's head is: (i) less than a predetermined maximum value (e.g. 10 psi), and (ii) more than a predetermined minimum value (e.g., 0.25 psi). In other words, the 5 pre-manufactured components function together to selectively apply a desired amount of pressure on the player's head regions when the helmet is worn by the player.

Once the optimal combination of pre-manufactured components that "best fit" the player's head is selected, then this information is uploaded in a database and assigned a unique player ID number. A physical helmet can be ordered for a player using the unique player ID number. Once the order is received by the manufacturer, the physical helmet can be designed, built and shipped to the player based upon the previously selected and stored optimal combination of pre-manufactured components that "best fit" the player's head H. In addition, the configuration of the helmet, including the optimal combination of pre-manufactured components, may be altered based upon new information that has been uploaded into a database because the player's anatomical features have changed over time and a new head model is created after obtaining a new set of data from the player that reflects the changed anatomical features. Thus, the helmet may be reconfigured for the same player as he/she grows over time. Furthermore, the configuration of the helmet, including the optimal combination of pre-manufactured components, may be revised if the same helmet is transferred or reassigned from a first or original player to a second or subsequent player. The second player has anatomical features that are different than the first player, and the second player has provided head data for the generation of a player head model. As such, the helmet may be reconfigured for the second player that has been assigned a helmet that was previously used by the first player.

While the system 10 disclosed herein focuses on the design, selection and build process of an American football helmet 5000, it should be understood that the system 10 may be used to generate other types of protective sports helmets that have different configurations (e.g., no outer shell, more layers, or less layers), or different properties (e.g., different interference fits or layers have different compression deflection ratios). The American football helmet 5000 includes a helmet shell 5010 and an energy attenuation assembly 3000. The energy attenuation assembly 3000 is installed within the helmet shell 5010 and features: (i) a fixed layer 1000 configured to be positioned adjacent to the player's head H such that it overlies a substantial majority of the player's head H, and (ii) a variable layer 2000 positioned between the fixed layer 1000 and an inner surface of the helmet shell 5010. In the American football helmet 5000, the fixed layer 1000: (i) has the same configuration and layout for all player's regardless of head shape, (ii) features a substantially uniform compression deflection ("CD") ratio, as measured on a regional basis of the fixed layer 1000 or throughout the entirety of the fixed layer 1000, and (iii) may include: a front fixed component 1100, a crown fixed component 1200, a rear fixed component 1300 and opposed left and right side fixed components 1400*a, b*. In contrast, the variable layer 2000: (i) does not have the same configuration and layout for all player's regardless of head shape, (ii) features a CD ratio that is considerably greater than the fixed layer 1000, and (iii) may include: a lower front variable component 2100, a upper front variable component 2200, rear variable component 2400, occipital variable component 2500, side variable component 2600*a, b* and a frontal boss variable component 2700*a, b*.

Figure 1A:
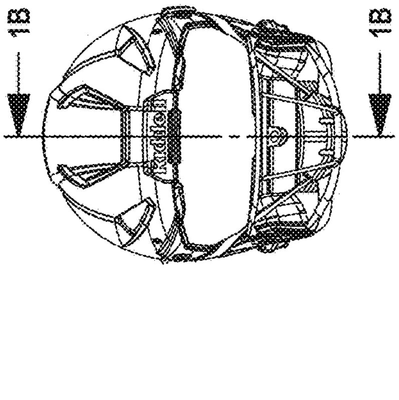
FIG. 1A shows a front view of a first player's head positioned in a first protective sports helmet, wherein said first protective sports helmet includes a helmet shell and an energy attenuation assembly that has been specifically selected for first player's head based on data of the player's anatomical features collected from said first player.
Figure 2B:
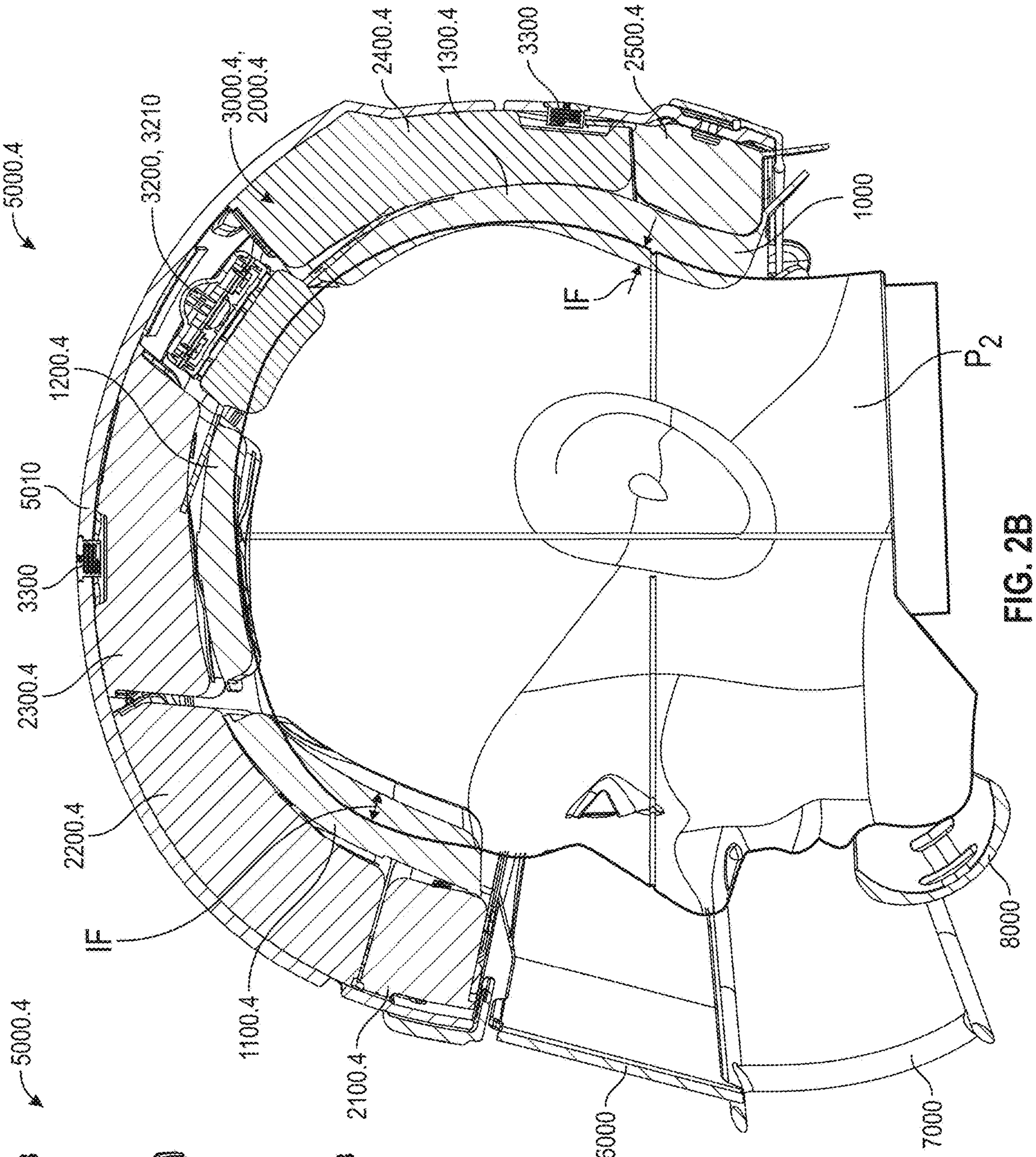
FIG. 2B shows a cross-sectional view of FIG. 2A taken along line 2B-2B, showing (i) a fixed layer, and (ii) a variable layer, wherein the fixed layer resides against the player's head and the variable layer resides between the fixed layer and the helmet shell.
Figure 2A:
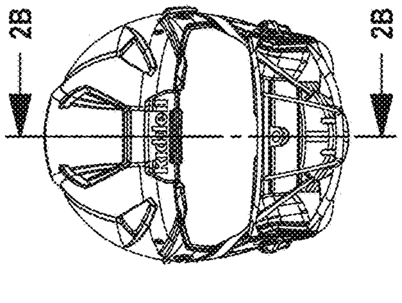
FIG. 2A shows a front view of a second player's head positioned in a second protective sports helmet, wherein said second protective sports helmet includes a helmet shell and an energy attenuation assembly that has been specifically selected for second player's head based on data of the player's anatomical features collected from said second player.

FIGS. 1A-2B show two exemplary American football helmets 5000.2, 5000.4 that are designed, selected and built for two different players-first player $P_1$ and second player $P_2$ —using the disclosed system 10. Specifically, FIGS. 1A-1B show a first American football helmet 5000.2 that includes a first helmet shell 5010 and a first energy attenuation assembly 3000.2, with a first fixed layer 1000 and first variable layer 2000.2, that has been specifically selected and configured with an optimal combination of selected pre-manufactured components for a first player $P_1$ based upon data collected from said first player $P_1$. Additionally, FIGS. 2A-2B show a second exemplary American football helmet 5000.4 that includes a helmet shell 5010 and a second energy attenuation assembly 3000.4, with a fitting layer 1000 and second variable layer 2000.4, that has been specifically selected and configured with an optimal combination of selected pre-manufactured components for a second player $P_2$ based upon data collected from said second player $P_2$. These exemplary American football helmets 5000.2, 5000.4 include the same helmet shells 5010 but different energy attenuation assemblies 3000.2, 3000.4, wherein: (i) the fixed layers 1000 are the same, and (ii) the variable layers 2000.2, 2000.4 are different, as each helmet 5000.2, 5000.4 includes: (a) the same lower front components 2100.2, 2100.4, (b) the same crown components 2300.2, 2300.4, (c) different upper front variable components 2200.2, 2200.4, (d) different rear variable components 2400.2, 2400.4, and (e) different occipital variable components 2500.5, 2500.4. In other words, the system 10 selected: (i) the same pre-manufactured helmet shells 5010 from the plurality of pre-manufactured helmet shells 5010 for the first and second players because their general head sizes are similar, (ii) the same pre-manufactured fitting layer 1000 for the first and second players because all players receive the same fitting layer 1000 within a given helmet shell size, and (iii) different variable layers 2000.2, 2000.4 based upon an optimal combination of selected pre-manufactured components because the general shape of the first player's $P_1$ head H is different than the general shape of the second player's $P_2$ head H.

As shown in FIGS. 1B and 2B, the fixed layer 1000 is positioned adjacent the player's head H and the variable layer 2000 is positioned adjacent to the inner surface of the helmet shell 5010. This orientation is opposite of typical conventional football helmets and is beneficial because all players are positioned within a fixed layer 1000, which simplifies the design and selection of the optimal combination of the pre-manufactured helmet components for the specific player. Also, when the helmet is in a "helmet worn, but pre-impact state," the fixed layer 1000 is at least substantially compressed (e.g., 4.5 mm) to provide an interference fit ("IF") on the player's head H and the variable layer 2000 is not compressed or only nominally compressed in comparison to the fixed layer 1000. The orientation of the fixed layer 100 and the variable layer 2000 also eliminates the need to perform complex pressure-related calculations and detailed analysis of each pad member having different CD ratios in the energy attenuation assembly, which are required by certain conventional football helmets. Elimination of these calculations and analysis is beneficial because they are time consuming and prone to errors that can compromise the performance, fit and feel of the energy attenuation assembly. Finally, by positioning the variable layer 2000 between the fixed layer 1000 and the shell 5010, the designer of the system 10 may adjust or change the number and/or configuration of energy attenuation components that are included in the variable layer 2000 without requiring additional modifications to the helmet 5000 to accept the altered configuration of the variable layer 2000.

In the exemplary embodiment shown in the Figures, the energy attenuation assembly 3000 of the American football helmet 5000 includes an optimal combination of selected energy attenuation components but they are distinctly configured such that they are not interchangeable with each other. For example, the crown energy attenuation member 3050 comprises a fixed crown component 1200 and a variable crown component 2300 that are distinctly designed and configured such that they can only be installed in the crown region of the shell 5010; the crown components 1200, 2300 are not suitable for installation in other regions of the shell 5010. The fixed layer 1000 and the variable layer 2000, and the components thereof, have distinct configurations and curvatures that provide the inventive energy attenuation assembly 3000 with improved energy attenuation performance when an impact is received by the shell 5010. The distinct configuration and curvature of the rear energy attenuation member 3100 of the inventive energy attenuation assembly 3000 are particularly important in the player's occipital head region. Also, the distinctly configured and curved fixed layer 1000 and variable layer 2000, and the components thereof, obviate the need to insert separate "form liners", shims or pad wedges into the energy attenuation assembly 3000 to improve fit and comfort and/or performance of the energy attenuation assembly 3000.

The shell 5010 and the energy attenuation assembly 3000 disclosed herein are specifically designed and engineered to adjust how the football helmet 5000 responds to impact forces occurring while playing football and manages the energy resulting from those impacts. It is understood by those of skill in the art of designing football helmets that different regions of the football helmet 5000 experience impacts of different types, magnitudes, and durations during the course of playing football, including during a single play or multiple plays occurring during a game, practice session or scrimmage. It is understood that helmet impacts occurring during the play of American football, hockey and lacrosse materially and substantially differ in terms of at least type, magnitude, location, direction and duration because these sports differ in many significant ways, e.g., the underlying nature of the play, the number and type of players, the equipment worn or carried by the players (e.g., hockey sticks and lacrosse sticks), and the playing surface. Further, it is understood that football helmets 5000 experience significantly different impacts than helmets utilized in non-contact sports (e.g., baseball, cycling, polo, auto, motorcycle, motocross, snow sports, and/or water sports). Moreover, it is understood that while playing football, a player P may experience multiple impacts on the same or different regions of the helmet during a single play or a series of plays that are separated by a brief period of time. As such, the structures and/or features of non-football helmets (e.g., hockey or lacrosse helmets) cannot be simply adopted or implemented into a football helmet without careful analysis and verification of the complex realities of designing, testing, manufacturing, and certifying a football helmet 5000. Arguments attempting to implement such modifications from a non-football helmet are insufficient (and in some instances, woefully insufficient) because they amount to theoretical design exercises that are not tethered to the complex realities of successfully designing, manufacturing and testing a football helmet that is used for a prolonged period of time, as measured across at least one season comprising numerous games, scrimmages and practice sessions.

B. DEFINITIONS

This section identifies a number of terms and definitions that are used throughout the Application. The term "player" is a person who wears the protective sports helmet while engaged in practice or game play of the sport. The term "helmet wearer" or "wearer" is a player who is wearing the helmet. The term "designer" or "operator" is a person who utilizes the inventive system 10 to designs, tests, or manufactures the helmet.

A "protective sports helmet" is a type of protective equipment that a player or wearer wears on his/her head while engaged in the play of a sport or an activity requiring a protective sports helmet.

A "protective contact sports helmet" or "contact sports helmet" is a type of protective sports helmet that the player wears while he/she is engaged in the play of the sport, such as American football, hockey or lacrosse, that typically requires a team of players. It is common for the rules and the regulations of the particular contact sport to mandate that the player wear the contact sports helmet while the player is engaged in playing the sport. Contact sports helmets typically must comply with safety regulations promulgated by a governing body, such as NOCSAE for football helmets.

A "protective recreational sports helmet" or "recreational sports helmet" is a type of protective sports helmet that is worn by the wearer while he/she is participating in a recreational activity such as cycling, climbing sports, skiing, snowboarding, motorsports or motorcycling, that typically can be done by an individual wearer. Recreational sports helmets typically must also comply with safety regulations promulgated by a governing body, such as ASTM/ANSI regulations for cycling helmets and Department of Transport (DOT) for motorsports helmets and motorcycling helmets.

A "football helmet" is a type of protective contact sports helmet that a player or wearer wears on his/her head while engaged in playing American football. Unlike other helmets, American football helmets must comply with football-specific safety regulations promulgated by a governing body, such as NOCSAE.

The term "anatomical features" can include any one or any combination of the following: (i) dimensions, (ii) topography and/or (iii) contours of the body part that is scanned and analyzed during application of the system 10 and against which the protective sports equipment. In the context of a football helmet 5000, the anatomical features of the player's head H include, but are not limited to, the player's skull, facial region, eye region and jaw region. Because the disclosed football helmet 5000 is worn on the player's head and the energy attenuation assembly 3000 makes contact with the player's hair and/or scalp, the "anatomical features" term also includes the type, amount and volume of the player's hair or lack thereof. For example, some players have long hair, short hair, a combination of long and short hair, and other players have no hair (i.e., are bald). While the present disclosure, as will be discussed in detail below, is capable of being applied to any body part of an individual, it has particular application the human head H.

An "energy attenuation assembly" is an assembly of energy attenuating members that are designed to collectively interact to enable the protective sports equipment to attenuate energies, such as linear acceleration and/or rotational acceleration, associated with impacts received by the protective sports equipment while it is worn by the player P or wearer. For example, the football helmet 5000 includes the internal energy attenuation assembly 3000 that attenuates energies, such as linear acceleration and/or rotational acceleration, from impacts received by the shell 5010 of the helmet 5000.

An "energy attenuation member(s)" is a three-dimensional (3D) element that comprises the energy attenuation assembly and that includes at least one component of the variable layer. The energy attenuation members, except the energy attenuation member configured for the jaw region of the helmet, also include a component of the fixed layer. On a regional basis of the helmet, the combination of the variable layer and the fixed layer forms the volume and outer periphery of the energy attenuation member at a helmet region. The volume of the impact attenuation member is configured such that it extends between the player's head H and an inner surface of a shell of the football helmet 5000 when it is worn on the player's head.

The term "fixed layer" is a layer formed from a collection of energy attenuation components that: (i) are positioned adjacent to the player's head when the helmet is worn and (ii) have a volume defined by a X, Y and Z Cartesian coordinate system, where the Z direction is defined out of plane to provide the energy attenuation components with a height or thickness. The height or thickness of the fixed layer, as provided by its components, is set at a predetermined range of values (e.g., 5-20 mm) in an uncompressed state (i.e., before the protective sports helmet is worn by the player). In the embodiments shown in the Figures, the fixed layer is comprised of: (i) a fixed front component, (ii) fixed crown component, (iii) fixed rear component, and (iv) fixed left and right side components.

The term "variable layer" is a layer formed from a collection of energy attenuation components that: (i) are positioned between the fixed layer and the inner surface of the helmet shell and (ii) have a volume defined by a X, Y and Z Cartesian coordinate system where the Z direction is defined out of plane to provide the energy attenuation components with a height or thickness. The height or thickness of the variable layer components is not uniform and as such it can vary significantly (e.g., over 50 mm) between two locations of the variable layer in the uncompressed state. In the embodiments shown in the Figures, the variable layer is comprised of: (i) lower front component, (ii) a upper front component, (iii) a crown component, (iv) a rear component, (v) an occipital component, (vi) left and right side components, (vii) left and right boss components, and (viii) left and right jaw components or members.

The term "component" or "energy attenuation component" is a three-dimensional (3D) structure that (i) has both a volume and an outer periphery, and (ii) reduces or attenuates energy arising from impacts received by the protective sports helmet. Multiple components comprise the fixed layer, and multiple components comprise the variable layer. The energy attenuation component includes material that is elastically deformable and designed to attenuate energies, such as linear acceleration and/or rotational acceleration, from impacts received by the protective sports helmet.

The term "helmet worn, but pre-impact state" and "worn, pre-impact state" occurs when the helmet is properly worn by the player P but no impact to the helmet H has been received during the course of play. The helmet worn, but pre-impact state can occur when the player P is wearing the helmet but not actively engaged in the sporting activity, such as standing or sitting on the sidelines and not playing football. In this state, the inner surface of the energy management assembly is in contact with the player's head H, the frontal edge of the shell is positioned approximately one inch above the player's eyebrows, the mid-sagittal and coronal planes $P_{MS}$, $P_{CR}$ are substantially vertical and as a result, the helmet has preferably a zero degree tilt. Also, in the helmet worn, pre-impact state, the helmet H applies less than 10 psi of pressure on the player's head H and preferably between 0.25 psi and 3 psi. In certain Figures in this Application, the helmet is shown in the pre-impact state but the helmet is not being worn by the player P, nevertheless, the helmet is still oriented such that the mid-sagittal and coronal planes $P_{MS}$, $P_{CR}$ are substantially vertical and as a result, the helmet has a zero degree tilt in the relevant Figures.

The term "pre-manufactured component" means a component that is not individually designed or manufactured based upon a specific player's anatomical features and data. In other words, a pre-manufactured component is not a custom component that is purposely designed, configured and manufactured to match anatomical features of the player's head H. Instead, pre-manufactured component are intended to fit a substantial number of player's head H or a specific group of players' heads H.

C. OVERVIEW OF THE SYSTEM

Figure 3:
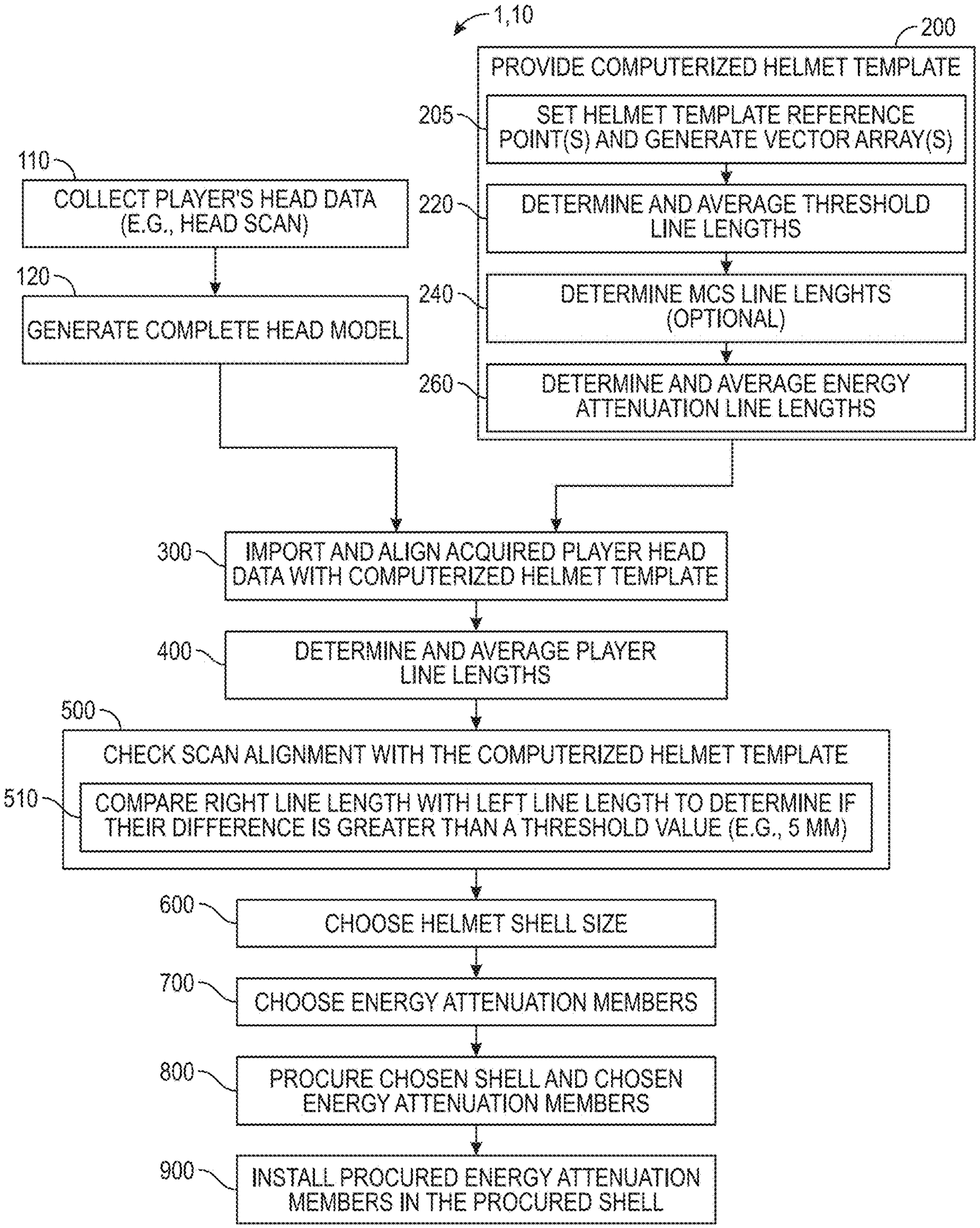
FIG. 3 is a flow chart showing a data collection, processing and fitment system for a protective sports helmet, where the system involves: (i) digitally selecting helmet components based on data collected from the anatomical features of a specific player, (ii) acquiring the selected helmet components, and (iii) assembling the acquired and selected helmet components to form the protective sports helmet.

FIG. 3 shows a flow chart that describes the inventive data collection, processing and fitment system 10 disclosed herein. The system 10 involves: (i) collecting data from a specific player P, (ii) using the collected data to digitally select an optimal combination of pre-manufactured helmet components based on data collected from the anatomical features of a specific player P, (ii) acquiring the selected, optimal combination of pre-manufactured helmet components, and (iii) assembling the acquired pre-manufactured helmet components to form the protective sports helmet for the specific player. This data collection, processing and fitment system 10 is designed to improve: (i) the comfort and fit of said helmet, (ii) the efficiency of the design, selection and build process of the helmet, and (iii) how the helmet responds when an impact or series of impacts are received by the helmet when worn by the specific player P. In other words, the data collection, processing and fitment system 10 specifically tailors the configuration of the protective helmet to the specific player's anatomical features. It should be understood that FIG. 3 describes the general data collection, processing and fitment system 10, while FIGS. 4-58 describe sub-steps of said data collection, processing and fitment system 10. It should also be understood that FIG. 3 shows one embodiment of this process and system, while other embodiments of this data collection, processing and fitment system 10 are contemplated by this disclosure. As such, one or more of the steps disclosed in FIG. 3 may be omitted, combined with another step, or performed in a different order.

D. PLAYER HEAD DATA

As part of the system 10, to select the components of the American football helmet 5000 that best fit the player, it is desirable to collect a robust set of data about the shape or topography of player's head. To collect these data, multiple sub-steps of this process described in connection with FIGS. 4A-9. Referring to FIG. 3, step 110 describes the acquisition of data about the shape or topography of a player's head. Now referring to FIG. 4A, this method commences in step 110.2 by opening a software application 110.4.4 (exemplary embodiment shown in FIG. 7) in step 110.4 on, or in communication with, a scanning apparatus 110.4.2 (exemplary embodiment shown in FIGS. 5, 7, 9). Referring back to FIG. 4A, upon opening the software application 110.4.4, the operator is prompted in step 110.6 to select a player from a list of players or enter data about the player (e.g., name, age, playing level, position, etc.).

After the player data is entered in step 110.6, the software application 110.4.4 prompts the operator to instruct and then check that the player P has properly placed the scanning hood 110.8.2 (exemplary embodiment shown in FIG. 5) on, or over, the head H of the player P in step 110.8. The scanning hood 110.8.2 may be a flexible apparatus sized to fit over the player's head H and achieve a tight or snug fit around the player's head H due to elastic properties and dimensions of the scanning hood 110.8.2. The scanning hood 110.8.2 provides for increased accuracy when performing the data acquisition process by conforming to the anatomical features of the player's head H and facial region F, namely the topography and contours of the head H and facial region F while reducing effects of hair. The scanning hood 110.8.2 may be made from neoprene, lycra or any other suitable elastic material known to those skilled in the art and may have a thickness that is between 0.1 mm and 10 mm (preferably 1.5 mm). It should be understood that the term scanning hood 110.8.2 does not just refer to a hood that is placed over the head H of the player P; instead, it refers to a snug fitting item (e.g., shirt, armband, leg band, or etc.) that has minimal thickness and is placed in direct contact with the player's head to aid in the collection of head data.

Figure 5:
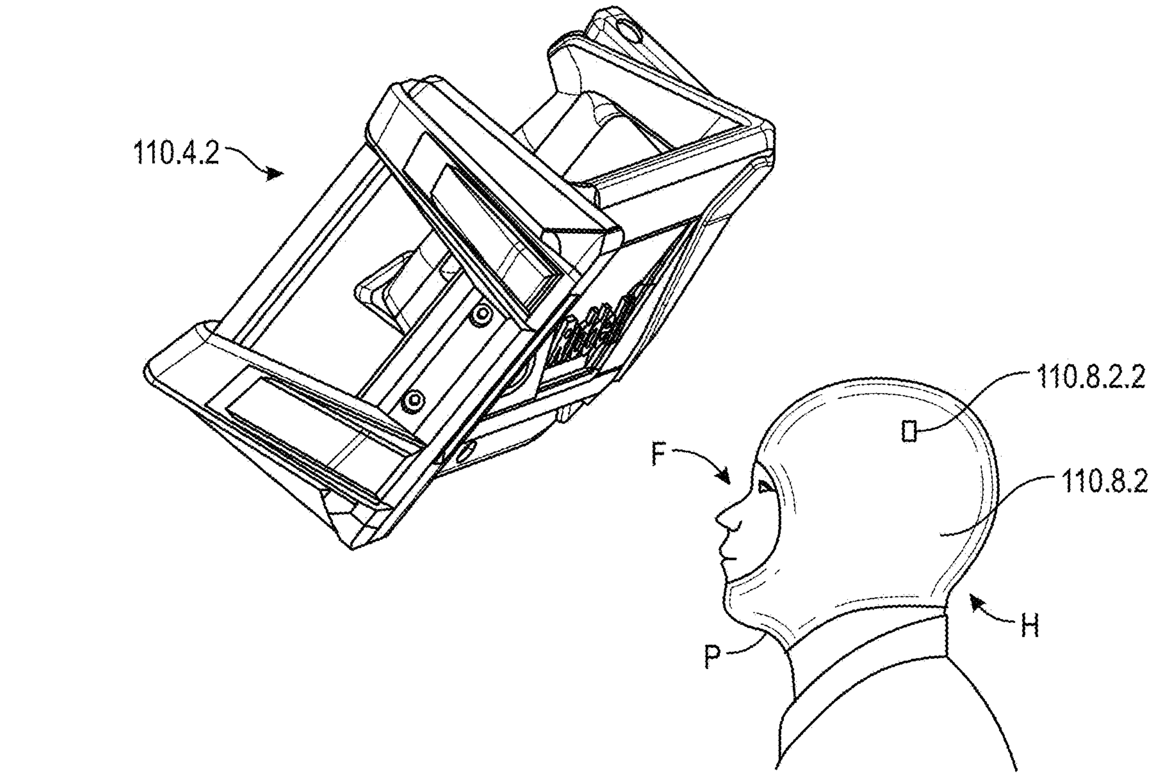
FIG. 5 shows a first exemplary scanning apparatus that is configured to collect player head data, wherein said apparatus is shown collecting data from a player's head that is partially covered with a scanning hood.
Figure 6:
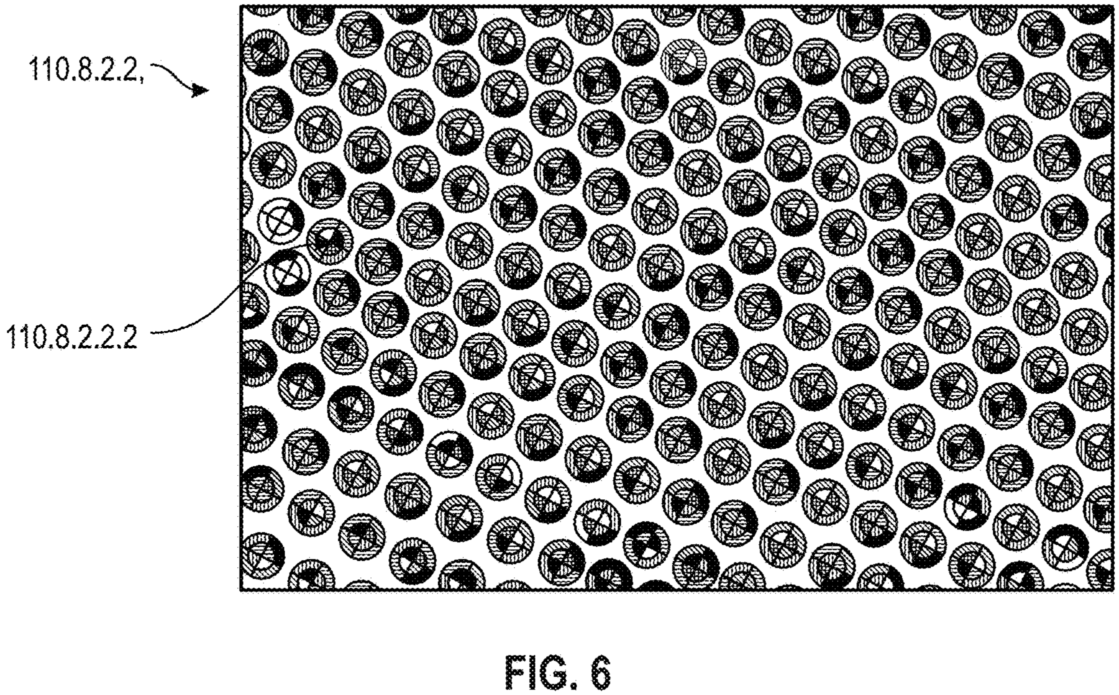
FIG. 6 is an example of a pattern that may be placed on the scanning hood shown in FIG. 3A.
Figure 7:
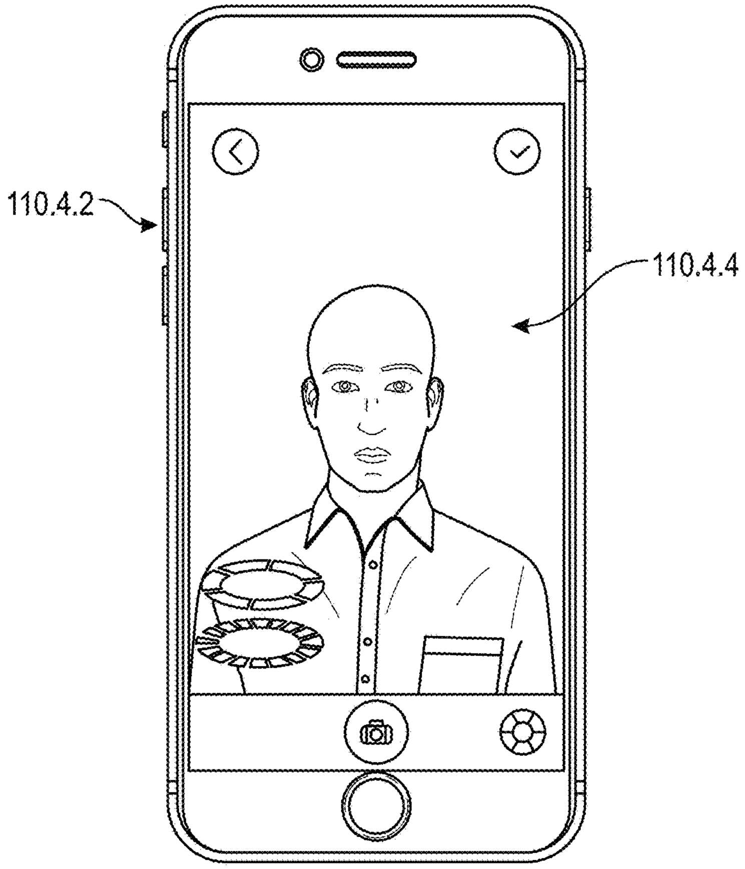
FIG. 7 is a second exemplary scanning apparatus that is configured to collect player head data with an exemplary software application displayed on said scanning apparatus.

FIG. 5 shows an area labeled 110.8.2.2, wherein FIG. 6 show an enlarged view of this area of the scanning hood 110.8.2.2. This area 110.8.2.2 includes one or more reference markers 110.8.2.2.2. The reference markers 110.8.2.2.2 may be used to aid in the orientation and positioning of the images or video of the scanning hood 110.8.2, as will be described below. The reference markers 110.8.2.2.2 may be: (i) colored, (ii) offset (e.g., raised or depressed) from other portions of the scanning hood 110.8.2, (iii) include patterns or textures, (iv) or include electronic properties or features that aid in collection the of head data by the scanning apparatus 110.4.2. These reference markers 110.8.2.2.2 may be printed on the scanning hood 110.8.2 or maybe a separate item that is attached to the scanning hood 110.8.2 using adhesives or using any other mechanical or chemical attachment means. The number of reference markers 110.8.2.2.2 that are used should balance the need for an accurate collection of head data on one hand with processing times on the other hand. In one exemplary embodiment, twelve reference markers 110.8.2.2.2 per square inch may be used. A person skilled in the art recognizes that more or fewer reference markers 110.8.2.2.2 may be used to alter the processing times and the accuracy of the head data. In a further embodiment, it should be understood that the scanning hood 110.8.2 may not have any reference markers 110.8.2.2.2.

In alternative embodiments, a scanning hood 110.8.2 may not be used when collecting head data in certain situations. For example, scanning hood 110.8.2 may not be needed to reduce the effects of hair when the player lacks hair on his head. In another example, scanning hood 110.8.2 may not be needed to when capturing data from a player's foot, arm, or torso. In embodiments where a scanning hood 110.8.2 is not used, one or more reference markers 110.8.2.2.2 may be placed directly on the player's head. For example, the one or more reference markers 110.8.2.2.2 may have a removable coupling means (e.g., adhesive) that allows them to be removably coupled to the player's head to aid in collecting the head data. Further, a scanning hood 110.8.2 may not be used when collecting data using alternative scanning systems (e.g., contact scanner, computed tomography or magnetic resonance imaging, or any combination of these technologies).

Figure 4A:
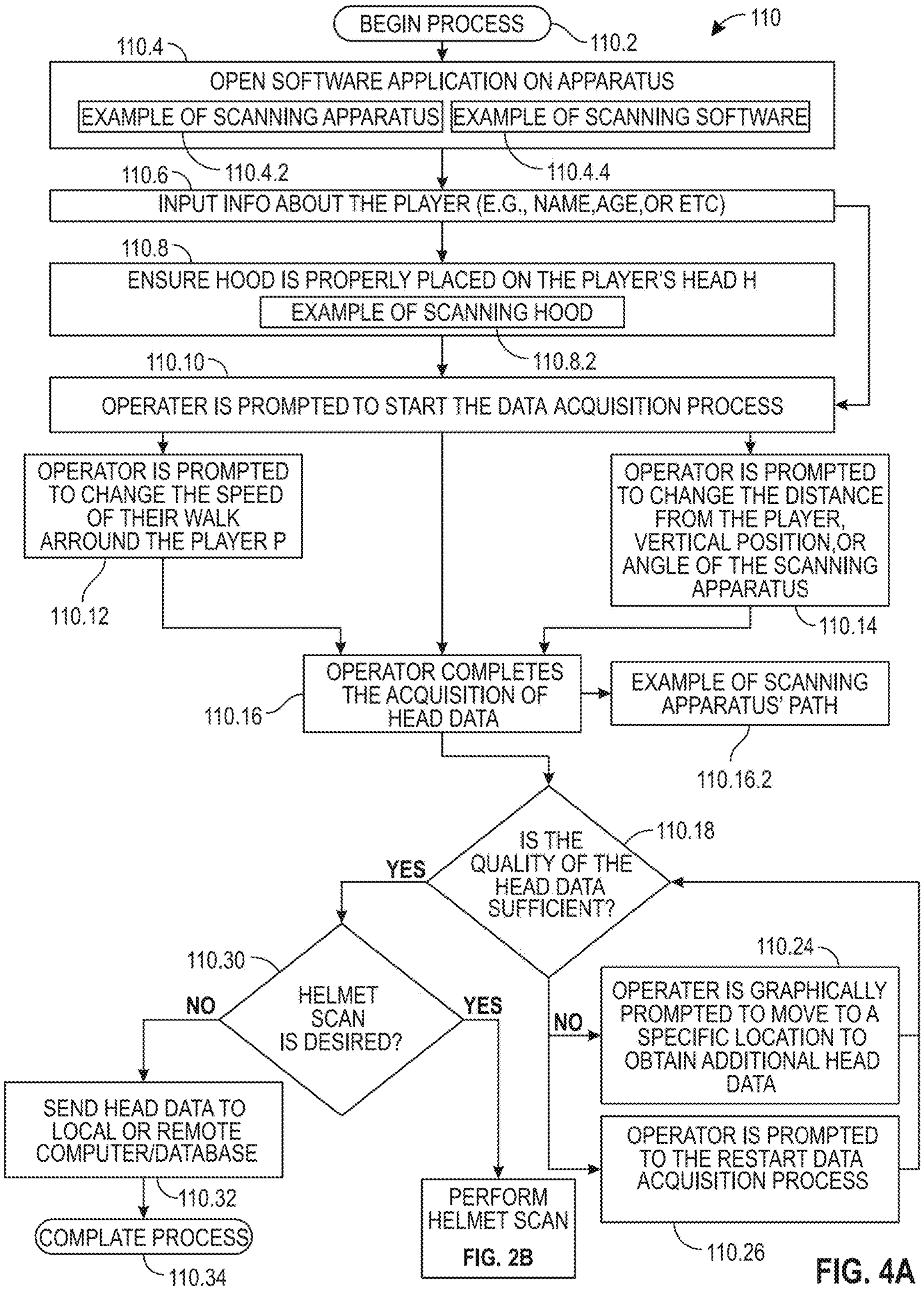
FIG. 4A is a flow chart of an initial part of the data collection, processing and fitment system, showing a method for collecting player head data.

Referring to FIG. 4A, after the player P and/or the operator determines that the scanning hood 110.8.2 is properly positioned on the player's head H in step 110.8, the operator is prompted to start the data acquisition process in step 110.10. The data acquisition process may require different steps depending on the configuration of the scanning apparatus 110.4.2 and the technology that is utilized by the scanning apparatus 110.4.2. In one exemplary embodiment, the scanning apparatus 110.4.2 may be a hand-held unit (e.g., personal computer, tablet or cellphone) that includes a non-contact camera based scanner. In this embodiment, the operator will walk around the player with the scanning apparatus 110.4.2 to collect images or video frames of the player. The scanning apparatus 110.4.2 or a separate device will process the acquired head data using photogrammetry techniques and/or algorithms. It should be understood that the head data may be stored, manipulated, altered, and displayed in multiple formats, including numerical values contained within a table, points arranged in 3D space, partial surfaces, or complete surfaces.

In an alternative embodiment, the scanning apparatus 110.4.2 may be a hand-held unit (e.g., personal computer, tablet or cellphone) that includes a non-contact LiDAR or time-of-flight sensor. In this embodiment, the operator will walk around the player with the non-contact LiDAR or time-of-flight sensor. In particular, the LiDAR or time-of-flight sensor sends and receives light pulses in order to create a point cloud that contains head data. In an alternative embodiment that is not shown, the scanning apparatus 110.4.2 may be a stationary unit that contains a non-contact light or sound based scanner (e.g., camera, LiDAR, etc.). In this embodiment, the light/sound sensors can capture the head data in a single instant (e.g., multiple cameras positioned around the person that can all operate at the same time) or light/sound sensors may capture the head data over a predefined period of time by the stationary unit's ability to move its sensors around the player P. In an even further embodiment that is not shown, the scanning apparatus may be a stationary contact based scanner assembly. In this embodiment, once the contact sensors are placed in contact with the player's head, they can capture the head data in a single instant (e.g., multiple pressure sensors may be positioned in contact with the player's head to enable the collection of the head data at one time). In another embodiment, the scanning apparatus may be a non-stationary contact based scanner. In this embodiment, the scanning apparatus may include at least one pressure sensor that may capture the head data over a predefined time by moving the pressure sensor over the player's head. In other embodiments, head data may be collected using: (i) computed tomography or magnetic resonance imaging, (ii) structured-light scanner, (iii) triangulation based scanner, (iv) conoscopic based scanner, (v) modulated-light scanner, (vi) any combination of the above techniques and/or technologies, or (vii) any technology or system that is configured to capture head data. For example, the hand-held scanner may utilize both a camera and a time-of-flight sensor to collect the head data.

Figure 8:
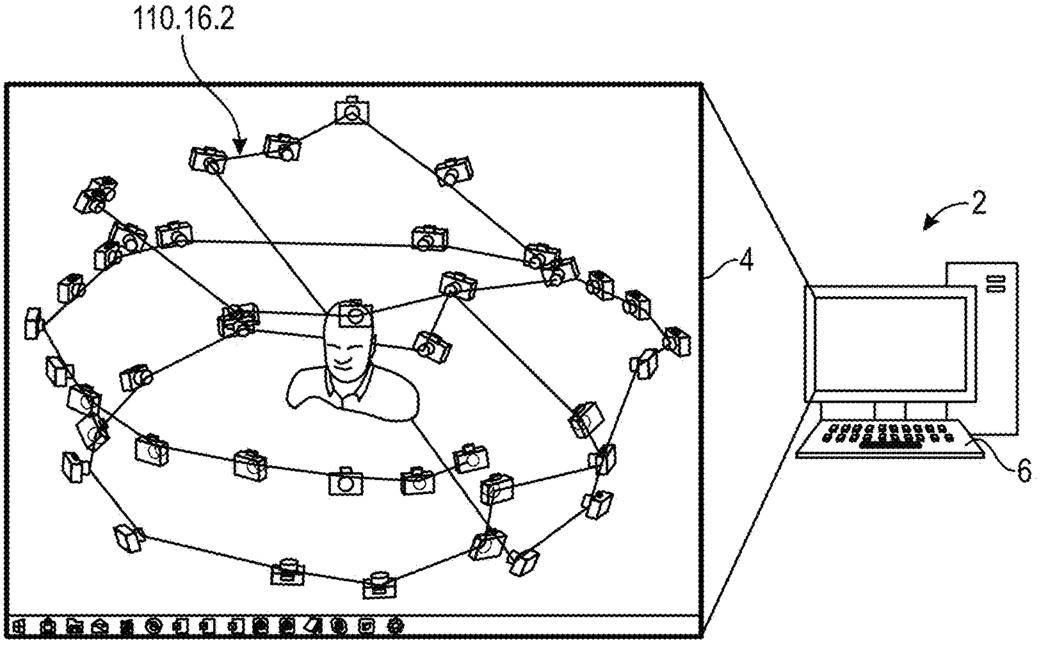
FIG. 8 is an electronic device displaying a graphical representation of the path that the first or second exemplary scanning apparatuses may take during the method of obtaining player head data.

FIG. 8 shows an electronic device 2, which displays an exemplary path 110.16.2 that the scanning apparatus 110.4.2 may follow during the acquisition of head data. The electronic device 2 is a computerized device that has an input device 6 and a display device 4. The electronic device 2 may be a generic computer or a specialized computer specifically designed to perform the computations necessary to carry out the processes disclosed herein. It should be understood that the electronic device 2 may not be contained within a single location and instead may be located at a plurality of locations. For example, the computing extent of the electronic device may be in a cloud server, while display 4 and input device 6 are located in the designer's office and can be accessed via an internet connection.

In FIG. 8, the hand-held scanning apparatus 110.4.2 is shown in approximately 40 different locations around a player's head H. These approximately 40 different positions are at different angles and elevations when compared to one another. Placing the scanning apparatus 110.4.2 in these different locations during the acquisition of head data helps ensure that the data that will later be made from this acquisition process does not have gaps or holes contained therein. It should be understood that the discrete locations are shown in FIG. 8 are exemplary and are simply included herein to illustrate the path that the scanning apparatus 110.4.2 may follow during the acquisition of head data. There is no requirement that the scanning apparatus 110.4.2 pass through these points or gather head data at these points during the acquisition process.

Referring back to FIG. 4A, during the acquisition of head data, the software application 110.4.4 may instruct the operator to: (i) change the speed at which they are moving around the player (e.g., slow down the pace) to ensure that the proper level of detail is captured in step 110.12, (ii) change the vertical position and/or angle of the scanning apparatus 110.4.2 in step 110.14, and/or (iii) change the operator's position in relation to the player P (e.g., move forward or back up from the player) in step 110.14. Once the acquisition of head data is completed in 110.16, the software application 110.4.4 analyzes the data to determine if the quality is sufficient to meet the quality requirements that are preprogrammed within the software application 110.4.4. If the quality of the head data is determined to be sufficient in step 110.18, the software application 110.4.4 asks the operator if a helmet scan is desired in step 110.30. An example of where a helmet scan may be useful is when the player P desires a unique helmet configuration, such as if the player decides to have the American football helmet 5000 positioned lower on their head than where a wearer traditionally places the American football helmet 5000. If it is determined that a helmet scan is desired in step 110.30, then the operator will start the next stage of acquiring head data. The process of acquiring the helmet scan is described in connection with FIG. 4B. If it is determined that a helmet scan is not desired in step 110.18, then the software application 110.4.4 will send, via a wire or wirelessly, to a local or remote computer/database (e.g., team database 100.2.10), the head data in step 110.32. This local or remote computer/database may then be locally or remotely accessed by technicians/designers who perform the next steps in designing and manufacturing the American football helmet 5000.

Alternatively, if the software application 110.4.4 determines that the head data lacks sufficient quality to meet the quality requirements preprogrammed within the software application 110.4.4, then the software application 110.4.4 may prompt the operator to obtain additional data in steps 110.24, 110.26. Specifically, in steps 110.24, the software application 110.4.4 may graphically show the operator: (i) the location to stand, (ii) what elevation to place the scanning apparatus 110.4.2, and/or (iii) what angle to place the scanning apparatus 110.4.2. Once the operator obtains the additional data at that specific location, the software application 110.4.4 then analyzes the original collection of data along with this additional data to determine if the quality of the combined collection of data is sufficient to meet the quality requirements of the software application 110.4.4. This process is then repeated until the quality of the data is sufficient. Alternatively, the software application 110.4.4 may request that the operator restart the head data acquisition process. The software application 110.4.4 then analyzes the first collection of head data along with the second collection of head data to see if the combination of data is sufficient to meet the quality requirements that are preprogrammed within the software application 110.4.4. This process is then repeated until the quality of the data is sufficient. After the head data is determined to be sufficient, the software application 110.4.4 performs the step 110.30 of prompting the operator to determine if a helmet scan is desired.

Figure 4B:
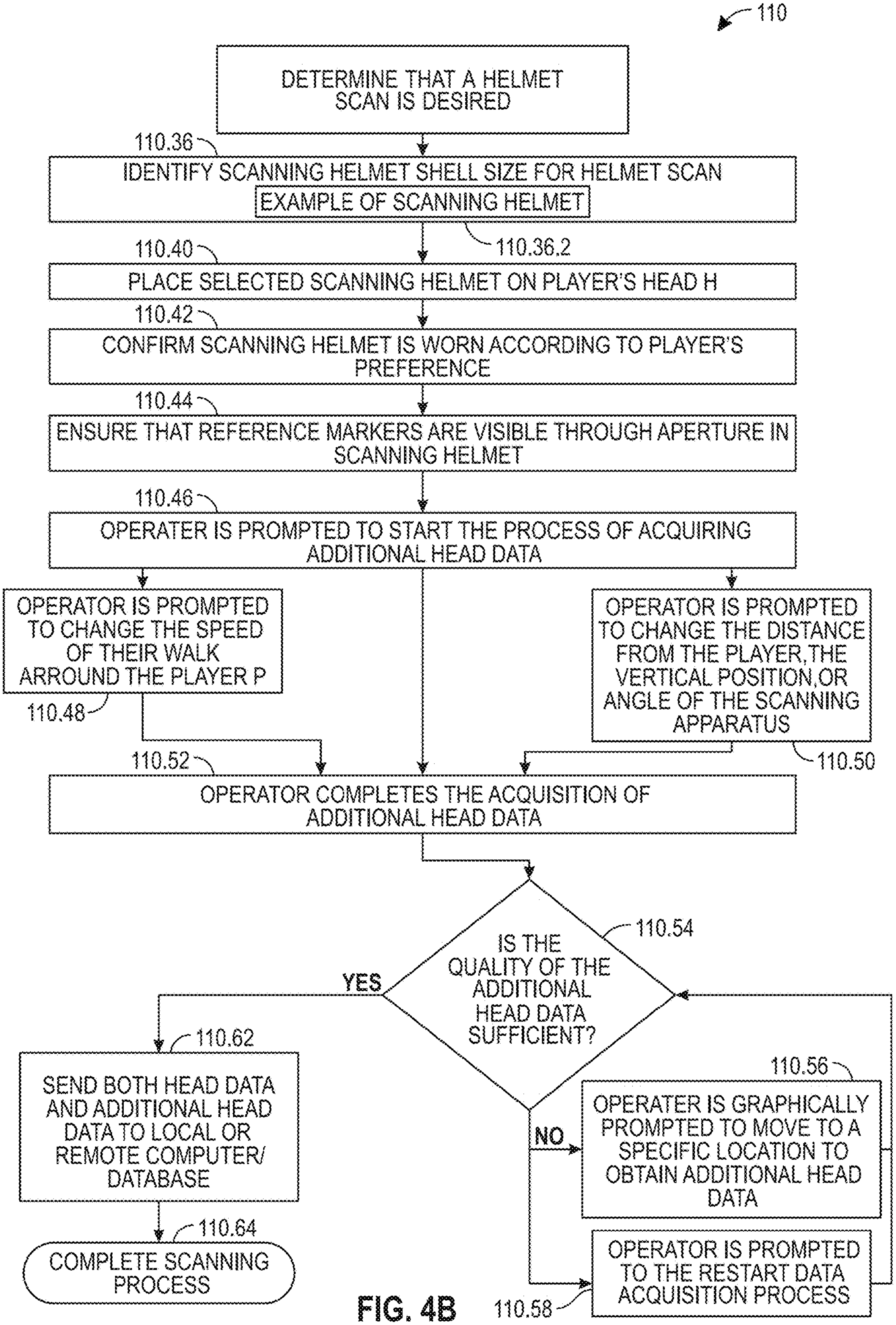
FIG. 4B is a flow chart of the data collection, processing and fitment system, showing an optional method for collecting additional player head data using a scanning helmet.

FIG. 4B describes the acquisition of additional head data using a scanning helmet 110.36.2. The first step in this process is 110.36, which is accomplished by identifying the proper scanning helmet 110.36.2. As an example for a player P, the scanning helmet 110.36.2 shell sizes may include small, medium, large and extra-large, although additional or intermediate sizes are certainly within the scope of this disclosure. The selection of the scanning helmet 110.36.2 shell size may be determined by the position the player plays, previous player experiences, or by estimations or measurements taken during or before the acquisition of the head data. It should be understood that the term scanning helmet 110.36.2 does not just refer to a helmet that is placed over the player's head; instead, it refers to a modified version of the end product that is being designed and manufactured according to the methods disclosed herein, which aids in the collection of additional head data.

Once the size of the scanning helmet 110.36.2 is selected in step 110.36, the scanning helmet 110.36.2 is placed over the player's head H while the player P is wearing the scanning hood 110.8.2 in step 110.40. After the scanning helmet 110.36.2 is placed on the player's head H in step 110.40 the player adjusts the scanning helmet 110.36.2 to a preferred wearing position or configuration, which includes adjusting the chin strap assembly by tightening or loosening it. It is not uncommon for a player P to repeatedly adjust the scanning helmet 110.36.2 to attain his or her preferred wearing position because this position is a matter of personal preference. For example, some players prefer to wear their helmet lower on their head H with respect to their brow line, while other players prefer to wear their helmet higher on their head H with respect to their brow line.

Figure 9:
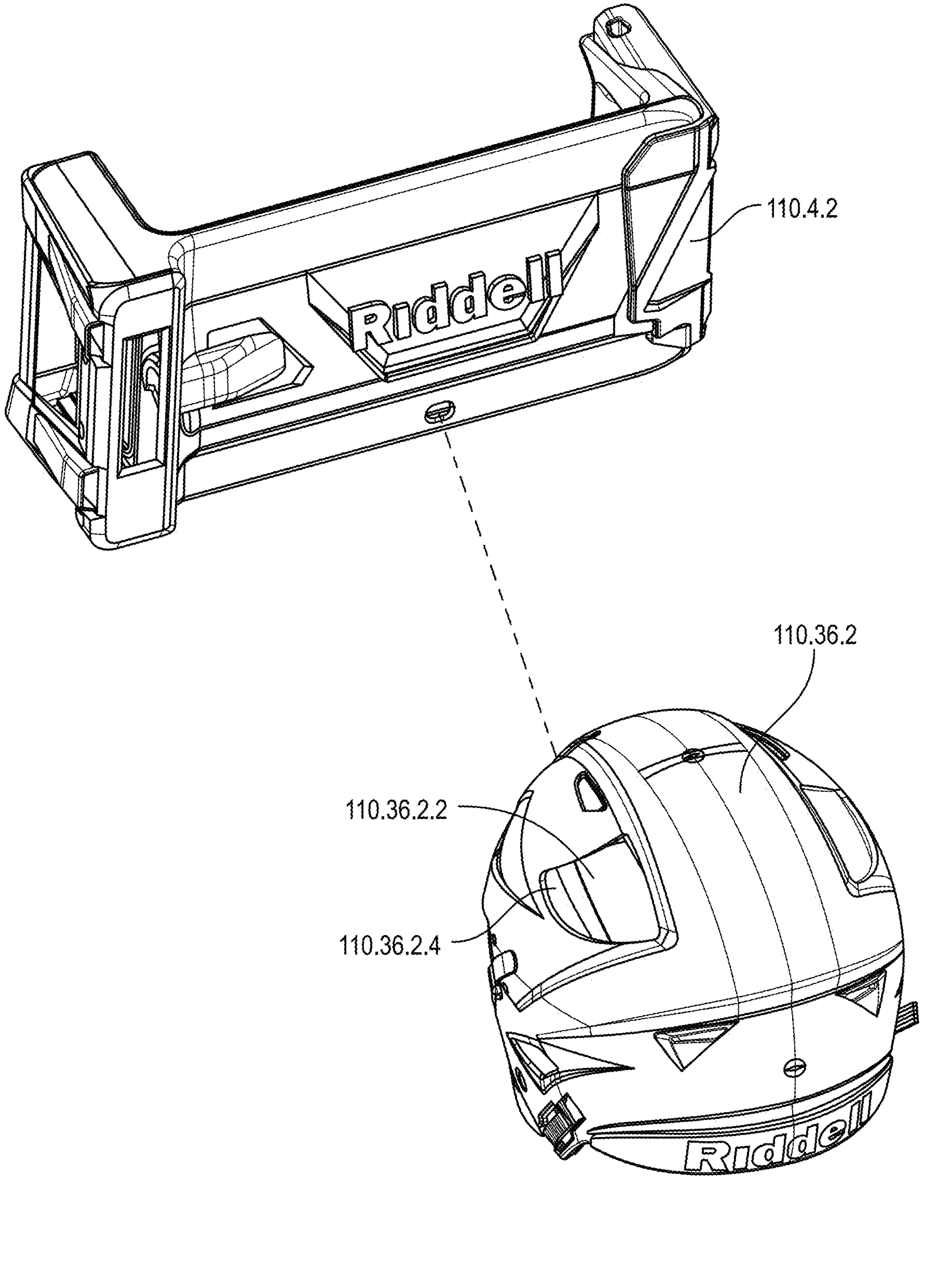
FIG. 9 shows the third exemplary scanning helmet, which is used in the collection of additional head data by placing said scanning helmet on the player's head and scanning the player's head region.

As shown in FIG. 9, the scanning helmet 110.36.2 includes the chin strap 110.36.2.1, one or more apertures 110.36.2.2 formed in a shell 110.36.2.3 of the helmet 110.36.2 and an internal scanning energy attenuation assembly 110.36.2.4. The position, number, and shape of the apertures 110.36.2.2 in the scanning helmet 110.36.2 are not limited by this disclosure. For example, the scanning helmet 110.36.2 may have one aperture 110.36.2.2 that is smaller than the aperture 110.36.2.2 shown in FIG. 6, the scanning helmet 110.36.2 may have twenty apertures that are positioned in various locations throughout the shell, or the scanning helmet 110.36.2 may have three apertures. These apertures 110.36.2.2 allow certain portions of the scanning hood 110.8.2 to be seen when the scanning helmet 110.36.2 is worn over the scanning hood 110.8.2 on the player's head H. As mentioned above, the scanning helmet 110.36.2 includes the faceguard that is removably attached to a forward portion of the scanning helmet 110.36.2. The faceguard may be used by the player, when wearing the scanning helmet 110.36.2 to assist the player in determining a preferred helmet wearing position. Once the player positions the scanning helmet 110.36.2 such that a preferred helmet wearing position is achieved, the faceguard is removed to increase the accuracy of the helmet scan by allowing a scanning apparatus 110.4.2 to capture a greater, and less obscured, a portion of the player's face. To aid in the attachment and removal of the faceguard, easy to open and close clips may be utilized. Although the faceguard is removed, the chin strap assembly remains secured around the player's chin and jaw thereby securing the scanning helmet 110.36.2 in the preferred helmet wearing position.

Referring back to FIG. 4B, after the scanning helmet 110.36.2 is properly positioned on the player's head in steps 110.42, 110.44, the operator is prompted by the software application 110.4.4 to start the data acquisition process. Similar to the above process, the software application 110.4.4 may instruct the operator to: (i) change the speed at which they are moving around the player (e.g., slow down the pace) to ensure that the proper level of detail is captured in step 110.48, (ii) change the vertical position and/or angle of the scanning apparatus 110.4.2 in step 110.50, and/or (iii) change the operators position in relation to the player P (e.g., move forward or back up from the player) in step 110.50. Once the operator completes the acquisition of additional head data in step 110.52, the software application 110.4.4 analyzes the data to determine if the quality of the data is sufficient to meet the quality requirements that are preprogrammed within the software application 110.4.4 in step 110.54. If the software application 110.4.4 determines that the quality of the data is sufficient 110.54, then the scanning apparatus 110.4.2 will send, via a wire or wirelessly, to a local or remote computer/database (e.g., team database 100.2.10), the head data. This local or remote computer/database may then be locally or remotely accessed by technicians who perform the next steps in designing and manufacturing the American football helmet 5000.

Alternatively, if the software application 110.4.4 determines that the quality of the head data lack sufficient quality to meet the quality requirements that are preprogrammed within the software application 110.4.4, then the software application 110.4.4 may prompt the operator to obtain additional data in steps 110.56, 110.58. Specifically, in step 110.56 the software application 110.4.4 may graphically show the operator: (i) the location to stand, (ii) what elevation to place the scanning apparatus 110.4.2, and/or (iii) what angle to place the scanning apparatus 110.4.2. Once the operator obtains the additional head data at that specific location, the software application 110.4.4 will then analyze the original collection of head data along with this additional head data to determine if the quality of the combined collection of head data is sufficient to meet the quality requirements that are preprogrammed within the software application 110.4.4. This process is then repeated until the quality of the data is sufficient. Alternatively, the software application 110.4.4 may request that the operator restart the data acquisition process in step 110.58. The software application 110.4.4 then analyzes the first collection of head data along with the second collection of head data to see if the combination of data is sufficient to meet the quality requirements that are preprogrammed within the software application 110.4.4. This process is then repeated until the quality of the data is sufficient. After the data is determined to be sufficient, the software application 110.4.4 performs step 110.62. It should be understood that some of the steps in the process of acquiring head data may be performed in a different order. For example, the acquisition of data in connection with the scanning hood 110.8.2 may be performed after the acquisition of data in connection with the scanning helmet 110.36.2.

E. COMPLETE HEAD MODEL

Figure 10:
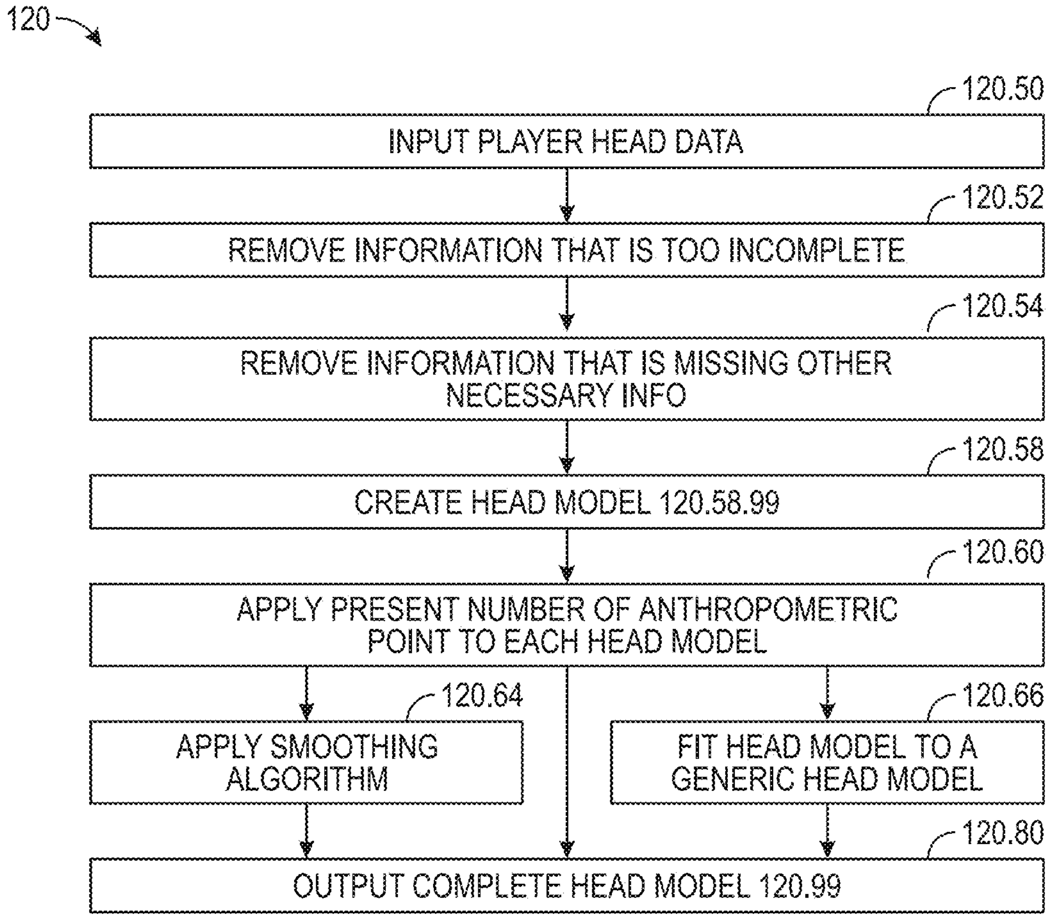
FIG. 10 is a flow chart showing the method of forming a complete player head model from the collected player head data.
Figure 11:
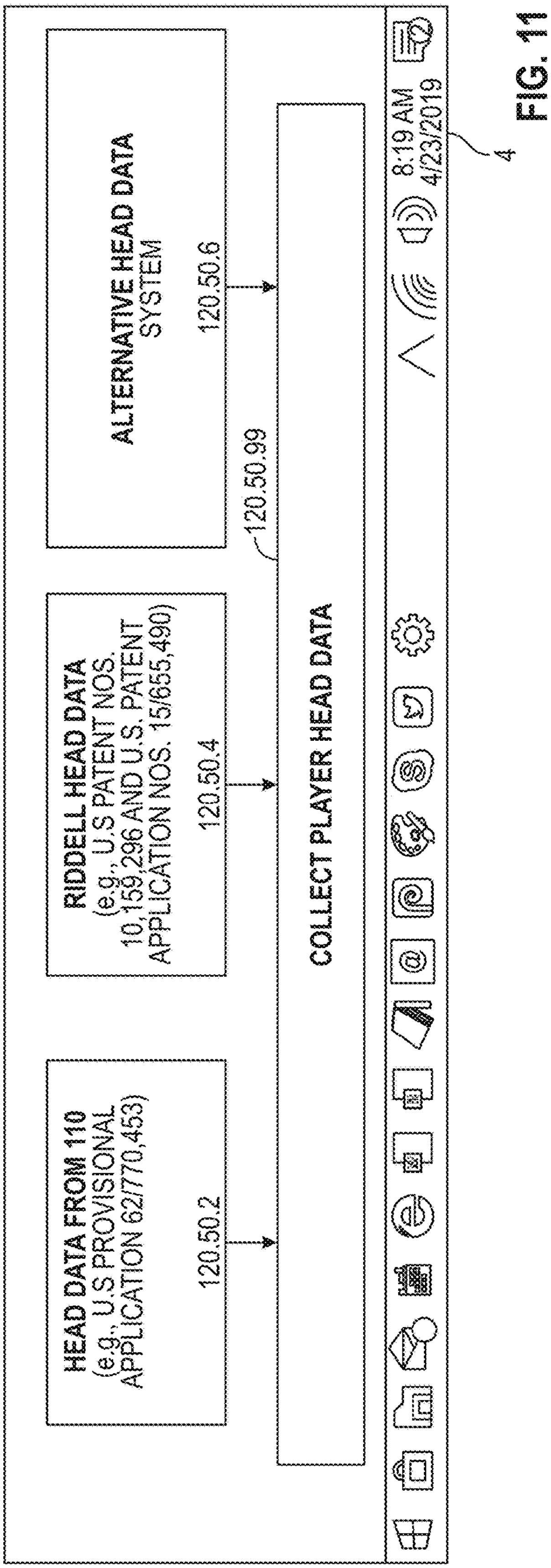
FIG. 11 shows the electronic device displaying a plurality of player head data sets and sources.

Referring back to FIG. 3, the next step (120) in this process is to create a complete head model 120.99. Like other steps herein, step 120 includes multiple sub-steps that are shown in FIG. 10. The process of creating this head model 120.99 starts with collecting this data in step 120.50. Referring to FIG. 11, this data may be generated and stored in connection with: (i) 120.50.2, which is described above in connection with FIGS. 4A-4B, (ii) 120.50.4, which are systems that are described within U.S. Pat. No. 10,159,296 and U.S. patent application Ser. No. 15/655,490 that are owned or licensed to the assignee of this application, or (iii) 120.50.6, which is an alternative system. Referring back to FIG. 10, once the collection of player head data 120.50.99 is identified, it is reviewed for its accuracy and completeness. First, the collection of player head data is removed from this method 1 and further analysis, if it is too incomplete (e.g., contains large holes) in step 120.52. Next, in step 120.54, the collection of player head data is removed from this method 1 and further analyzed, if other necessary data about the player (e.g., player's position or level) is missing. If the collection of player head data is removed for any reason, including the above reasons, then the system will try and obtain this data by searching the team database, sending an inquiry to the coach, or sending an inquiry to the individual player. Once this missing data is obtained, this helmet selection and/or manufacturing may continue. If this data cannot be obtained, certain the protective sports helmet may not be available to the specific player until he provides this additional data.

Next, a head model 120.58.99 is created for the player based on the collected head data 120.50.99 in step 120.58. One method of creating the head model 120.58.99 is using a photogrammetry based method. In particular, photogrammetry is a method that creates a model, preferably a 3D model, by electronically combining images or frames of a video. The electronic combination of these images or frames from a video may be accomplished in a number of different ways. For example, Sobel edge detection or Canny edge detection may be used to roughly find the edges of the object of interest (e.g., the scanning hood 110.8.2 or scanning helmet 110.36.2). The computerized modeling system may then remove parts of each image or frame that are known not to contain the object of interest. This reduces the amount of data that will need to be processed by the computerized modeling system in the following steps. Additionally, removing parts of the images or frames, which are known not to contain the objects of interest reduces the chance of errors in the following steps, such as the correlating or matches of a reference point contained within the object of interest with the background of the image.

While still in step 120.58, the computerized modeling system processes each image or frame of video to refine the detection of the edges or detect reference markers 110.8.2.2.2. After refining the detection of the edges or detecting reference markers 110.8.2.2.2, the computerized modeling system correlates or aligns the edges or reference markers 110.8.2.2.2 in each image to other edges or reference markers 110.8.2.2.2 in other images or frames. The computerized modeling system may use any one of the following techniques to align the images or frames with one another: (i) expectation-maximization, (ii) iterative closest point analysis, (iii) iterative closest point variant, (iv) Procrustes alignment, (v) manifold alignment, (vi) alignment techniques discussed in Allen B, Curless B, Popovic Z. *The space of human body shapes: reconstruction and parameterization from range scans*. In: Proceedings of ACM SIGGRAPH 2003 or (vii) other known alignment techniques. This alignment informs the computerized modeling system of the position of each image or frame of video, which is utilized to reconstruct a head model 120.58.99 based on the acquired head data.

The head model 120.58.99 may also be created by the computerized modeling system using the head data that is obtained by the above described non-contact LiDAR or time-of-flight based scanner. In this example, the computerized modeling system will apply a smoothing algorithm to the points within the point cloud generated by the scanner. This smoothing algorithm will create a complete surface from the point cloud, which in turn will be the head model 120.58.99. Further, the head model 120.58.99 may be created by the computerized modeling system using the collection of pressure measurements that were taken by the contact scanner. Specifically, each of the measurements will allow for the creation of points within space. These points can then be connected in a manner that is similar to how points of the point cloud were connected (e.g., using a smoothing algorithm). Like above, the computerized modeling system's application of the smoothing algorithm will create a complete surface, which in turn will be the head model 120.58.99. Alternatively, the head model 120.58.99 may be created by the computerized modeling system based on the head data gathered using any of the devices or methods discussed above.

Alternatively, a combination of the above described technologies/methods may be utilized to generate the head model 120.58.99. For example, the head model 120.58.99 may be created using a photogrammetry method and additional data may be added to the model 120.99 based on a contact scanning method. In a further example, the head model 120.58.99 may be created by the computerized modeling system based on the point cloud generated by the LiDAR sensor. Additional data may be added to the head model 120.58.99 using a photogrammetry technique. It should also be understood that the head model 120.58.99 may be analyzed, displayed, manipulated, or altered in any format, including a non-graphical format (e.g., values contained within a spreadsheet) or a graphical format (e.g., 3D model in a CAD program). Typically, the 3D head model 120.58.99 is shown by a thin shell that has an outer surface, in a wire-frame form (e.g., model in which adjacent points on a surface are connected by line segments), or as a solid object, all of which may be used by the system and method disclosed herein.

Once the head model 120.58.99 is created, the computerized modeling system determines a scaling factor. This is possible because the size of the reference markers 110.8.2.2.2 or other objects (e.g., coin, ruler, etc.) within the images or frames are known and fixed. Thus, the computerized modeling system determines the scaling factor of the model by comparing the known size of the reference markers 110.8.2.2.2 to the size of the reference markers in the model 120.99. Once this scaling factor is determined, the outermost surface of the head model 120.58.99 closely represents the outermost surface of the player's head along with the outermost surface of the scanning hood 110.8.2. While the thickness of the scanning hood 110.8.2 is typically minimal (e.g., 1.5 mm), it may be desirable to subtract the thickness of the scanning hood 110.8.2 from the head model 120.58.99 after the model is properly scaled to ensure that the head model 120.58.99 closely represents the outermost surface of the player's head. Alternatively, the thickness of the scanning hood 110.8.2 may not be subtracted from the head model 120.58.99.

Figure 12:
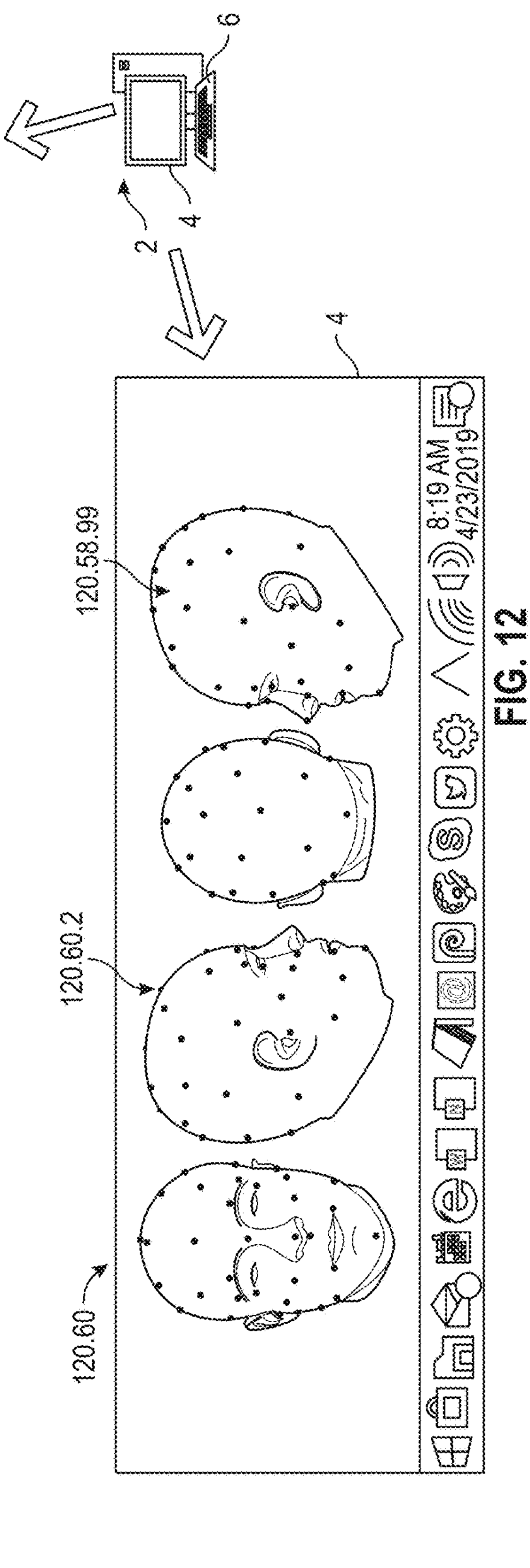
FIG. 12 shows the electronic device displaying multiple views of a three-dimensional (3D) complete player head model created from the player head data, which has a number of anthropometric points positioned and denoted thereon.

Once the head model 120.58.99 is created and scaled in step 120.58, anthropometric landmarks 120.60.2 may be placed on known areas of the head model 120.58.99 by the computerized modeling system in step 120.60. Specifically, FIG. 12 shows multiple views of an exemplary head model 120.58.99, including a preset number of anthropometric points 120.60.2. These anthropometric points 120.60.2 typically are placed at locations that can be identified across most head models 120.58.99. As shown in FIG. 12, the points 120.60.2 are positioned on the tip of the nose, edges of the eyes, between the eyes, the forwardmost edge of the chin, edges of the lips, and other locations. For example, the following anatomical features may be identified: (i) exocanthion (ex) is located at the player's outer commissure of the eye fissure or where the upper eyelid meets with the lower eyelid, (ii) cheilion (ch) is located at the lateral oral commissure or where the upper lip meets with the lower lip, (iii) menton (me) is located at the most inferior midline point of the soft tissue chin, (iv) subnasale (sn) is located at the deepest midline point where the base of the nasal columella meets the upper lip, (vii) labrale superius (ls) is located at the midline point of the upper lip, and (viii) palpebrale inferius (pi) is located at the lowest point of each lower eyelid, (ix) supra-aural (sa) is located at the outermost points of the player's ears, (x) nasal tip (nt) is located at the forward most point of the player's nose, (xi) trichion (t) is located at t the intersection of the normal hairline and the middle line of the forehead, (xii) glabella (g) is located at the most prominent midline point of the forehead between the brow ridges, (xiii) coronal suture (cs) is a fibrous connective tissue joint that separates the two parietal bones from the frontal bone of the skull, (xiv) mid-sagittal plane (Pus) is a longitudinal plane that divides the player's body, including their head, into two equal halves, and (xv) mid-coronal plane (Pc) is a longitudinal plane that divides the player's body, including their head, into ventral and dorsal sections.

It should be understood that a head model 120.58.99 may be a model of any head of the player/helmet wearer, including a head, foot, elbow, torso, neck, and knee. The following disclosure focuses on designing and manufacturing an American football helmet 5000 that is designed to receive and protect a player's head. Thus, the head model 120.58.99 discussed below in the next stages of the method 1 is a model of the player's head or a "head model." Nevertheless, it should be understood that the following discussion involving the head model in the multi-step method 1 is only an exemplary embodiment of the method for the selection and/or design of an American football helmet 5000, and this embodiment shall not be construed as limiting. For example, the disclosed method 1 can be used in connection with data collection, processing and fitment system 10 for designing and manufacturing of a protective recreational sports helmet by selecting a combination of pre-manufactured components (e.g., internal energy attenuation component) from pluralities of pre-manufactured components (e.g., internal energy attenuation component) based upon data that is collected from the player or person that will wear the helmet.

Referring back to FIG. 10, in step 120.64, computerized modeling system may apply a smoothing algorithm to the head model 120.58.99. Specifically, the head model 120.58.99 may have noise that was introduced by movement of the player's head H while the head data was obtained or a low resolution scanner was utilized. Exemplary smoothing algorithms that may be applied include: (i) interpolation function, (ii) the smoothing function described within Allen B, Curless B, Popovic Z. *The space of human body shapes: reconstruction and parameterization from range scans*. In: Proceedings of ACM SIGGRAPH 2003, or (iii) other smoothing algorithms that are known to one of skill in the art (e.g., the other methods described within the other papers are attached to or incorporated by reference in U.S. Provisional Patent Application No. 62/364,629, each of which is incorporated herein by reference).

Alternatively, if the system or designer determines that the head model 120.58.99 is too incomplete to only use a smoothing algorithm, the head model 120.58.99 may be overlaid on a generic model in step 120.66. For example, utilizing this generic model fitting in comparison to attempting to use a smoothing algorithm is desirable when the head model 120.58.99 is missing a large part of the crown region of the player's head. To accomplish this generic model fitting, anthropometric landmarks 120.60.2 that were placed on the head model 120.99 are then aligned with the anthropometric landmarks 120.60.2 of the generic model using any of the alignment methods that are disclosed above (e.g., expectation-maximization, iterative closest point analysis, iterative closest point variant, Procrustes alignment, manifold alignment, and etc.) or methods that are known in the art. After the head model 120.99 and the generic model are aligned, the computerized modeling system creates gap fillers that are based upon the generic model. Similar gap filling technique is discussed within P. Xi, C. Shu, *Consistent parameterization and statistical analysis of human head scans*. The Visual Computer, 25 (9) (2009), pp. 863-871, which is incorporated herein by reference. It should be understood that a smoothing algorithm from step 120.60 may be utilized after gaps in the head model 120.99 are filled in step 120.62. Additionally, it should be understood that the head model 120.99 may not require smoothing or filling; thus, steps 120.64, 120.66 are skipped. It should be understood that the steps described within the method of preparing the data 120, may be performed in a different order. For example, the removal of data that is incomplete in steps 120.4, 120.52, and removal of data that is missing other relevant info 120.6, 120.54 may not be performed or may be performed at any time after steps 120.2, 120.50, respectfully.

F. COMPUTERIZED HELMET TEMPLATE

Referring to FIG. 3, the next step (200) in this process is creating a computerized helmet template 200.99. Like other steps herein, step 200 includes multiple sub-steps that are shown in FIGS. 13-38. There are three primary steps, which include: (i) setting the helmet template reference point(s) and generating the vector array(s) in step 205 (see FIG. 13), (ii) determining and averaging the threshold line lengths in step 220 (see FIG. 15), and (iii) determining and averaging the energy attenuation line lengths in step 260 (see FIG. 23). In this embodiment, the computerized helmet template 200.99 utilizes multiple different data types and information in order to energy attenuation line length 272.2, 272.4 shown in FIG. 38. In particular, the computerized helmet template 200.99 may include: (i) helmet template reference point(s) 207.2.99, 207.4.99, (ii) vector arrays 209.2.99, 209.4.99, (iii) threshold surfaces 224.2, 224.4, (iv) threshold intersection locations or coordinates 226.2, 226.4, (v) averages of threshold line lengths 232.2, 232.4, (vi) energy attenuation surfaces 264.12.2-264.12.14, (vii) energy attenuation intersection locations or coordinates 266.2, 266.4, and (viii) averages of energy attenuation line length 272.2, 272.4. In other embodiments, the computerized helmet template 200.99 may include: (i) helmet template reference point(s) 207.2.99, 207.4.99, (ii) vector arrays 209.2.99, 209.4.99, (iii) threshold surfaces 224.2, 224.4, (iv) threshold intersection locations 226.2, 226.4, (v) averages of threshold line lengths 232.2, 232.4, (vi) MCS surface, (vii) MCS intersection locations, (viii) averages of MCS line lengths, (ix) energy attenuation surfaces 264.12.2-264.12.14, (x) energy attenuation intersection locations 266.2, 266.4, and (xi) averages of energy attenuation line length 272.2, 272.4 (see FIG. 38). In other embodiments, the computerized helmet template 200.99 may include: (i) averages of threshold line lengths 232.2, 232.4, and (ii) averages of energy attenuation line length 272.2, 272.4 (see FIG. 38). In further embodiments, the computerized helmet template 200.99 may include: (i) threshold intersection locations 226.2, 226.4, and (ii) energy attenuation intersection locations 266.2, 266.4. Or other embodiments may include all line lengths (i.e., without averages) or other combinations of the above elements, components, data, and/or calculations.

Each of these steps will be discussed in greater detail below, but it should be understood that the helmet manufacture typically performs these steps well before offering the American football helmet 5000 for sale. This is because the computerized helmet template 200.99 is based on the helmet components and is not unique for specific players. In fact, all data collected from the players will be typically be plugged into the same computerized helmet template 200.99 to determine the arrangement of helmet components that best fit that player. Utilizing multiple computerized helmet template 200.99 is possible, but adds a greater level of complexity that risks the uniform selection of the helmet components for a specific player.

Optionally, the computerized helmet template 200.99 may include a minimum certified surface (MCS). This MCS is defined by a collection of minimum distance values that extend inward from the inner surface of the helmet shell. When the helmet model 200.99 is properly placed on the complete head model 120.99, the outer surface 120.99.2 of the complete head model 120.99 should not extend beyond the MCS. As such, if the outer surface 120.99.2 of the complete head model 120.99 extends through the MCS, then a larger helmet shell needs to be selected and utilized for the player. Alternatively, if the outer surface 120.99.2 of the complete head model 120.99 does not extend through the MCS, then the MCS is satisfied and the selected helmet shell can be utilized for the player. In other words, the MCS is satisfied when the distance between the inner surface of the helmet shell and the outer surface of the player's head is greater than or equal to the minimum distance values for a particular shell size. It should be understood that satisfying the MCS does not mean that the helmet is correctly sized for the player's head. For example, a helmet that is too large for a player will not fit properly, but the MCS will be satisfied. Thus, the MCS ensures that the player is not given too small of a helmet. The MCS is an optional component of the computerized helmet template 200.99 because the threshold surfaces 224.2, 224.4 are positioned within its associated MCSs. Thus, if the player's head is smaller than the threshold surface, it will be smaller than the MCS. However, utilization of an MCS may be useful if the player's head is larger than the largest threshold surface (i.e., green threshold surface 224.4) because this will confirm that the player can wear a large helmet shell without over compressing the energy attenuation components, which typically causes the energy attenuation components to apply too much pressure to the players head when the helmet is worn by the player. Additionally, utilization of an MCS may be useful when one or two of the three regions (e.g., side, rear and occipital) are larger than the threshold surface, but not all three regions are larger than the threshold surface, to ensure that the regions that are larger than the threshold surface do not extend into a location that will over compressing the energy attenuation components in that region. Further reasons why the utilization of an MCS could be useful may be obvious to one of skill in the art based on this disclosure.

1. Reference Point(s) and Vector Array(s)

Figure 13:
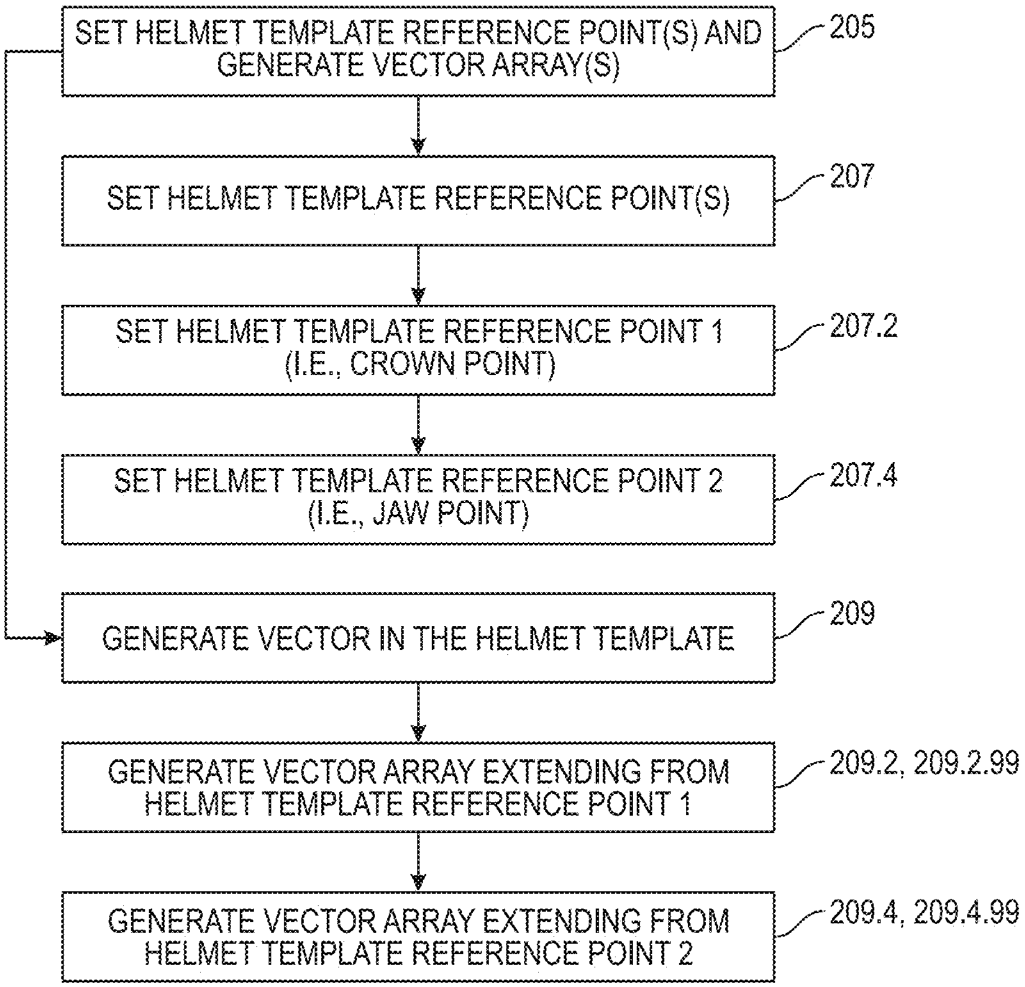
FIG. 13 is a flow chart showing a method for generating a first portion of the computerized helmet template, which includes setting the helmet template reference point(s) and vector array(s)
Figure 14:
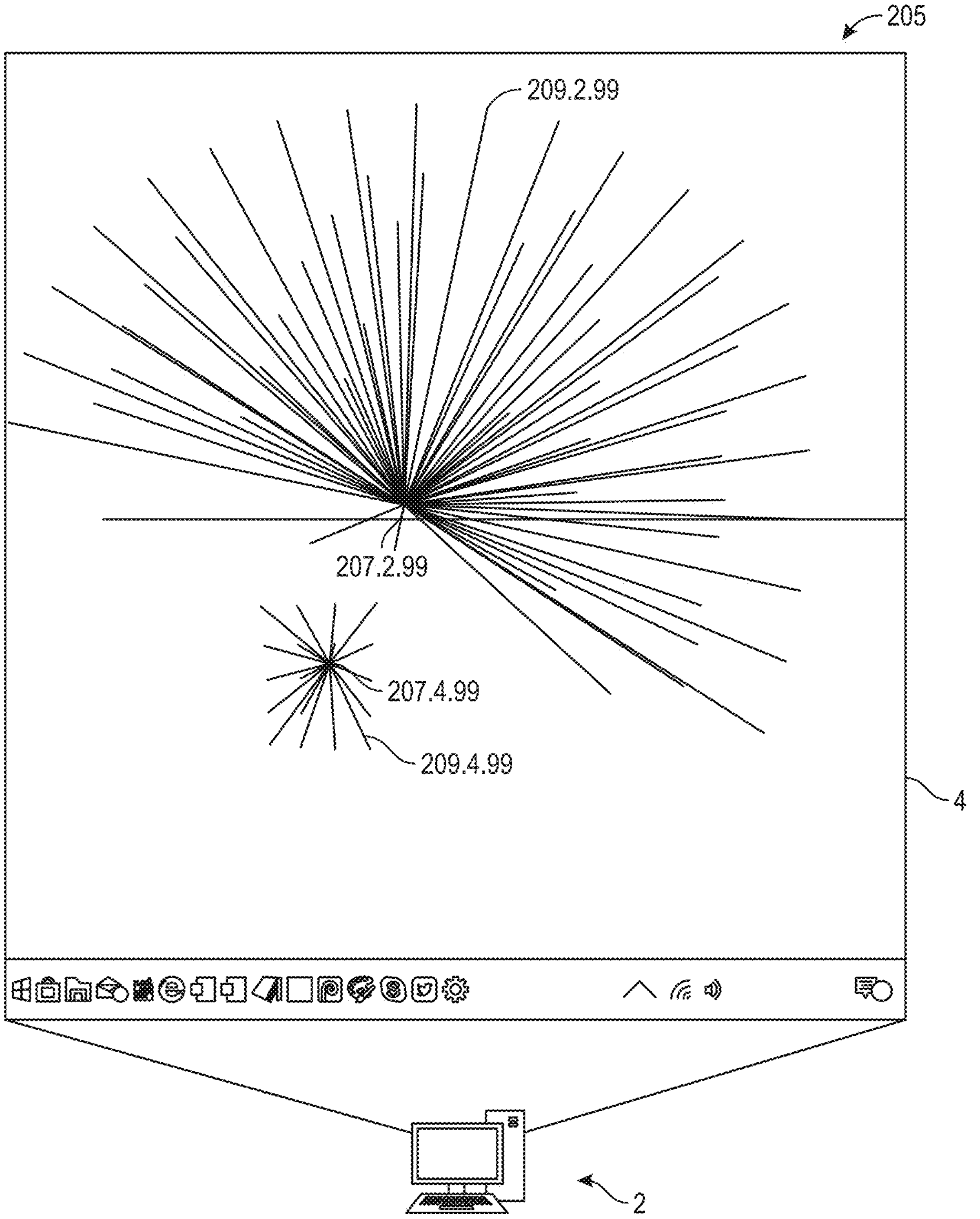
FIG. 14 shows the electronic device displaying the computerized helmet template reference point(s) and vector array(s)

FIG. 13 is a flow chart describing step 205 of the data collection, processing and fitment system 10, showing a method for generating a first portion of the computerized helmet template, which includes setting the helmet template reference point(s) and vector array(s). First, the helmet template reference point(s) are set within the computerized helmet model 200.99 in step 207. In this embodiment, a first template or crown reference point 207.2.99 is set in step 207.2 and a second template or jaw reference point 207.4.99 is set in step 207.4. A graphical display of these two template reference points 207.2.99, 207.4.99 are shown in FIG. 14. Two template reference points 207.2.99 and 207.4.99 are utilized to help ensure that the line lengths in the jaw regions are closer to perpendicular or normal to the shell's outer surface. It should be understood that in other embodiments that a single template reference point may be utilized or more than two (e.g., 5,000) template reference points may be utilized.

After the helmet template reference point(s) are set in step 207, vector arrays are created in step 209. Here, a vector array is formed from each of the helmet template reference point(s), wherein the vector array is: (i) comprised of a predetermined number of vectors (e.g. between 1 and 2,000, preferably between 50 and 1,000 and most preferably between 150 and 300) that extend out from the reference point, (ii) each vector is spaced an equal distance (between 1 degree and 90 degrees, preferably between 2 degrees and 40 degrees and most preferably between 4 degrees and 8 degrees) from the other vectors (e.g., in a starburst pattern), and (iii) each vector is dimensioned such that it extends beyond the outer surface of the helmet shell. Because two template reference point(s) 207.2.99 and 207.4.99 were utilized in step 207, two vector arrays will be generated in step 209. In particular step 209, creates a first vector array or crown vector array 209.2.99 in step 209.2 with a first set of predetermined vectors (e.g., between 150 and 300) and a second vector array or jaw vector array 209.4.99 in step 209.4 with a second set of predetermined vectors (e.g., between 5 and 75). A graphical display of these two vector arrays 207.2.99, 207.4.99 are shown in FIG. 14. It should be understood that the number of vectors contained within each array may be increased or decreased, the spacing between the vectors may or may not be equal, or the number of arrays may be increased (e.g., ten) or decreased (e.g., one) depending on the number of template reference point that are utilized. After the helmet template reference point(s) are set in step 207 and vector arrays are created in step 209, the next step in generating the computerized helmet template is undertaken.

2. Threshold Line Lengths

Figure 15:
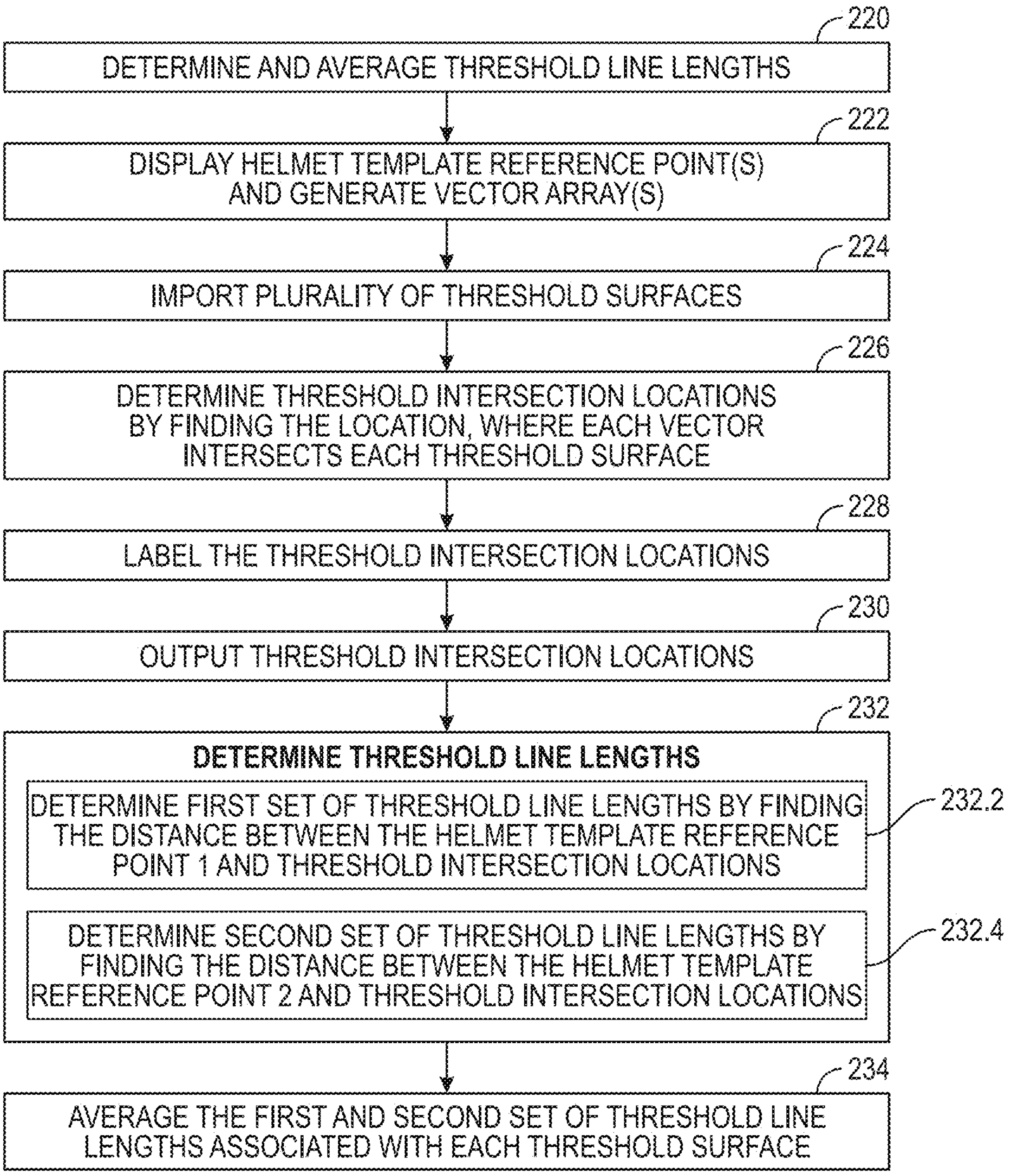
FIG. 15 is a flow chart showing a method for generating a second portion of the computerized helmet template, which includes determining threshold line lengths.
Figure 16:
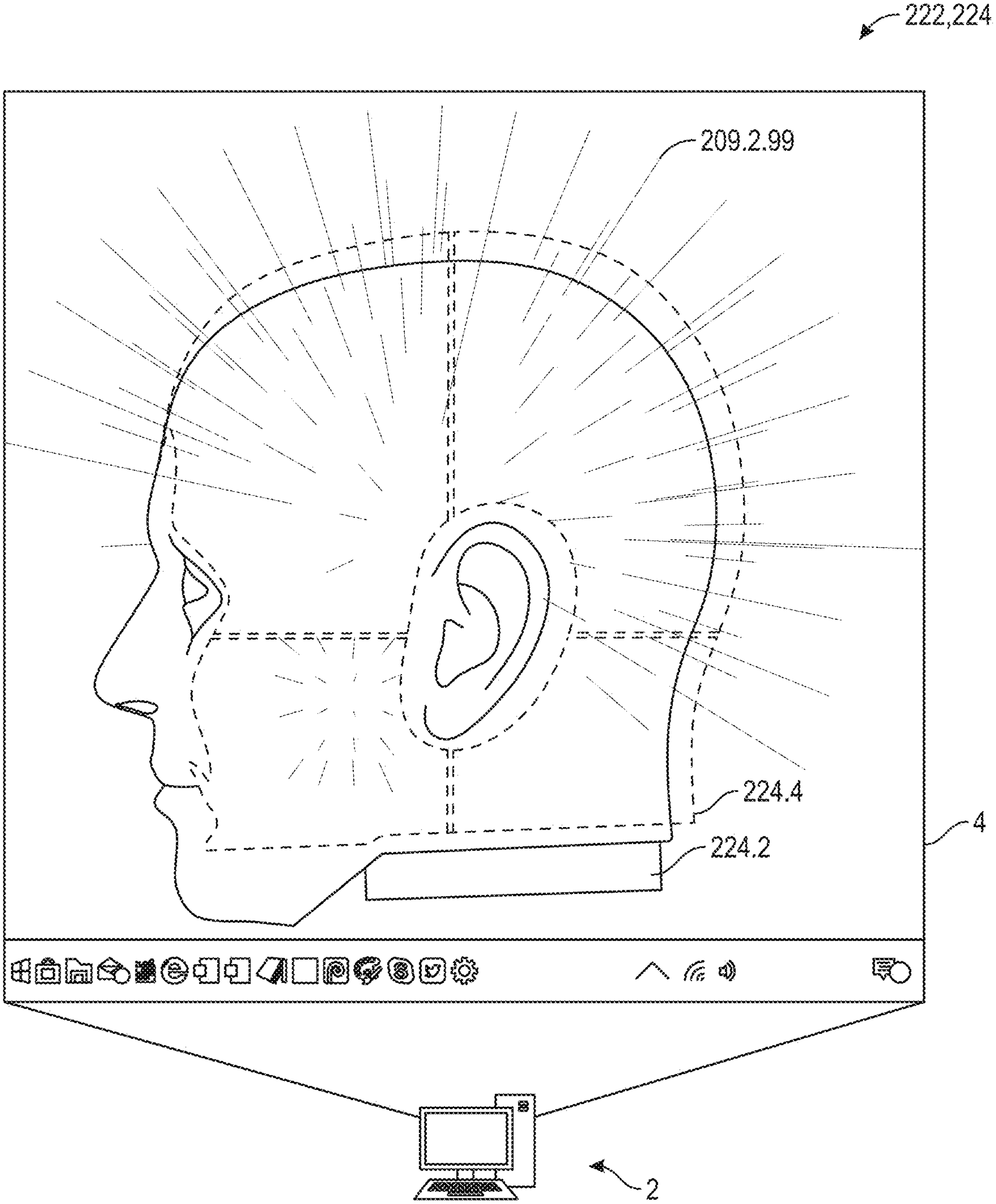
FIG. 16 shows the electronic device displaying two threshold surfaces and the helmet template vector arrays.

FIG. 15 is a flow chart describing step 220 of the data collection, processing and fitment system 10, showing a method for generating a second portion of the computerized helmet template 200.99, which includes determining threshold line lengths. In step 222, the helmet template reference point(s) and generated vector array(s) generated in steps 207 and 209 are displayed (See FIG. 16). After step 222 is completed, the system 10 import and aligns (e.g., expectation-maximization, iterative closest point analysis, iterative closest point variant, Procrustes alignment, manifold alignment, or other known alignment techniques) a plurality of threshold surfaces in step 224. Each threshold surface 224.2, 224.4 is utilized to determine when shell size best fits the player. In this embodiment, there are three shell sizes (e.g., small, medium, and large) and thus there are two threshold surfaces 224.2, 224.4. A graphical display of these two threshold surfaces 224.2, 224.4 and generated vector array (s) 209.2.99 are shown in FIG. 16. These threshold surfaces are user defined based upon the Assignees analysis of thousands of head scans and how to best fit a player within a helmet shell. For example, these threshold surfaces may be determined based on the data obtained using U.S. Pat. Nos. 10,948,898, 11,033,796, 11,213,736, 11,399,589, and 11,167,198, each of which is incorporated herein by reference. It should be understood that if there were additional shell size (e.g., five shell sizes), additional threshold surfaces would be utilized (e.g., four threshold surfaces). Likewise, if there were fewer shell sizes (e.g., two shell sizes), fewer threshold surfaces would be utilized (e.g., one threshold surface).

Figure 17:
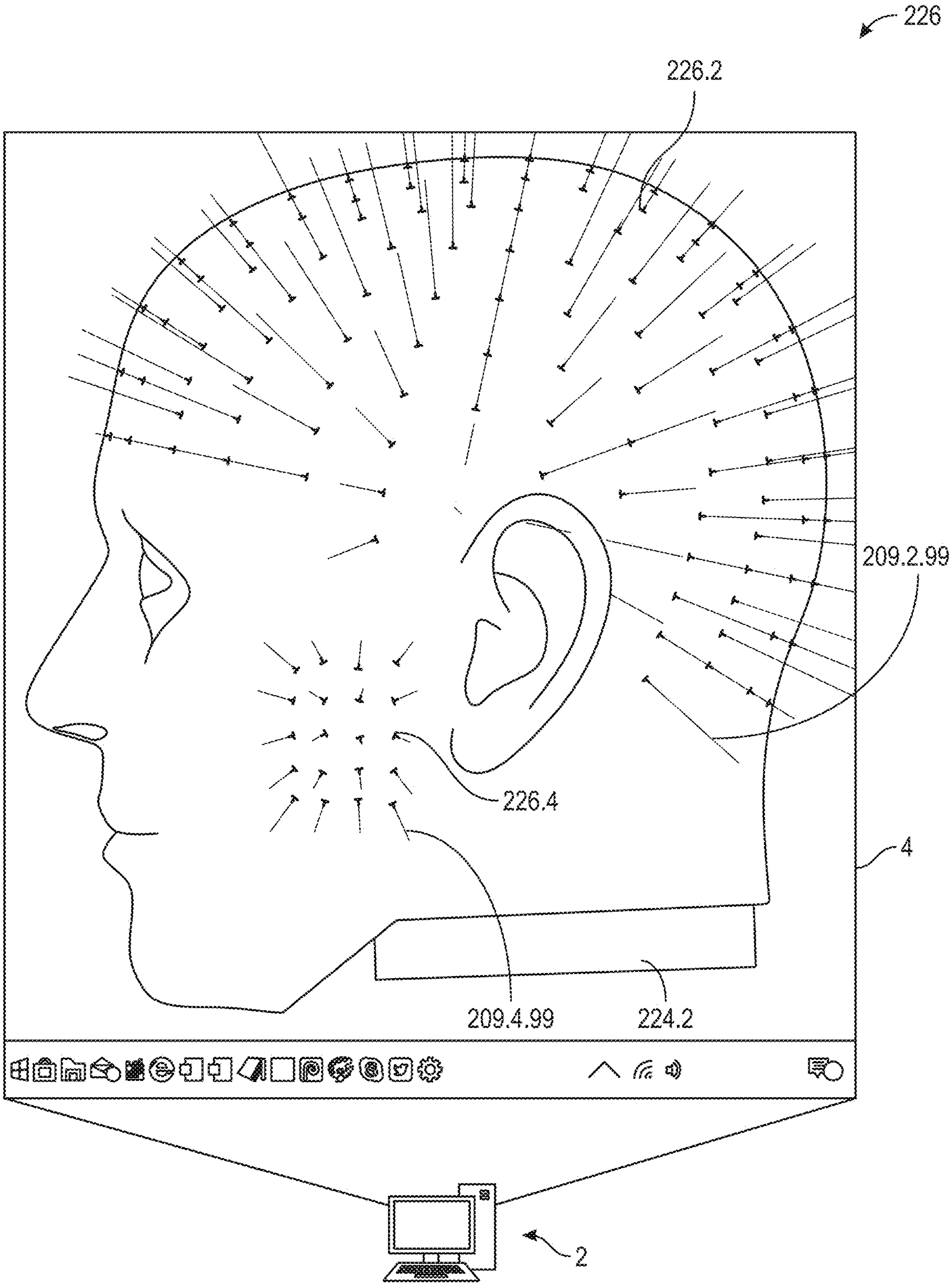
FIG. 17 show the electronic device displaying one of the threshold surfaces and the threshold intersection locations, which occur where the helmet template vector arrays intersect said threshold surface.
Figure 18:
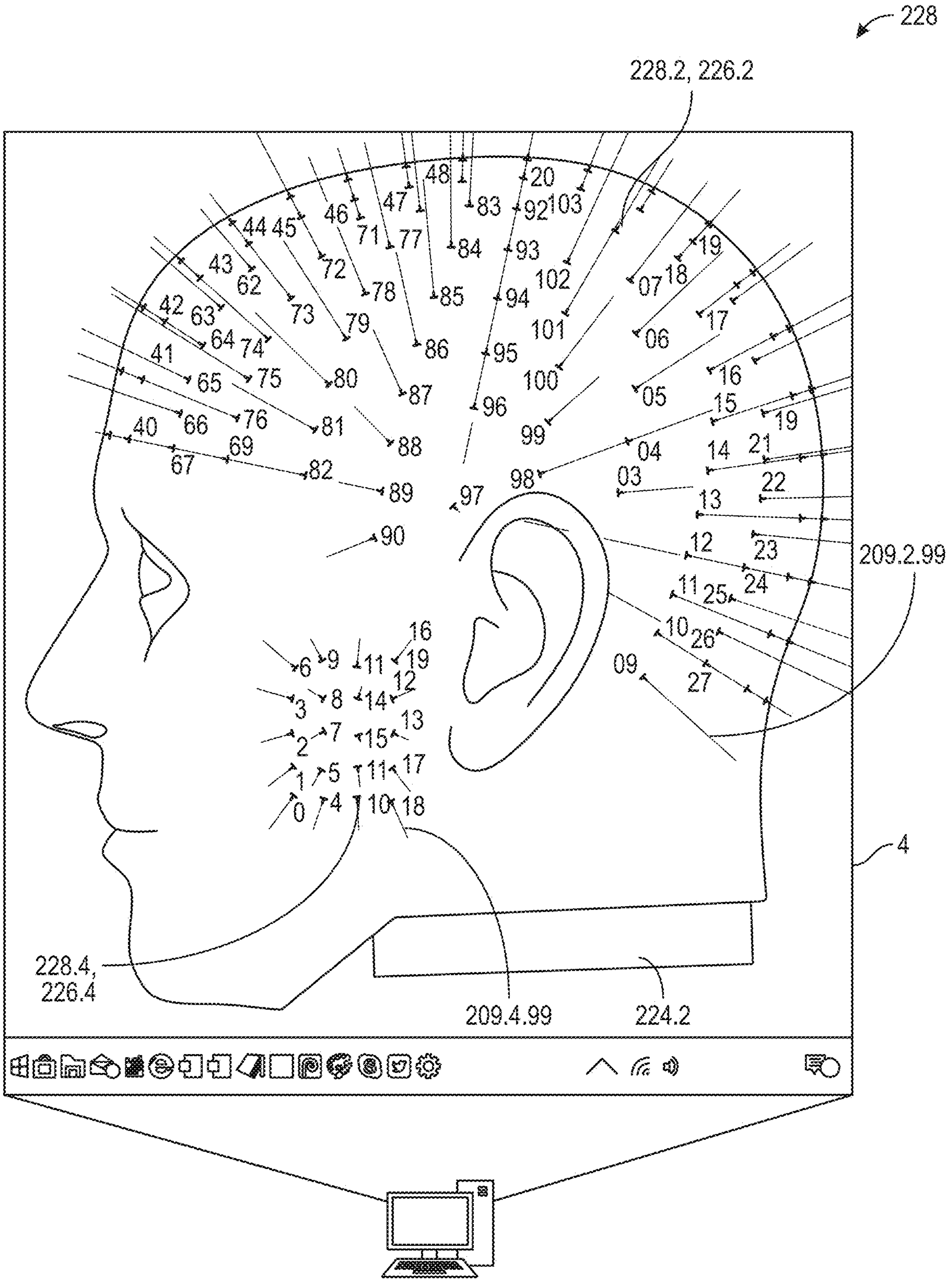
FIG. 18 show the electronic device displaying labels associated with the threshold intersection locations.

After the threshold surfaces are imported and aligned in step 224, the system 10 determines the threshold intersection locations or coordinates 226.2, 226.4 by finding the locations where each vector contained within the vector arrays 209.2.99, 209.4.99 intersects the threshold surface 224.2. Finding the threshold intersection locations 226.2, 226.4 may be achieved using 3D modeling tool with plugin utilized therein. A graphical display of these threshold intersection locations 226.2, 226.4, in connection with the blue threshold 224.2, is shown in FIG. 17. Because there are two vector arrays (e.g., crown 209.2.99 and jaw 209.4.99), there are two different sets of threshold intersection locations 226.2, 226.4. Once these threshold intersection locations 226.2 and 226.4 are determined in step 226, each intersection location 226.2, 226.4 is given a unique point identification value or number in step 228. The unique point identification value or number will enable data collected within this step and other steps to be compared to one another. A graphical display of these labels 228.2, in connection with the blue threshold 224.2, is shown in FIG. 18. While FIGS. 17-18 only show determine the intersection locations and labeling said locations in connection with the blue threshold 224.2, it should be understood that the same steps are carried out in connection with the green threshold 224.4 or any other thresholds that are contained within the computerized helmet template 200.99.

Once the threshold intersection locations 226.2, 226.4 are determined and labeled 228.2, this information is exported and associated with the locations of the helmet template reference point(s) 207.2.99, 207.4.99. The associated between these locations 226.2, 226.4, 207.2.99, 207.4.99 enables the system 10 to determine the distance between these points. In particular, the system 10 uses the Pythagorean Theorem of the square root of $a^2+b^2+c^2$ to determine these threshold line lengths 232.2, 232.4 in step 232. FIG. 19 shows a graphical display of a file that contains: (i) the helmet template reference points 207.2.99, 207.4.99, (ii) the threshold intersection locations 226.2, 226.4, and (iii) the determined threshold line lengths 232, which extend between the helmet template reference point(s) 207.2.99, 207.4.99 and the threshold intersection locations 226.2, 226.4.

Figure 20:
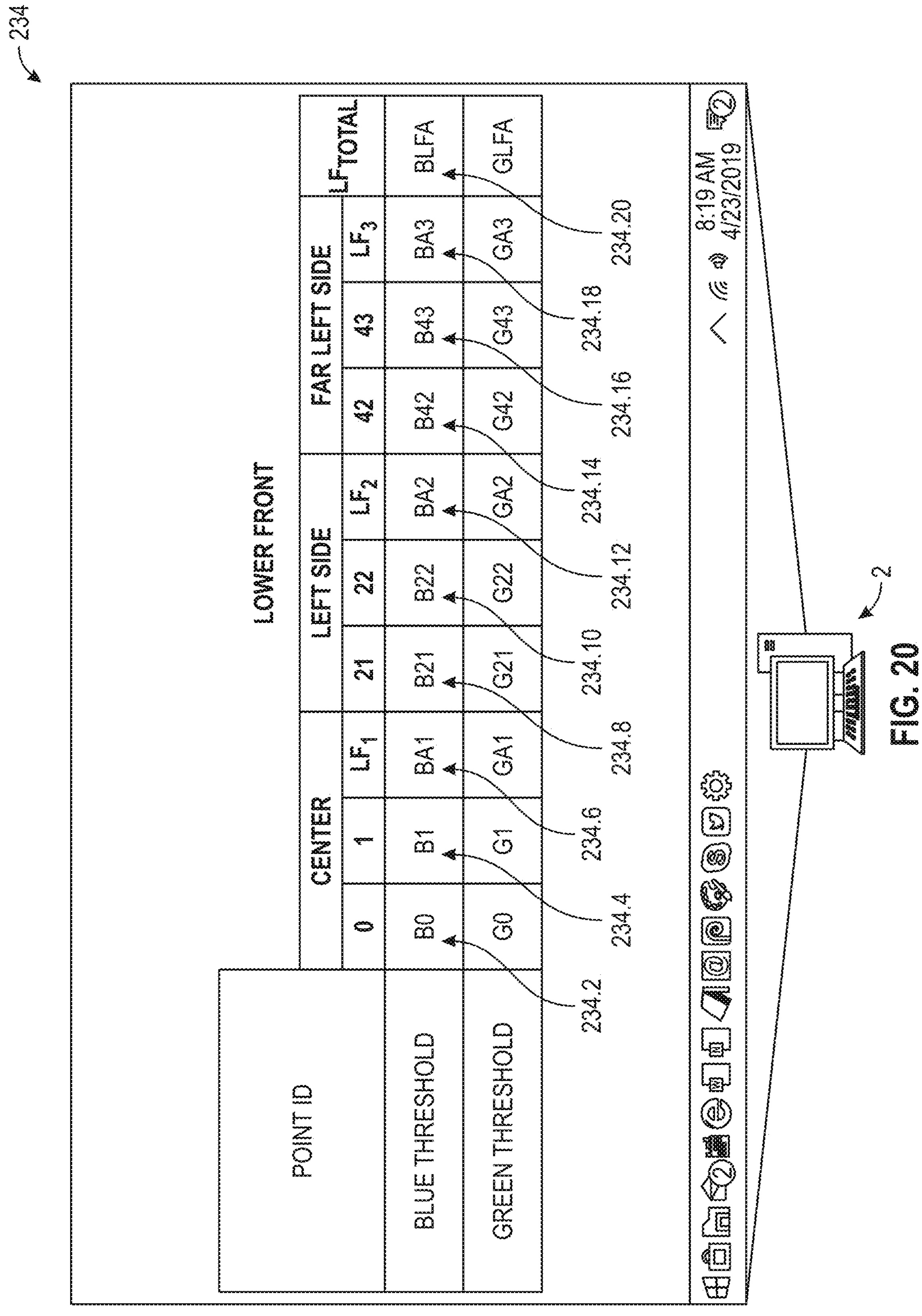
FIG. 20 shows the electronic device displaying a file illustrating how the average threshold line lengths for the lower front extent of the threshold surfaces are calculated.

Once all threshold line lengths 232.2, 232.4 are determined, then averages of these threshold line lengths 232.2, 232.4 are calculated for various regions of the threshold surface in step 234. For example is shown in FIG. 20, where location B0 234.2 associated with point identification 0 is averaged with B1 234.2 associated with point identification 1 to determined BA1 234.6, location B21 234.8 associated with point identification 21 is averaged with B22 234.10 associated with point identification 22 to determined BA2 234.12, and location B42 234.14 associated with point identification 42 is averaged with B43 234.16 associated with point identification 43 to determined BA3 234.18. BA1 234.6, BA2 234.12, and BA3 234.18 are then averaged to determine BLFA 234.20. Said averages may be omitted, but utilization of these averages simplifies calculations and analysis. It should also be understood that while every intersection between the arrays and these threshold surfaces 224.2, 224.4 can be calculated, doing so is not necessary because this data cannot be compared against the energy attenuation line length 272.2, 272.4 due to the fact that the energy attenuation line length 272.2, 272.4 cannot be calculated for all points due to the configuration of the energy attenuation components. A similar process is repeated for the green threshold 224.4 and for all other regions that are shown in FIG. 19. It should be understood that in other embodiments, that the averages may not be calculated; instead, all points may be compared to one another, each average (e.g., 234.6, 234.12, and 234.18) may include additional points, or other changes that are obvious based on this disclosure.

Figure 21:
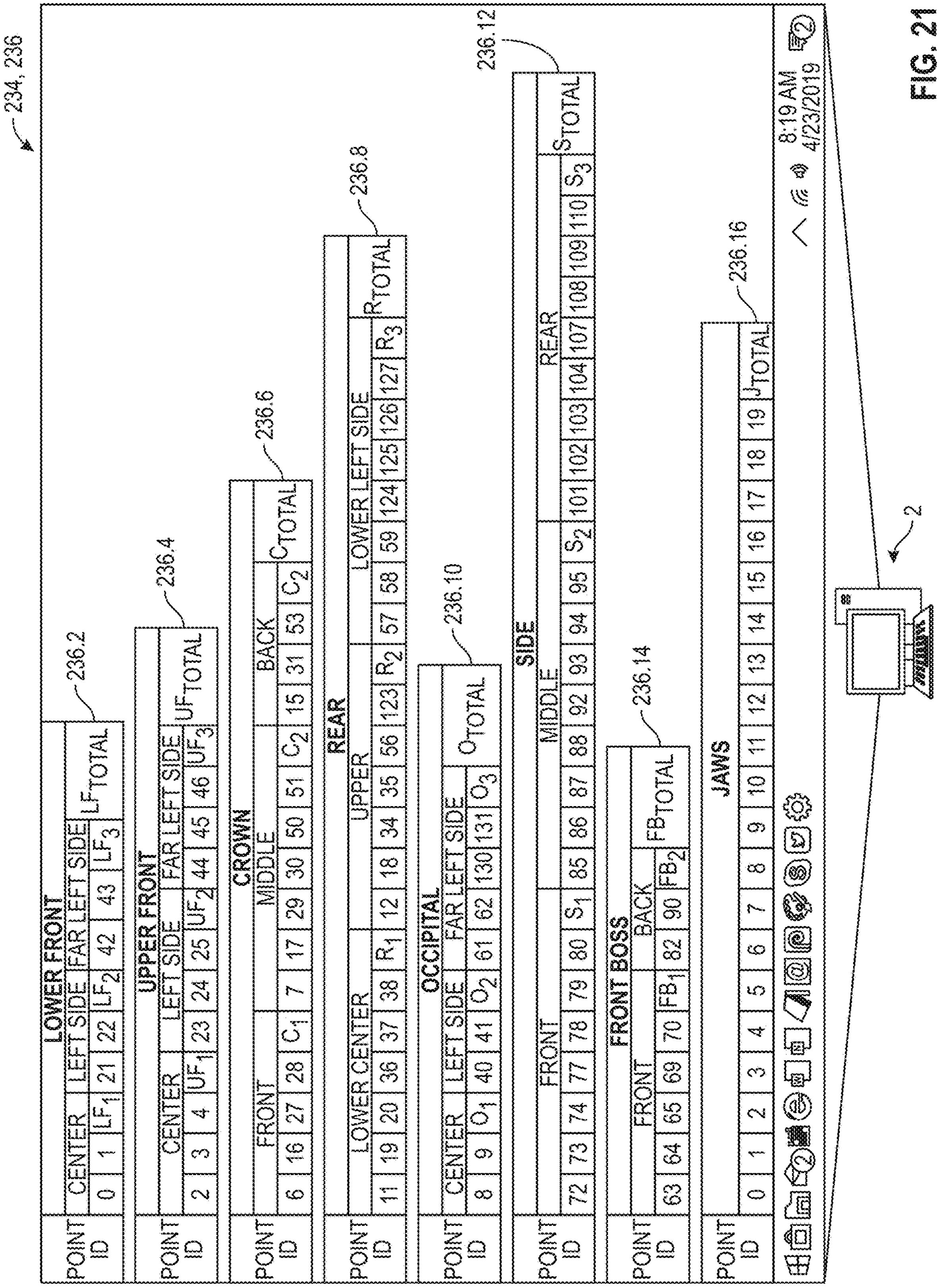
FIG. 21 shows the electronic device displaying a file illustrating how the average threshold line lengths are calculated for various regions of the threshold surface.

In summary, step 220 will output eight average threshold line lengths 232 for each threshold (see FIG. 21). The eight average threshold line lengths 232.2, 232.4 include: (i) lower front average threshold line length 236.2, (ii) upper front average threshold line length 236.4, (iii) crown average threshold line length 236.6, (iv) rear average threshold line length 236.8, (v) occipital average threshold line length 236.10, (vi) side average threshold line length 236.12, (vii) front boss average threshold line length 236.14, and (viii) jaw average threshold line length 236.16. In the embodiment shown in the Figures, there are two thresholds 224.2, 22.4 and thus the computerized helmet template 200.99 will include 16 average threshold lines 236.2-236.18. It should be understood that in other embodiments, there may be more than eight averages (e.g., 40), there may be less than eight averages (e.g., 2), more or less points may be considered within each of the averages, or other changes that are obvious based on this disclosure.

3. MCS Line Lengths

Figure 22:
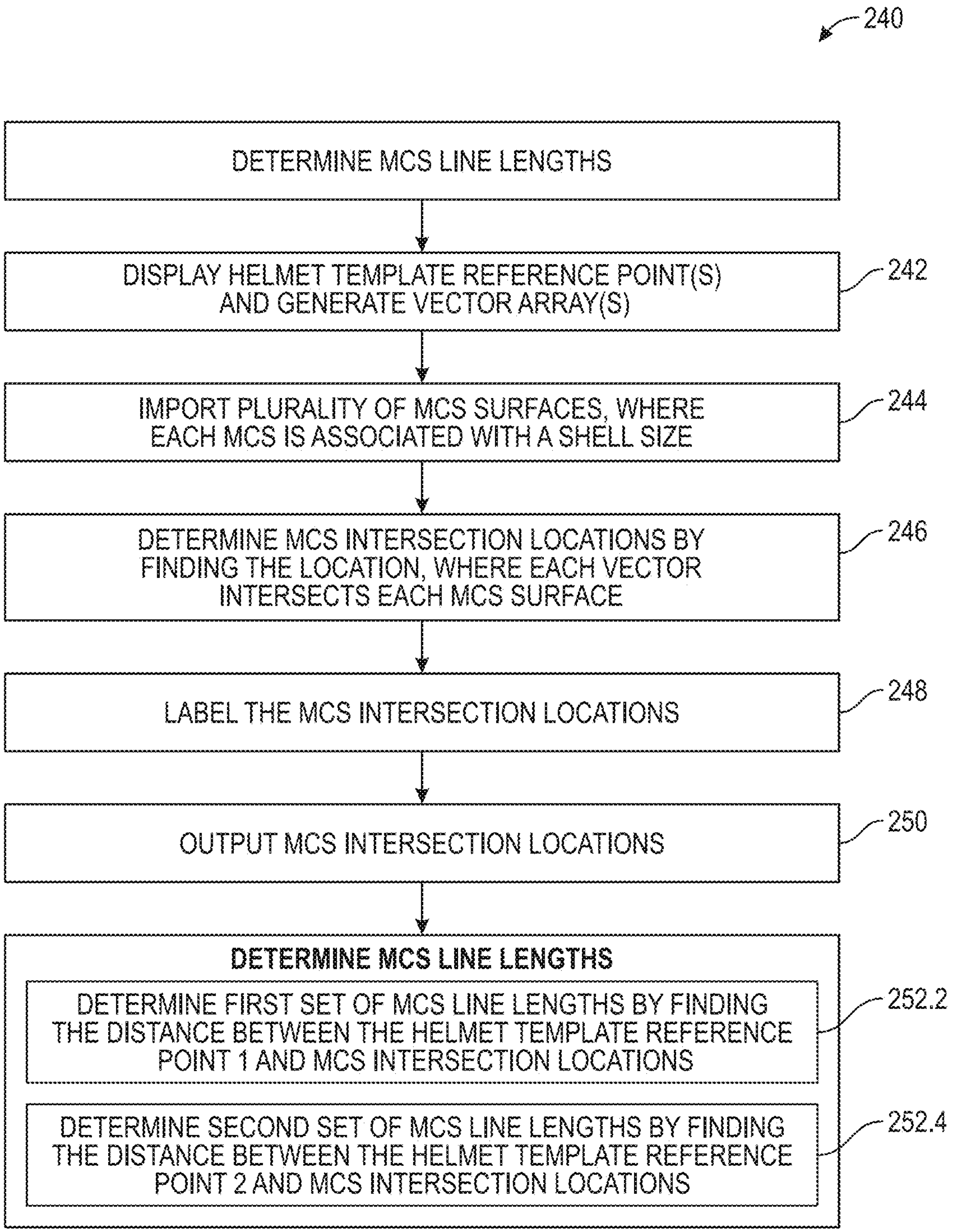
FIG. 22 is a flow chart of the data collection, processing and fitment system, showing a method for generating an optional third portion of the computerized helmet template, which includes determining minimum certified surface ("MCS") line lengths.

FIG. 22 shows the steps for determining the optional MCS. To calculate these values, the same steps as described above in finding the threshold line lengths in step 232 are performed in for each of the MCSs. In particular, the helmet template reference point(s) and generated vectors are displayed in step 242, the MCSs are imported in step 244, the MCS intersection locations are found in step 246, the MCS intersection locations are labeled in step 248, the labeled MCS intersection locations are outputted to an excel file in step 250, and the MCS intersection locations are compared with the helmet template reference point(s) to determine the MCS line lengths in step 252. In summary, step 252 will output two sets of predetermined values a first set has between 150 and 300 values, and a second set has between 5 and 75 values) that can later be compared against the head data to determine the proper shell size for the player. It should be understood that various regions may be averaged to simplify these comparisons, as described above, or the raw data may be compared to ensure that no extent of the player would be positioned beyond or outside of the MCS.

4. Energy Attenuation Line Lengths

Figure 23:
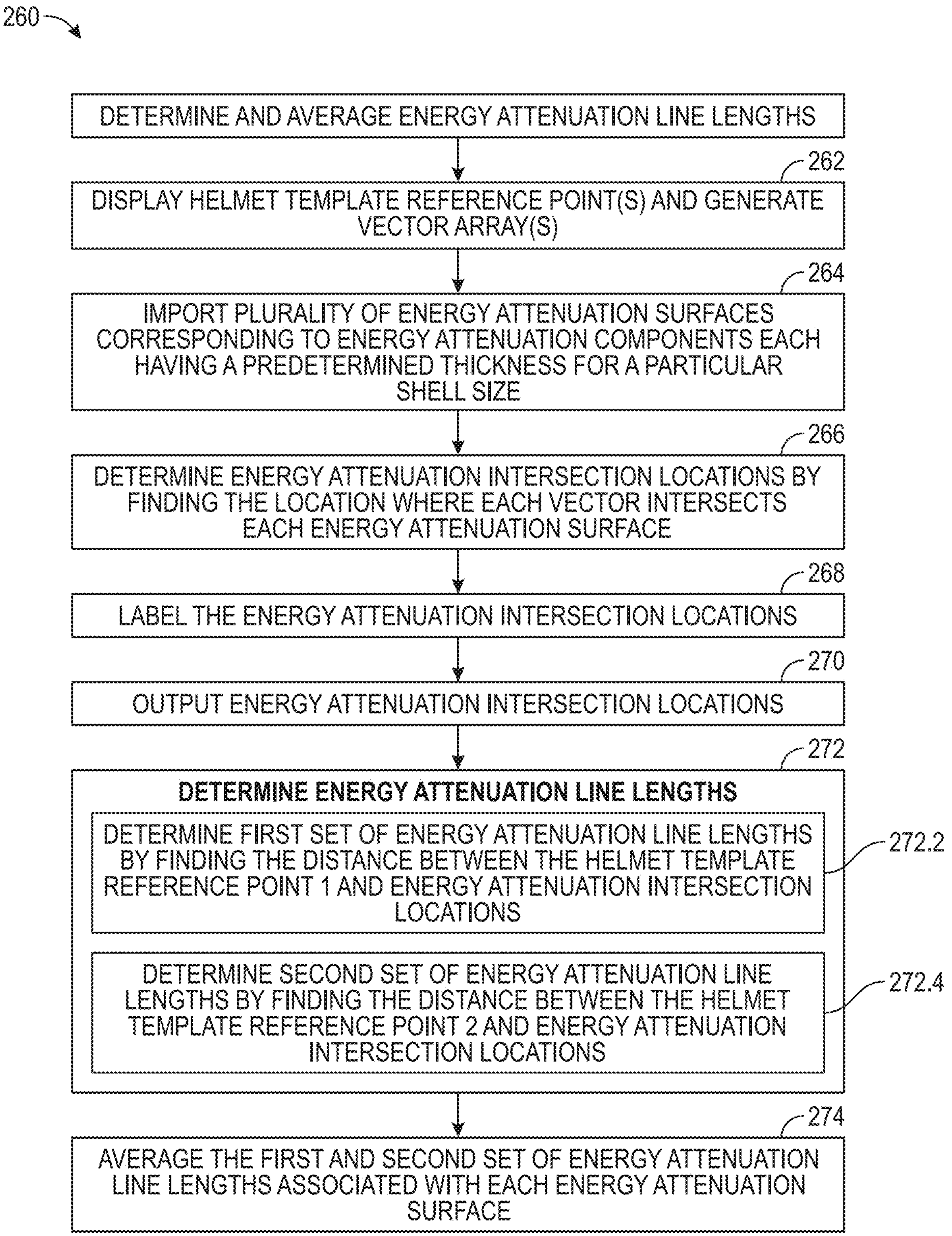
FIG. 23 is a flow chart of the data collection, processing and fitment system, showing the method for generating a fourth portion of the computerized helmet template, which includes determining energy attenuation line lengths.
Figure 24:
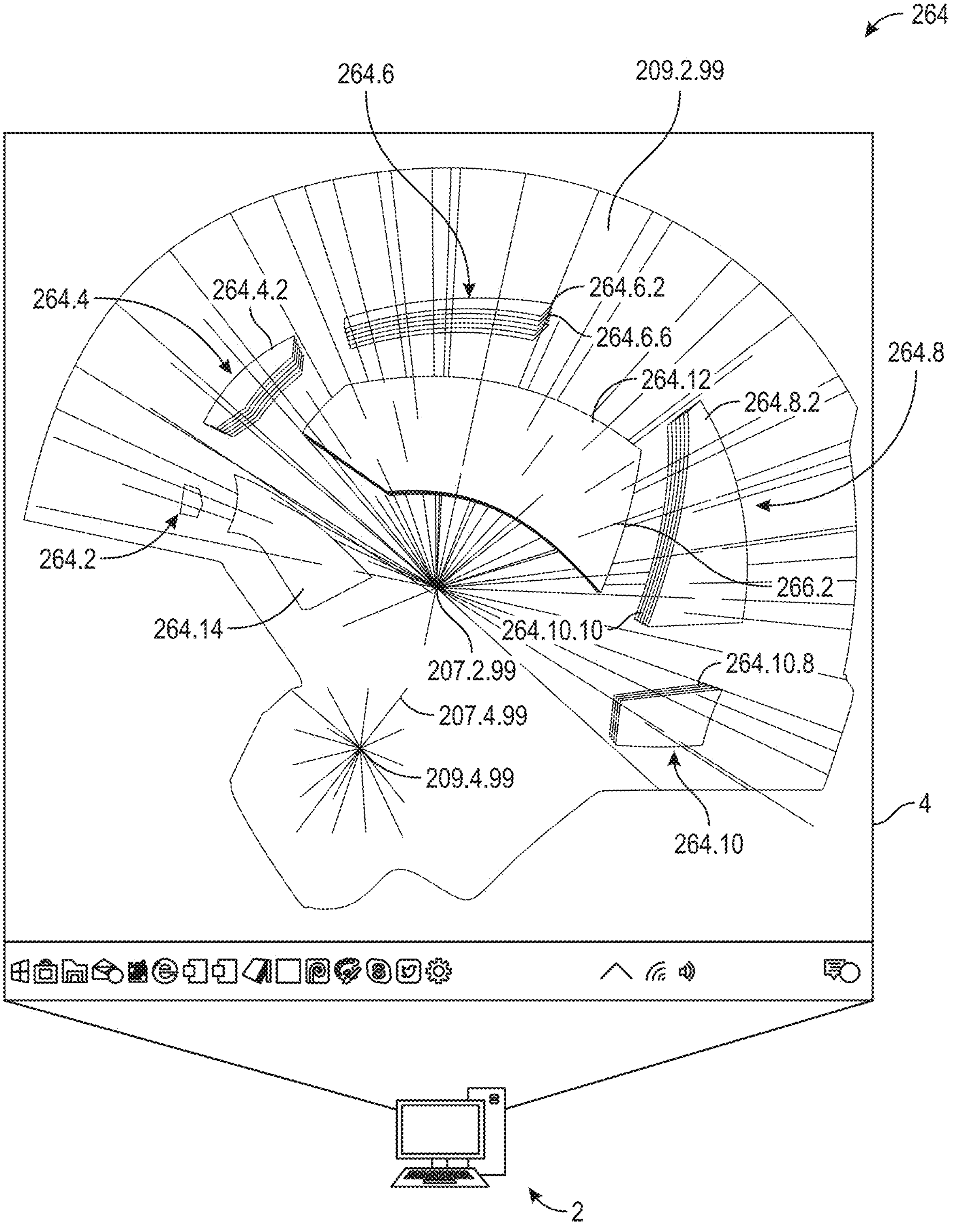
FIGS. 24-27 show the electronic device displaying a plurality of energy attenuation surfaces within the computerized helmet template.
Figure 25:
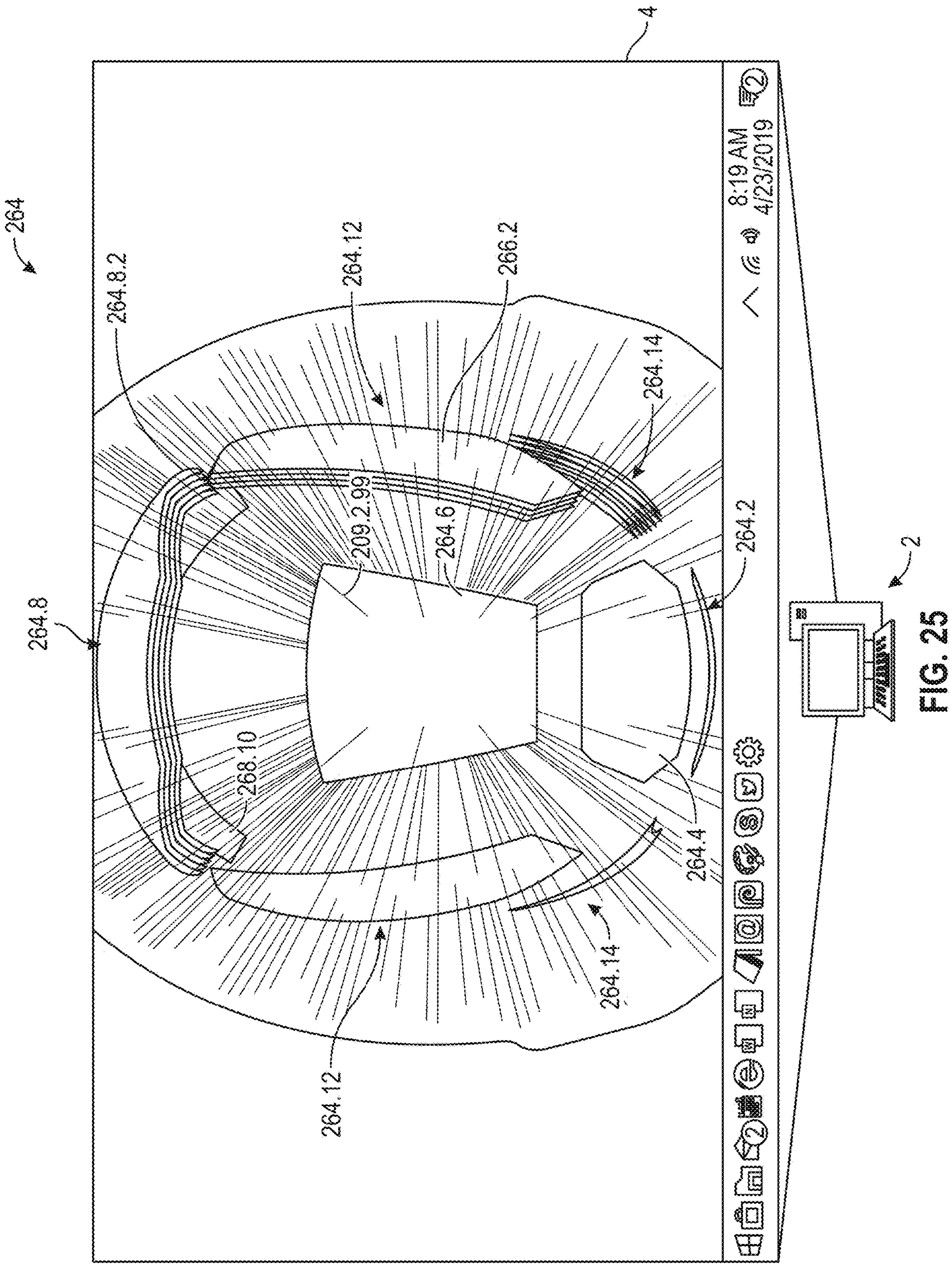
Figure 26:
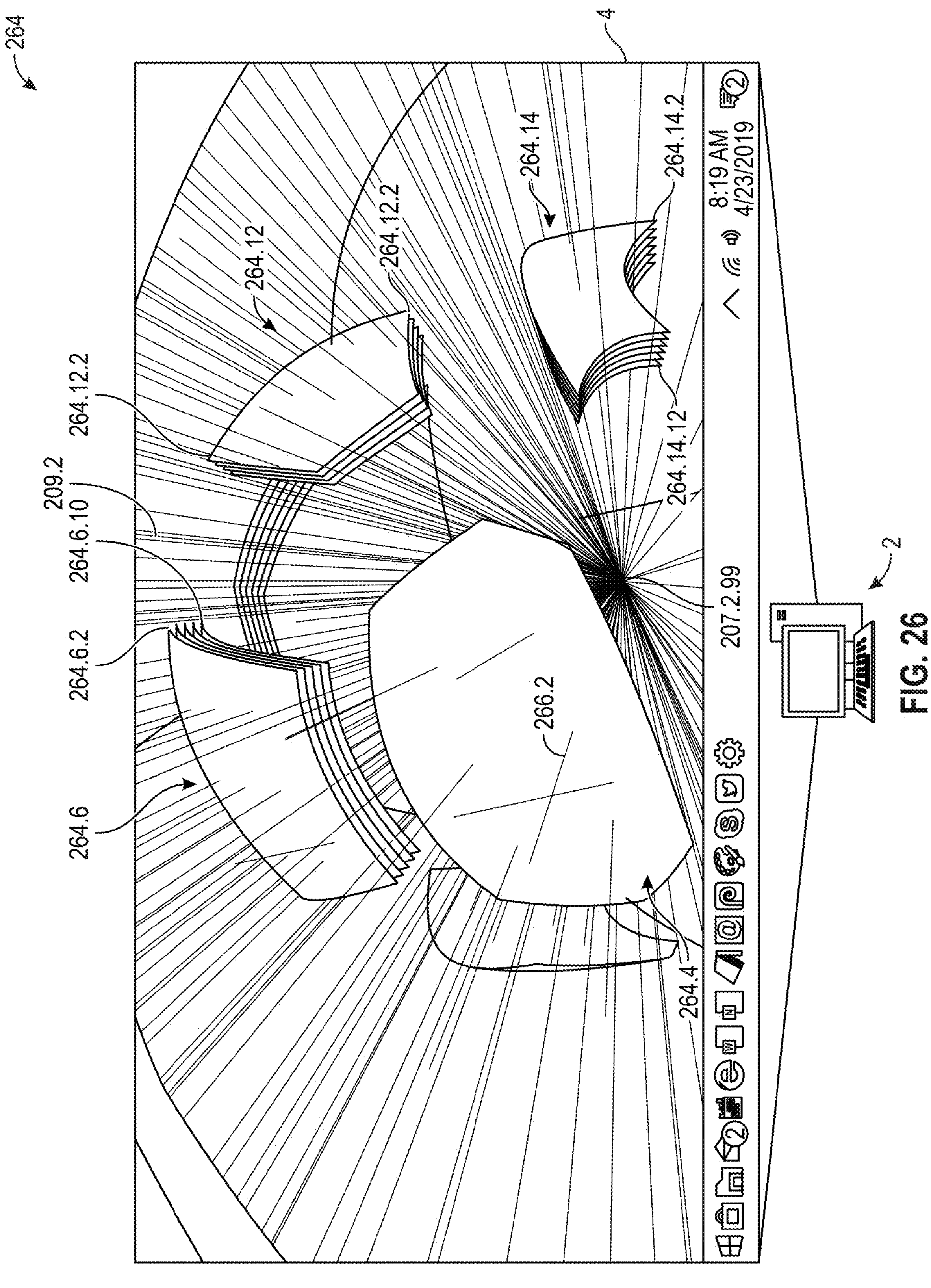
Figure 27:
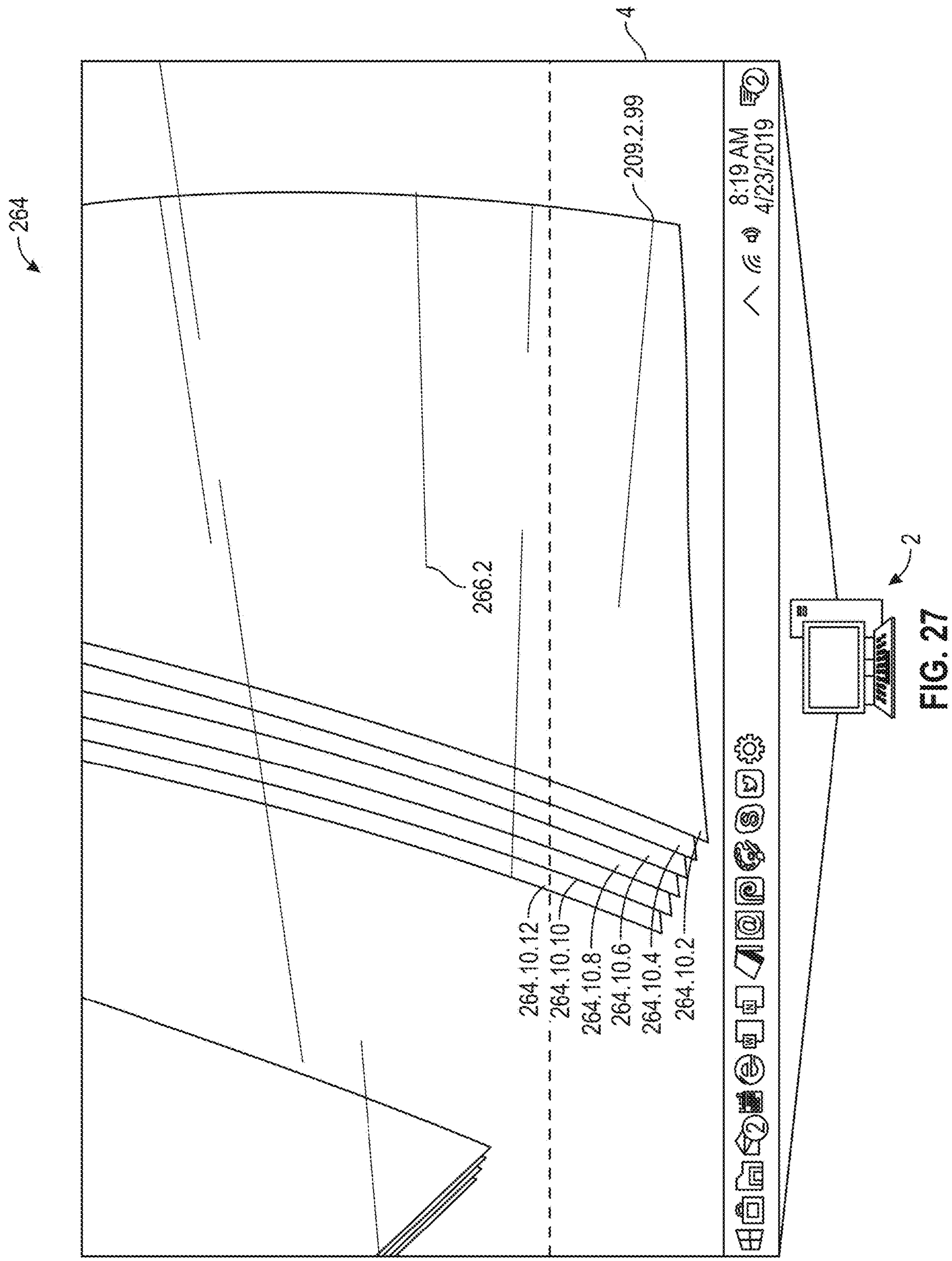

FIG. 23 is a flow chart describing step 260 of the data collection, processing and fitment system 10, showing a method for generating a fourth portion of the computerized helmet template 200.99, which includes determining energy attenuation line lengths. In step 262, the helmet template reference point(s) and generated vector array(s) generated in steps 207 and 209 are displayed (See FIG. 24). After step 262 is completed, the system 10 imports and aligns (e.g., expectation-maximization, iterative closest point analysis, iterative closest point variant, Procrustes alignment, manifold alignment, or (vii) other known alignment techniques) a plurality of energy attenuation surfaces in step 264. A graphical display of these energy attenuation surfaces are shown in FIGS. 24-27.

Each imported energy attenuation surface corresponds to one configuration of an energy attenuation component of the variable layer 2000. For example, the left side component **2600*a* of the variable layer 2000 has at least four configurations 2600*a*.2-2600*a*.10, and preferably seven configurations, wherein each configuration has a corresponding digital inner surface 264.12.2-264.12.8. Similarly, the lower front 2100 of the variable layer 2000 has one configurations 2100.2 with corresponding digital inner surfaces 264.2.2, the upper front 2200 of the variable layer 2000 has six configurations 2200.2-2200.12 with corresponding digital inner surfaces 264.4.2-264.4.12, the crown component 2300 of the variable layer 2000 has five configurations 2300.2-2300.10 with corresponding digital inner surfaces 264.6.2-264.6.10, the rear component 2400 of the variable layer 2000 has six configurations 2400.2-2400.12 with corresponding digital inner surfaces 264.8.2-264.8.12, the occipital component 2500 of the variable layer 2000 has four configurations 2500.2-2500.8 with corresponding digital inner surfaces 264.10.2-264.10.8, and the frontal boss variable component 2700*a*-2700*b* of the variable layer 2000 has six configurations 2700*a*.2-2700*a*.12 with corresponding digital inner surfaces 264.14.2-264.14.12. The volume, inner surface, C/D, and other components specifications may be derived from historical knowledge, the methods disclosed within U.S. patent application Ser. No. 16/543,371, or a combination thereof. It should be understood that each of the following components, namely-lower front 2100, upper front 2200, crown 2300, rear 2400, occipital 2500, sides 2600*a*-2600*b*, front boss 2700*a*-2700*b*, and jaw 2800*a*-2800*b*—may include more than four configurations (e.g., 5,000**) or fewer configurations (e.g., 1) and as such the corresponding digital inner surfaces may range from 5,000 or more to 1 for each component.

After the energy attenuation surfaces 264.2-264.14 are imported in step 264, the system 10 determines the energy attenuation intersection locations or coordinates 266.2 by finding the locations where each vector contained within the vector arrays 209.2.99, 209.4.99 intersects each energy attenuation surface 264.2-264.14. Finding the energy attenuation intersection locations 266.2 may be achieved using 3D modeling tool with plugin utilized therein. A graphical display of these energy attenuation intersection locations 266.2 is shown in FIGS. 28 and 31-36. Because there are two vector arrays (e.g., crown 209.2.99 and jaw 209.4.99), there are two different sets of energy attenuation intersection locations 266.2, 266.4.

Once these energy attenuation intersection locations 266.2, 266.4 are determined in step 266, each energy attenuation intersection location 266.2, 266.4 is given a unique point identification value or number in step 268. The unique point identification value or number will enable data that is collected within this step and other steps to be compared to one another. FIGS. 28 and 31-36 show a graphical display of these unique point identification value or number 268.2 on the energy attenuation surfaces 264.2-264.14. While FIGS. 28 and 31-36 only show determine the intersection locations and labeling said locations in connection with a set of energy attenuation surfaces 264.2-264.14 associated with one shell size, it should be understood that the same steps are carried out in connection with energy attenuation surfaces associated with other shell sizes. It should be understood that energy attenuation surfaces are typically unique to each shell size; however, in some embodiments energy attenuation surfaces may be common between shell sizes. For example, a first energy attenuation surface in a small size may be a sixth energy attenuation surface in a medium size. Sharing energy attenuation surfaces between shell sizes is beneficial because it reduces the number of unique energy attenuation components that must be manufactured and stocked. However, even if energy attenuation surfaces are common between shell sizes, it should be understood that energy attenuation surfaces are uniquely configured for a specific location within the shell and are not interchangeable with other energy attenuation surfaces within the same helmet shell.

Once the energy attenuation intersection locations 266.2, 266.4 are determined and labeled 268.2, this information is exported and associated with the locations of the helmet template reference point(s) 207.2.99, 207.4.99. The associated between these locations 266.2, 266.4, 207.2.99, 207.4.99 enables the system 10 to determine the distance between these points. In particular, the system 10 uses the Pythagorean Theorem of the square root of $a^2+b^2+c^2$ to determine these energy attenuation line lengths 272.2, 272.4 in step 272. FIG. 29 shows a graphical display of a file that contains: (i) the helmet template reference points 207.2.99, 207.4.99, (ii) the energy attenuation intersection locations 266.2, 266.4, and (iii) the determined energy attenuation line lengths 272, which extend between the helmet template reference point(s) 207.2.99, 207.4.99 and the energy attenuation intersection locations 266.2, 266.4.

Figure 28:
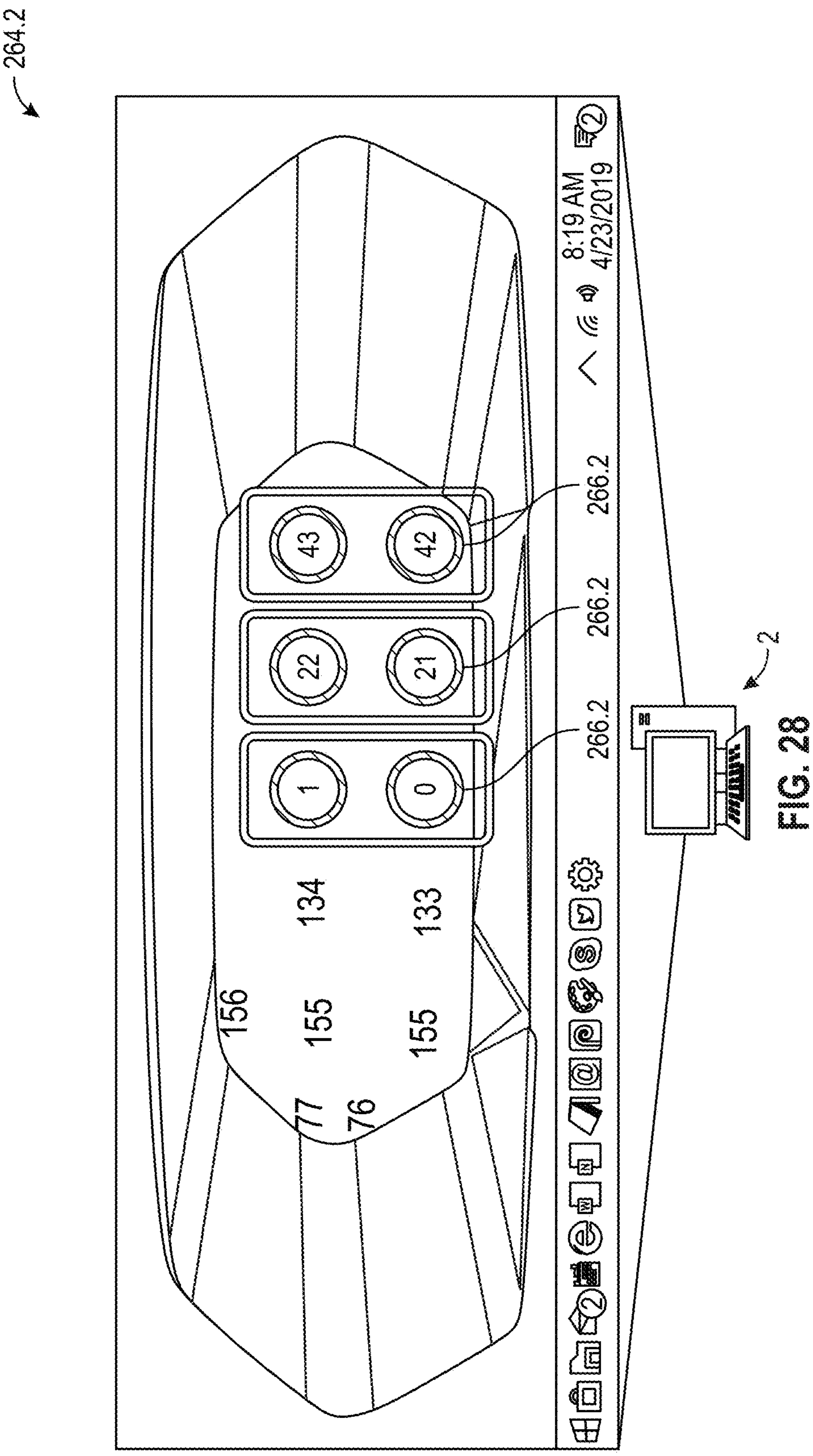
FIG. 28 show the electronic device displaying one of the energy attenuation surface and labeled energy attenuation intersection locations, which occur where the helmet template vector arrays intersect said energy attenuation surface.

When the energy attenuation component is symmetric about an axis, then the designer only needs to analyze half of the energy attenuation line lengths 272.2, 272.4. Examples of the energy attenuation line lengths 272.2, 272.4 that are to be averaged together as shown in boxes in said Figures. This helps ensure that energy attenuation line lengths 272.2, 272.4 that are calculated from energy attenuation intersection locations 266.2, 266.4 are adjacent to one another and are not opposite sides of the member. To note, unlike the comparison of the two surfaces, only a select number of energy attenuation intersection locations 266.2, 266.4 are identified due to the finite size of the energy attenuation surface 264.2-264.14. For example, one surfaces 264.2 associated with the lower front and is shown in FIG. 28, only includes between two and twenty intersection points (e.g., points 0, 1, 21, 22, 42, 43). Thus, as shown in FIG. 29, energy attenuation line lengths 272.2, 272.4 will only be calculated for these points.

Figure 30:
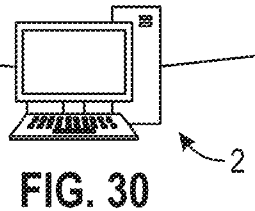
FIG. 30 shows the electronic device displaying a file that illustrates how the average energy attenuation line lengths for the lower front energy attenuation surfaces are calculated.
Figure 31:
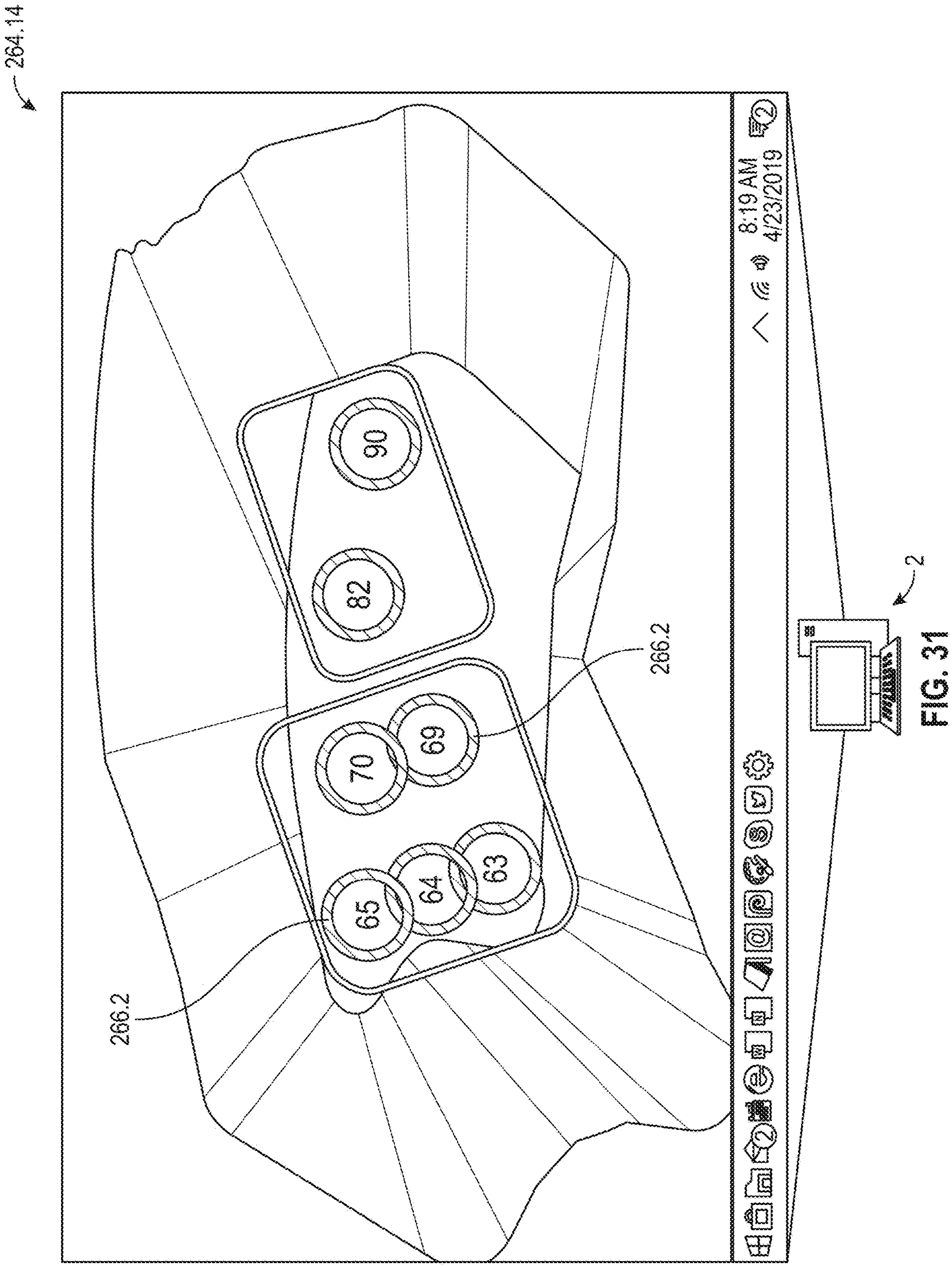
FIGS. 31-36 shows the electronic device displaying energy attenuation surfaces and labeled energy attenuation intersection locations, which occur where the helmet template vector arrays intersect said energy attenuation surface.
Figure 32:
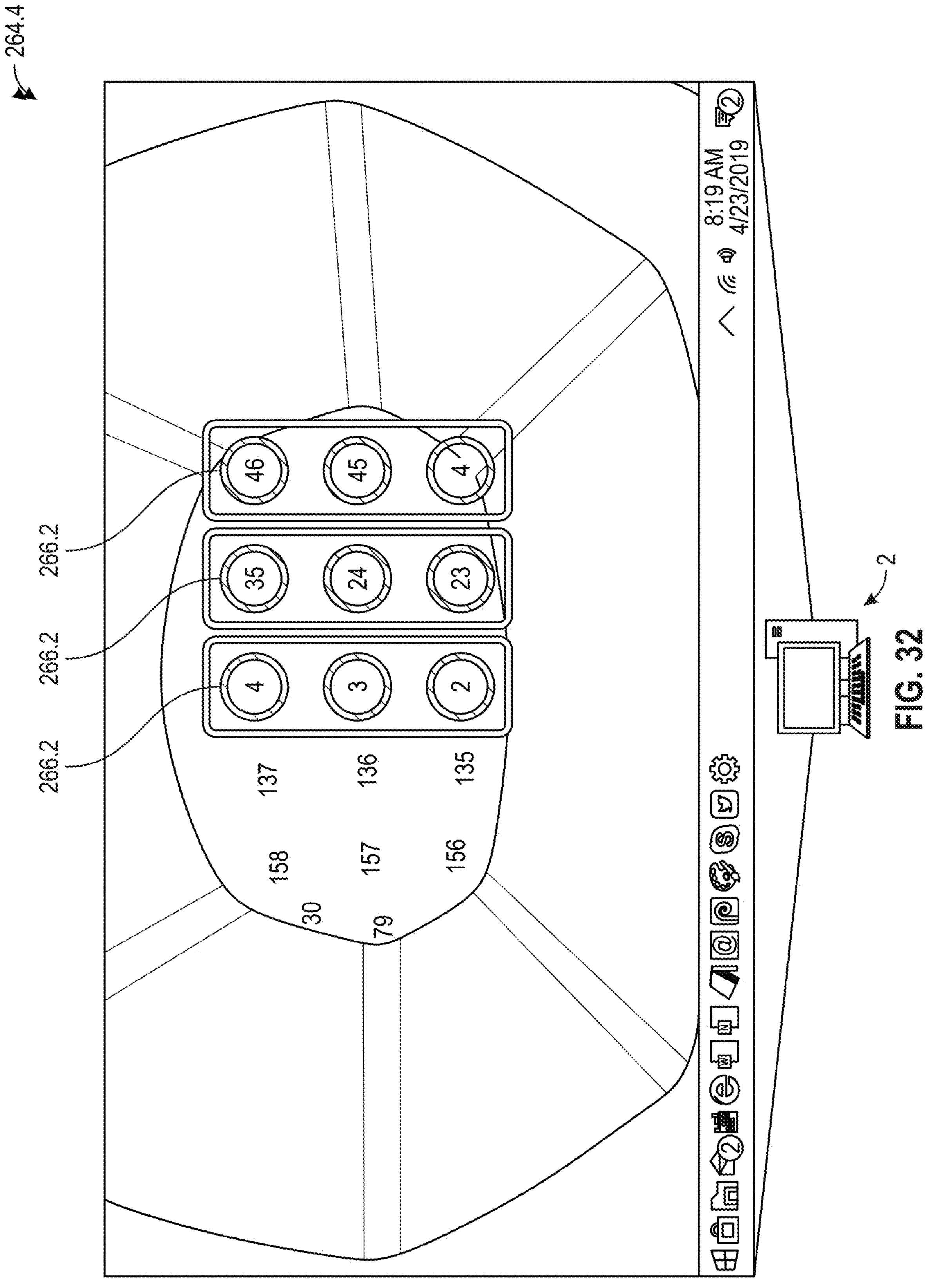
Figure 33:
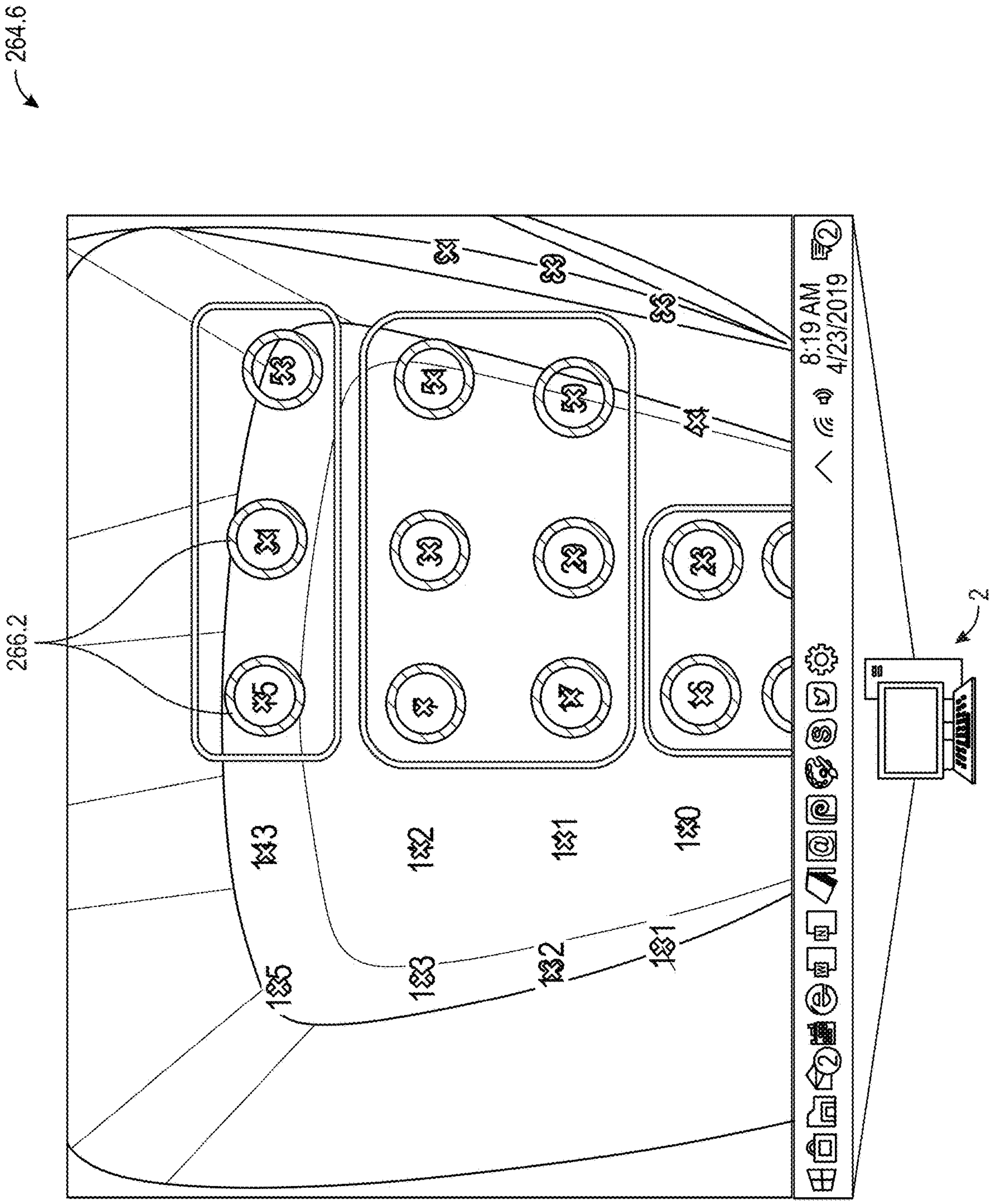
Figure 34:
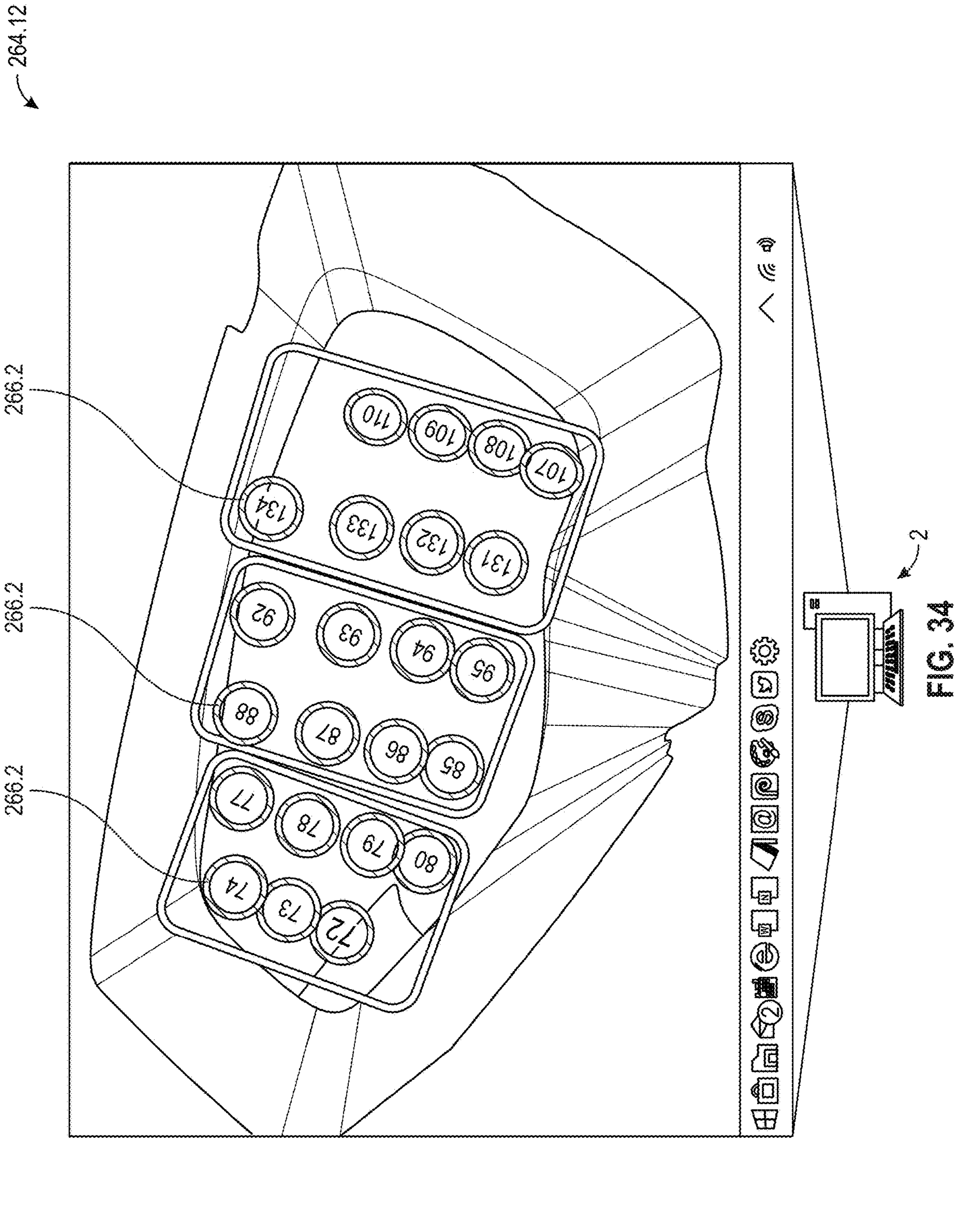
Figure 35:
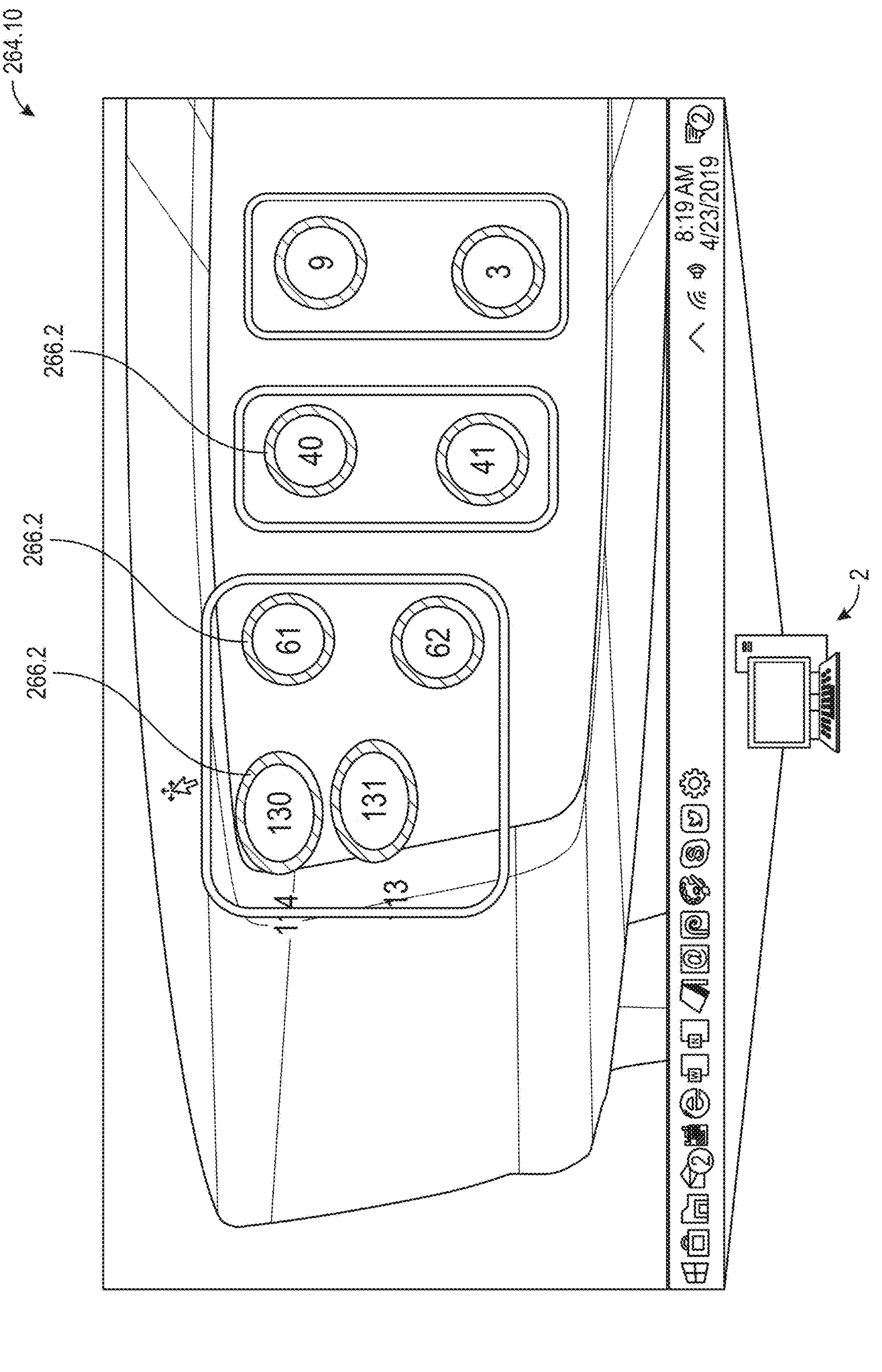
Figure 36:
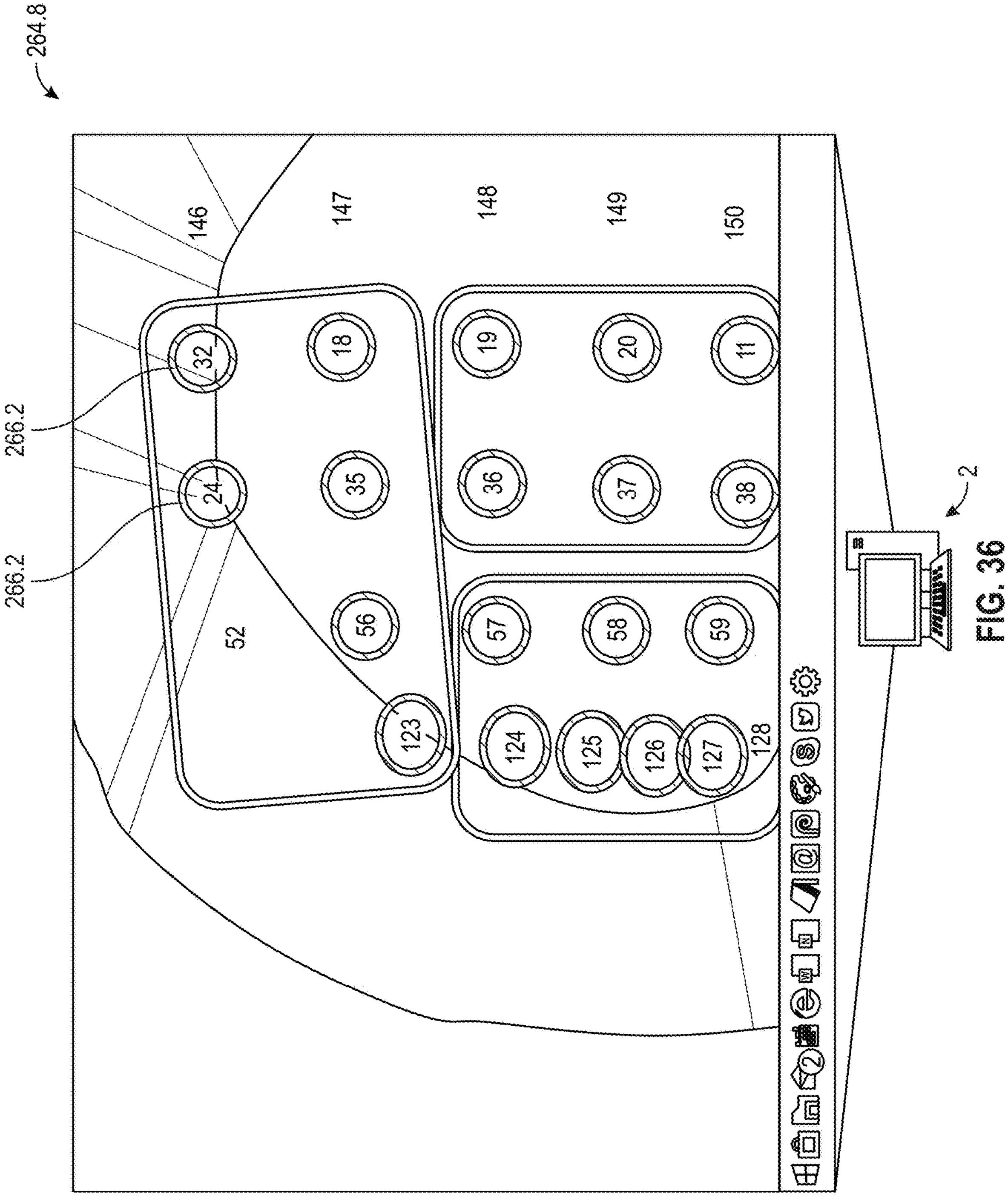
Figure 37:
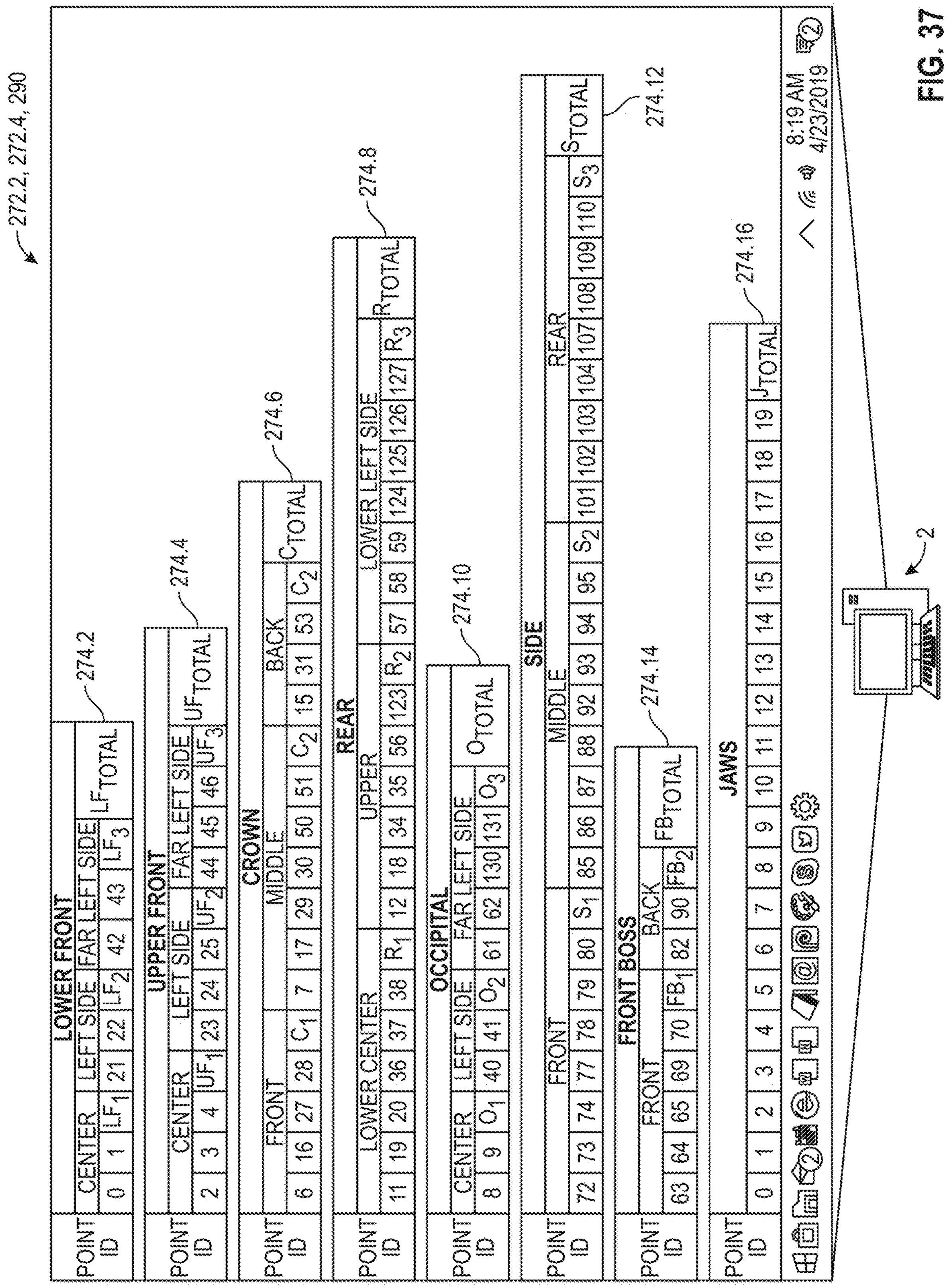
FIG. 37 shows the electronic device displaying a file that illustrates how the average energy attenuation line lengths are calculated for various energy attenuation surfaces.

Once all energy attenuation line lengths 272.2, 272.4 are determined, then averages of these energy attenuation line lengths 272.2, 272.4 are calculated for each energy attenuation surface in step 274. As shown in FIG. 30, location 00 associated with point identification 0 is averaged with 01 associated with point identification 1 to determined 0A1, location 021 associated with point identification 21 is averaged with 022 associated with point identification 22 to determined 0A2, and location 042 associated with point identification 42 is averaged with 043 associated with point identification 43 to determined 0A3. 0A1, 0A2, and 0A3 are then averaged to determine MLF0. A similar process is repeated for all other energy attenuation surfaces contained in the computerized helmet template 200.99 (See FIG. 37). It should be understood that in other embodiments, that the averages may not be calculated; instead, all points may be compared to one another.

As shown in FIG. 23, step 260 will output an average energy attenuation line length 290 (e.g., 274.2.2-274.2.16, 274.2-274.16) for each energy attenuation surface (See FIGS. 31-36). In the embodiment shown in the Figures, there are at least one and typically seven configurations of each energy attenuation component. In other words, the lower front energy attenuation component has seven configurations. These seven configurations include seven associated energy attenuation surfaces. These seven energy attenuation surfaces each have an average energy attenuation line length. Thus, the computerized helmet template 200.99 includes seven average energy attenuation line lengths for the lower front component for a specific helmet shell size. This same calculation is repeated for all the components contained within the variable layer 2000, which creates the 56 average energy attenuation line lengths associated with each shell and 168 average energy attenuation line lengths contained within all three shells (see FIG. 38). As discussed above, the table in FIG. 38 does not change based on each player; instead, the same table is used for all players. It should be understood that in other embodiments, there may be more than eight averages (e.g., 40) per variable layer configuration, there may be less than eight averages (e.g., 2) per variable layer configuration, more (e.g., 30) or less (e.g., 1) configurations of each variable layer, more (e.g., 10) or less (e.g., 1) shell sizes, or other changes that are obvious based on this disclosure.

G. IMPORT AND ALIGN HEAD MODEL WITH COMPUTERIZED HELMET TEMPLATE

Figure 39:
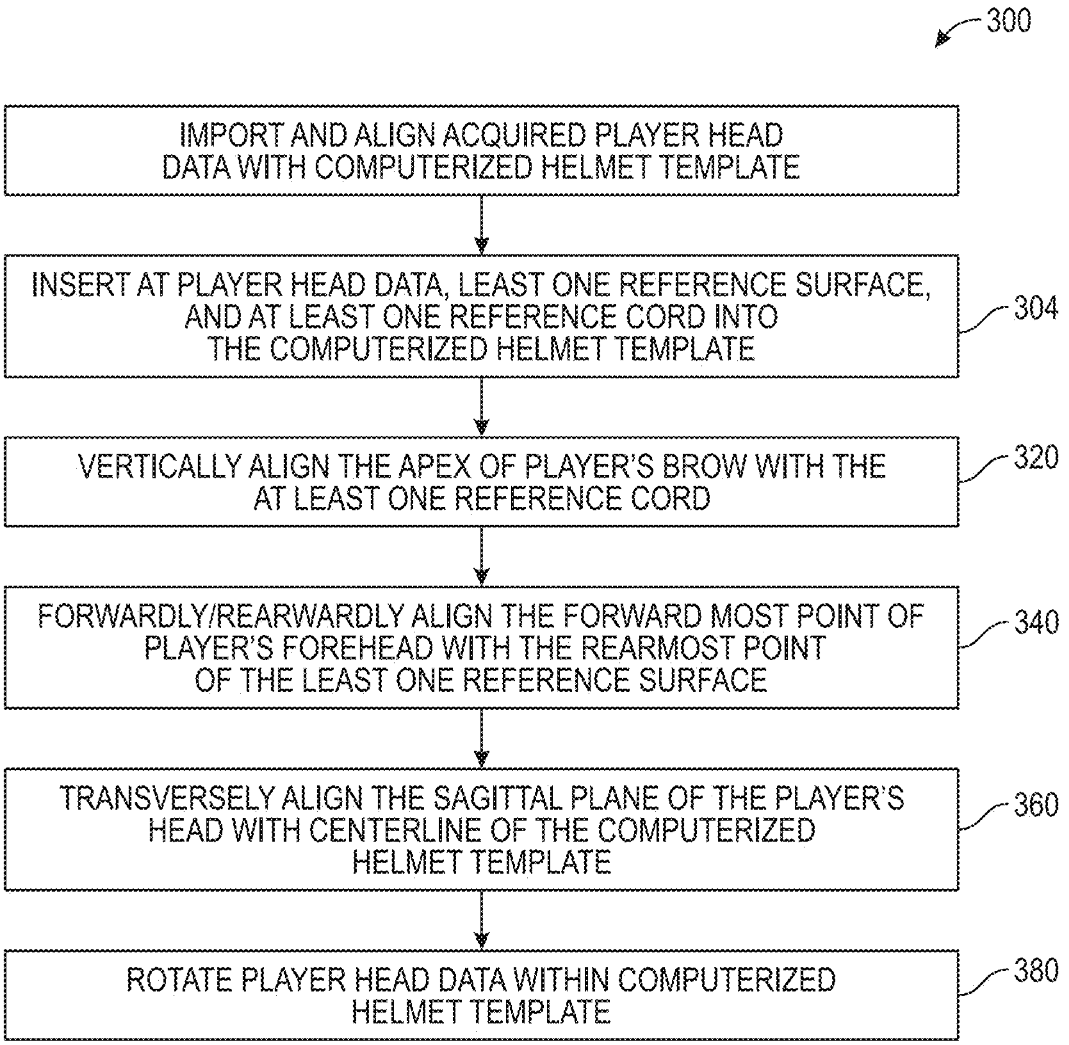
FIG. 39 is a flow chart of the system showing a method for aligning the specific player's head data within the computerized helmet template.
Figure 40:
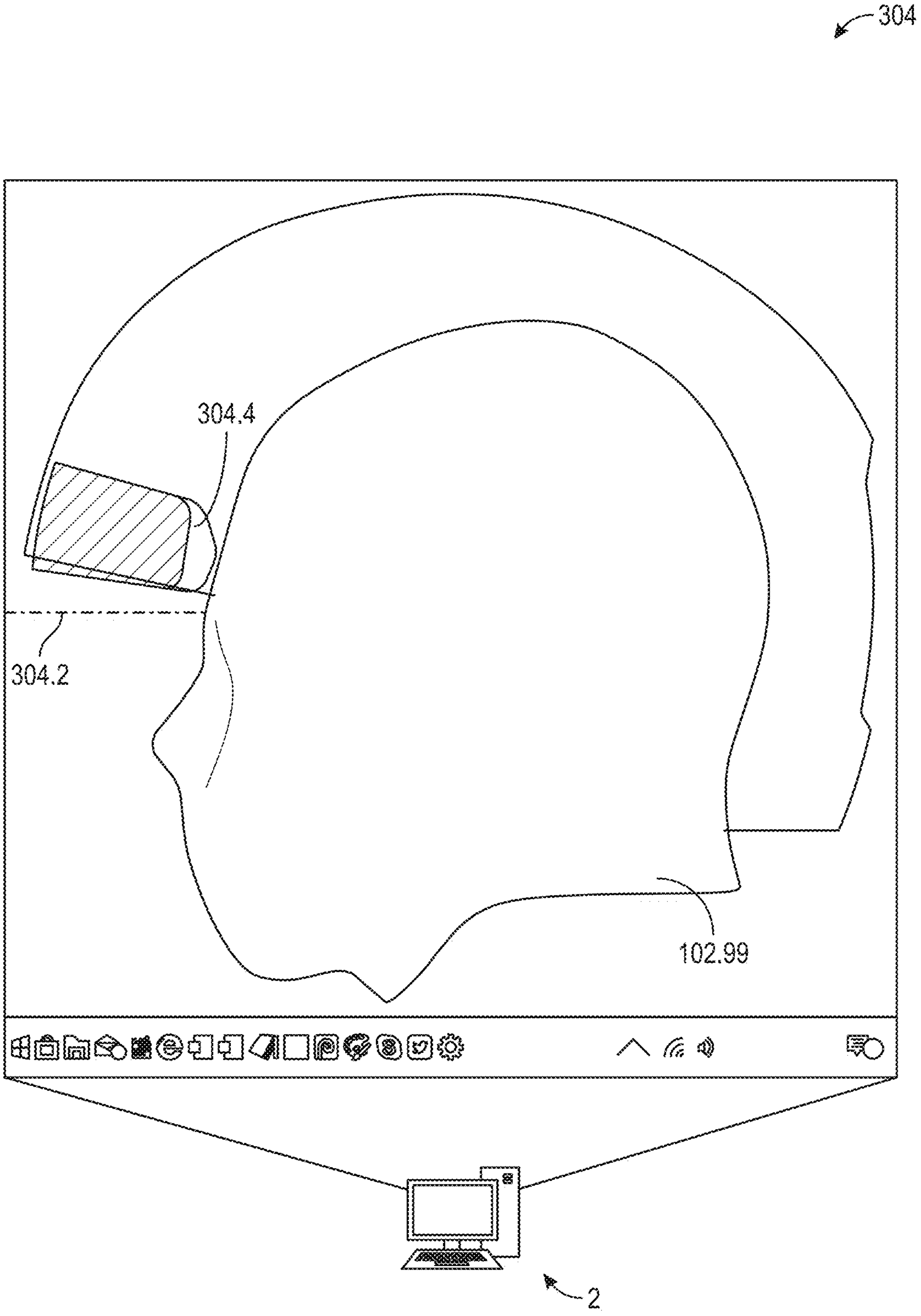
FIG. 40 shows the electronic device displaying a specific player's head data within the computerized helmet template.
Figure 41:
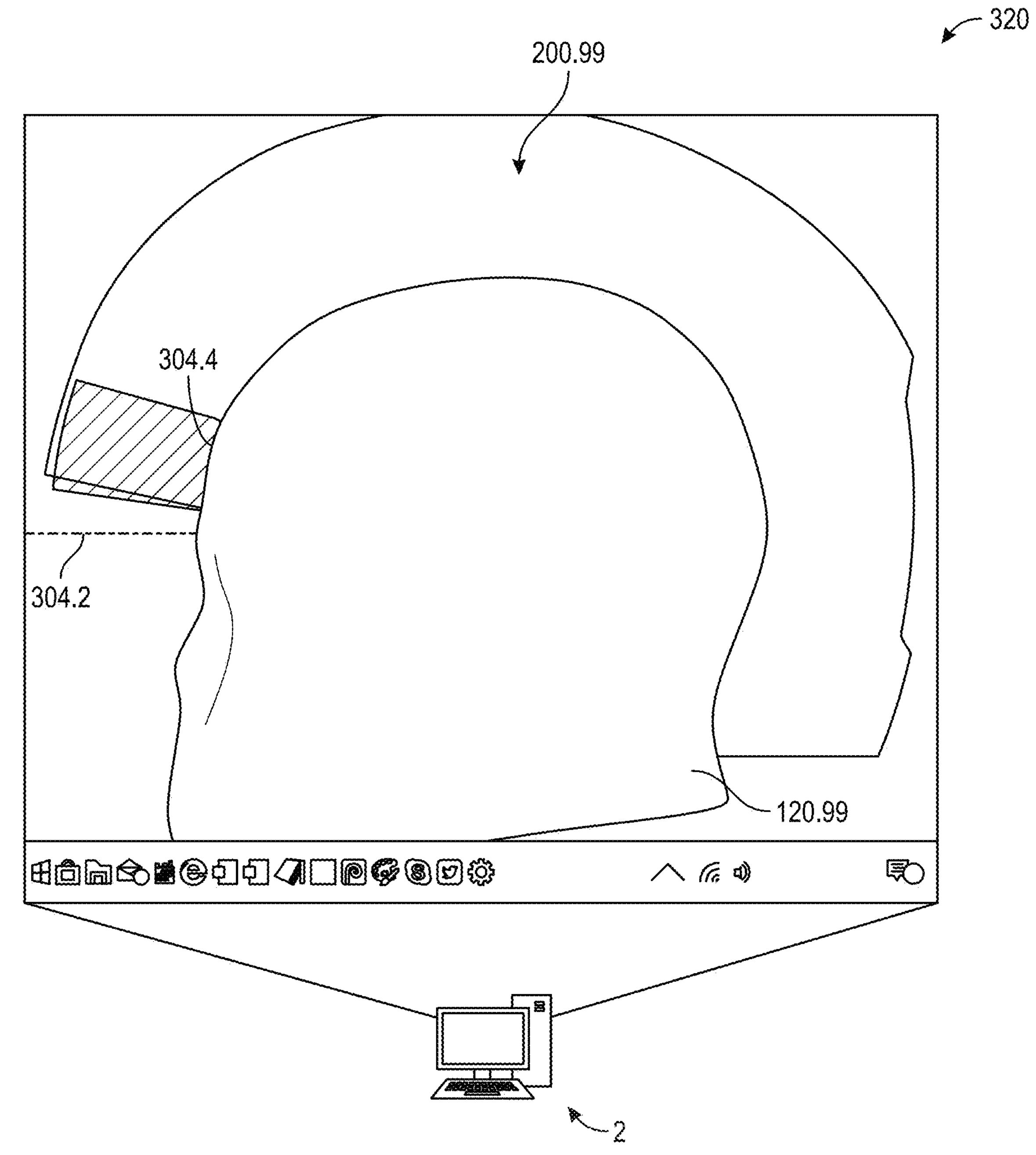
FIG. 41 shows the electronic device displaying the alignment of the specific player's head data within the computerized helmet template.
Figure 43:
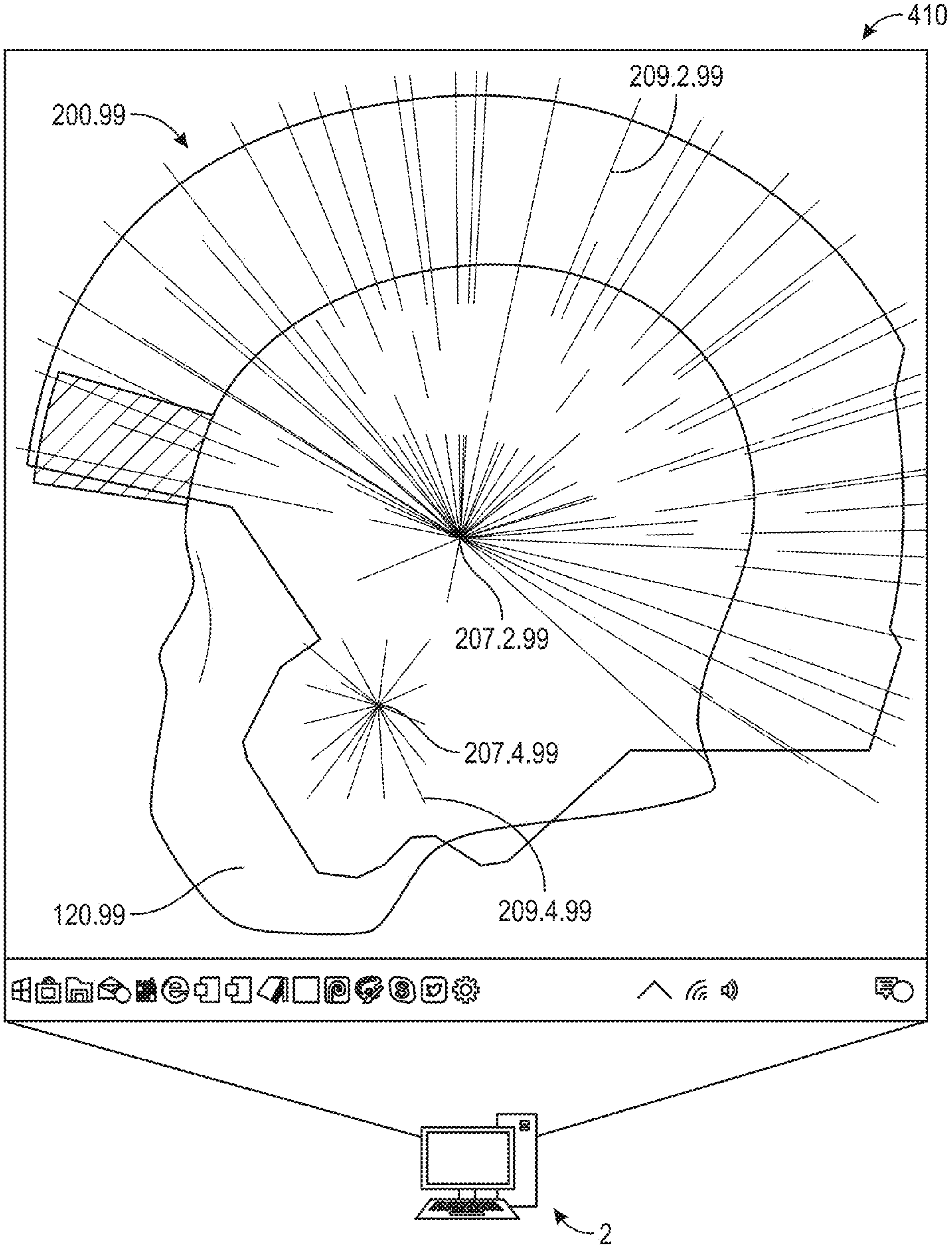
FIG. 43 shows the electronic device displaying the player head data and computerized helmet template.
Figure 44:
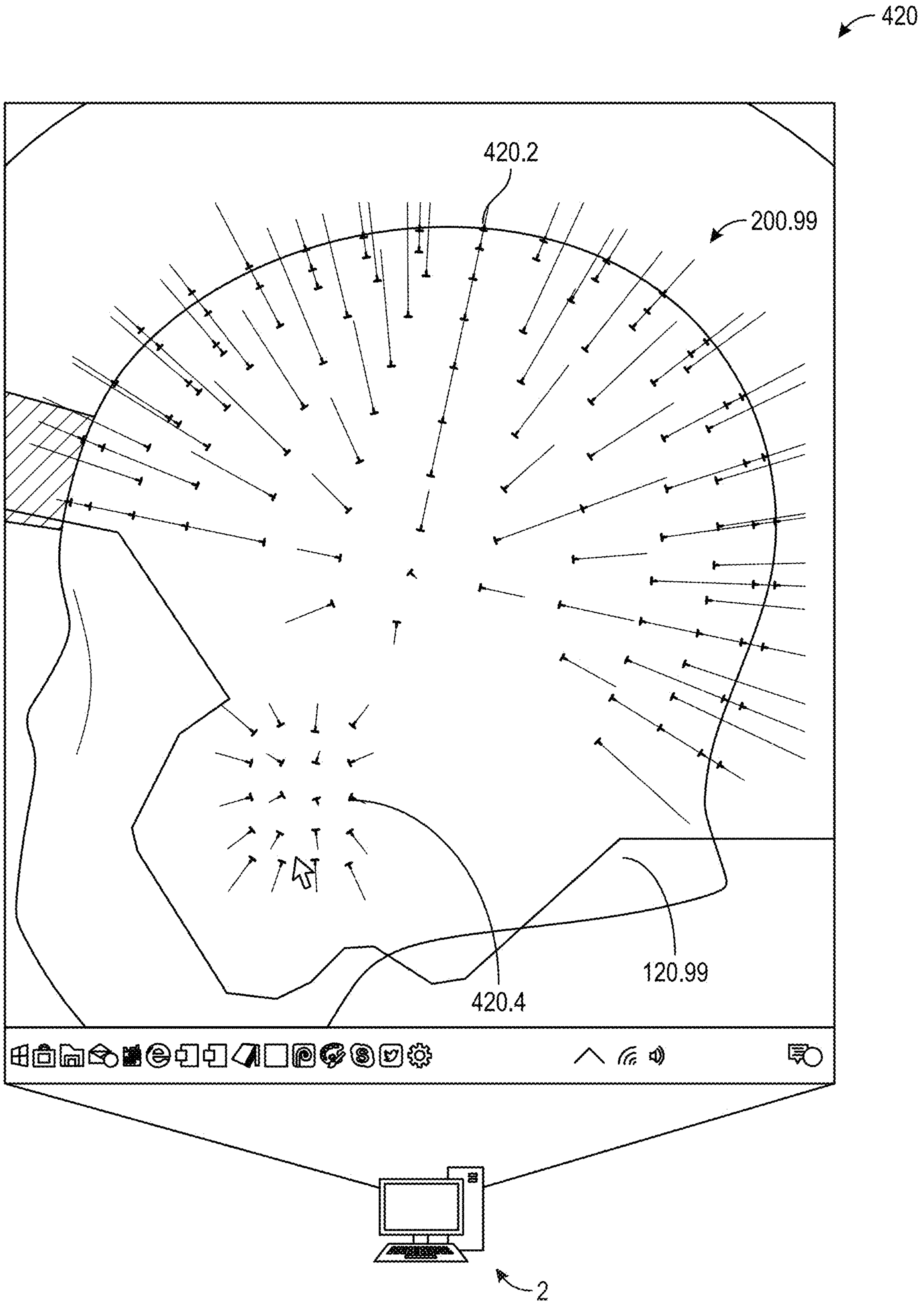
FIG. 44 shows the electronic device displaying player head data, computerized helmet template, and the player intersection locations, which occur where vector arrays of the computerized helmet template intersect said player head data.

Referring to FIG. 3, the next step (300) is importing and aligning the complete head model 120.99 within the computerized helmet template 200.99. Like other steps herein, step 300 includes multiple sub-steps that are shown in FIGS. 39-41. In particular, the complete head model 120.99, at least one reference cord 304.2 and at least one reference surface 304.4 are inserted into the computerized helmet template 200.99 in step 304. A graphical display of the complete head model 120.99, at least one reference cord 304.2 and at least one reference surface 304.4 is shown in FIG. 40. Next, in step 320, the complete head model 120.99 is aligned with the least one reference cord 304.2 by aligning the player's brow with the cord 304.2. A graphical display of step 320 is shown in FIG. 41. Next, in step 340, the complete head model 120.99 is moved forward or rearward in order to align the front extent of the player's brow with the at least one reference surface 304.4. A graphical display of step 340 is shown in FIG. 40-41. Next, in step 360, the complete head model 120.99 is moved transversely aligned, such that the sagittal plane of the complete head model 120.99 is aligned with the centerline of the computerized helmet template 200.99. A graphical display of step 360 is shown in FIG. 43. Next, in step 380, the rotational alignment of the complete head model 120.99 is checked and altered if necessary. A graphical display of step 380 is shown in FIG. 44. Once steps 304, 320, 340, 360, and 380 are aligned within the computerized helmet template 200.99, the complete head model 120.99 can be compared against the computerized helmet template 200.99 to determine the configuration of the variable layer 2000 that will best fit the player P.

In other embodiments, the alignment of the complete head model 120.99 and the computerized helmet template 200.99 may be accomplished using different methods. For example, one method of aligning the complete head model 120.99 may utilize a rotational-based method to place the anthropometric points 120.60.2. This method is performed by first moving the entire head model to a new location, wherein in this new location one of the anthropometric points 120.60.2 positioned at a zero. Next, two rotations are performed along Z and Y axes so that the left and right tragions lie along the X-axis. Finally, the last rotation is carried out along the X-axis so that the left infraorbital lies on the XY-plane.

An alternative method of aligning the relevant data (e.g., complete head model 120.99 and computerized helmet template 200.99) may include aligning anthropometric points 120.60.2 that are positioned on the complete head model 120.99 with anthropometric points that are positioned on a generic head model that is associated with the complete head model 120.99. The alignment of the anthropometric points may be accomplished using any of the methods that are disclosed above (e.g., expectation-maximization, iterative closest point analysis, iterative closest point variant, Procrustes alignment, manifold alignment, and etc.) or methods that are known in the art.

Another method of aligning the relevant data may include determining the center of the complete head model 120.99 and placing the center at 0, 0, 0. It should be understood that one or a combination of the above methods may be utilized to align or register the complete head model 120.99 with one another. Further, it should be understood that other alignment techniques that are known to one of skill in the art may also be used in aligning the complete head model 120.99 with the computerized helmet template 200.99. Such techniques include the techniques disclosed in all of the papers that are attached to U.S. Provisional Application No. 62/364,629, which are incorporated into the application by reference.

Once these alignment methods are utilized, a mathematical, visual and/or manual inspection of the alignment across multiple axes can be performed by a human or computer software. Upon the completion, the next steps of this process can be performed. It should be understood that the steps described within the method of preparing the data 120, may be performed in a different order. For example, the removal of data that is incomplete in steps 120.4, 120.52, and removal of data that is missing other relevant info 120.6, 120.54 may not be performed or may be performed at any time after steps 120.2, 120.50, respectfully.

The above steps can then be repeated for each helmet size and for every energy attenuation component within said computerized helmet template 200.99. Once all of these values can been calculated, said values can be stored in a database or another computer and the table in FIG. 38 can be generated. Said tables shown in FIG. 38 can be compared against any player head model and the comparison of side data can result in a determination of which energy attenuation components best fit the player. As discussed above, the table in FIG. 38 does not change based on each player; instead, the same table is used for all players.

H. PLAYER LINE LENGTHS

Figure 42:
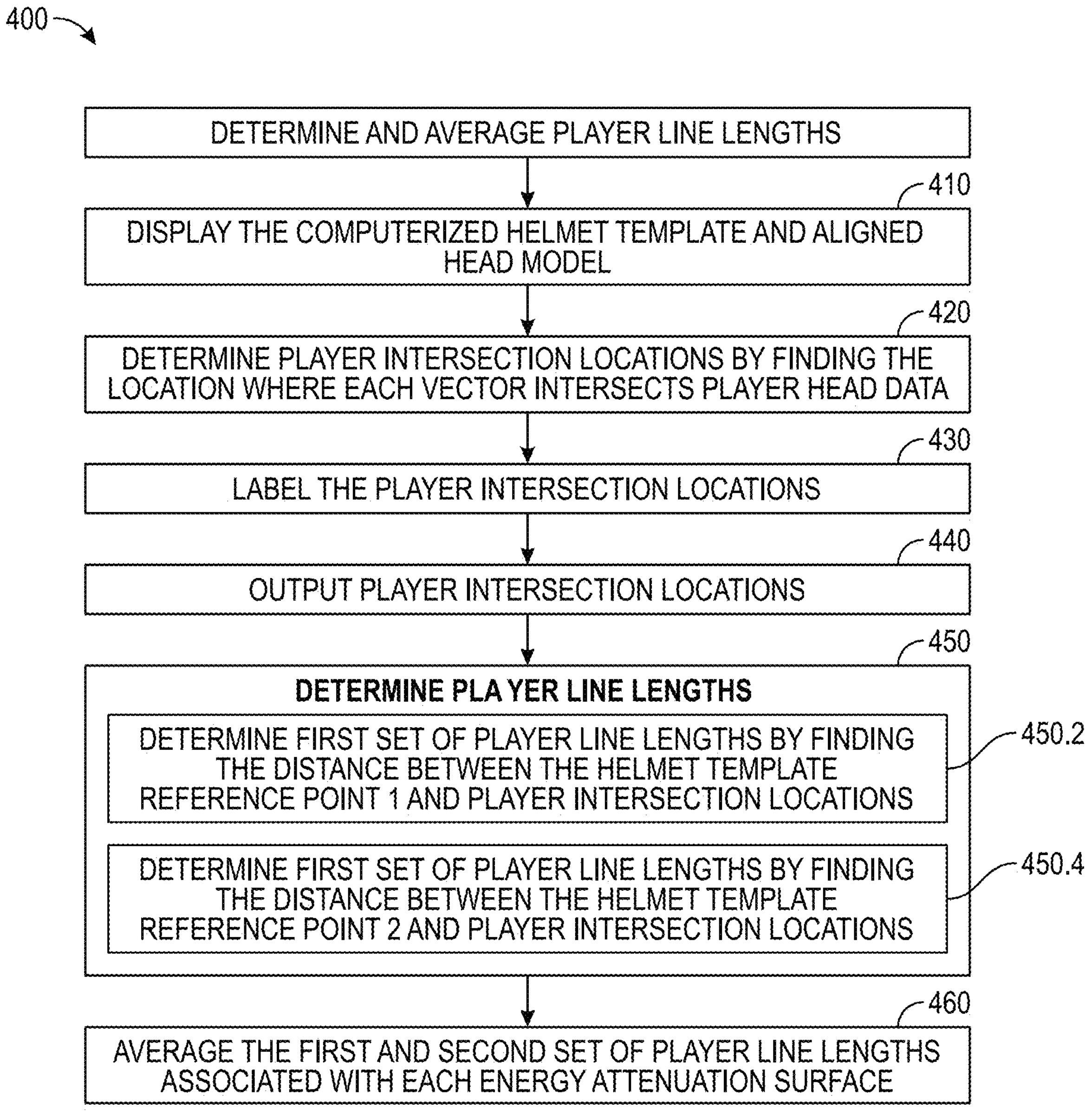
FIG. 42 is a flow chart of the system showing the method for generating the player head data coordinates and determining player line lengths.

Referring back to FIG. 3, the next step in this method 1 is determining the player line lengths that extend from the helmet template reference point(s) 207.3, 207.4 to the outer surface of the complete head models 120.99. Like other steps herein, step 400 includes multiple sub-steps that are shown in FIGS. 42-47. Referring to FIG. 42, the first step in this sub-process is set forth in connection with step 410, which displays the computerized helmet template 200.99, which includes the helmet template reference point(s) and vector array(s) that were generated in steps 207, 209, along with the aligned complete head model 120.99. A graphical display of step 410 is shown in FIG. 43. Next, the system 10 determines the player intersection locations or coordinates 420.2, 420.4 by finding the locations where each vector contained within the vector arrays 209.2.99, 209.4.99 intersects the computerized helmet template 200.99. Finding the player intersection locations 420.2, 420.4 may be achieved using 3D modeling tool with plugin utilized therein. A graphical display of these player intersection locations 420.2, 420.4 is shown in FIG. 44. Because there are two vector arrays (e.g., crown 209.2.99 and jaw 209.4.99), there are two different sets of player intersection locations 420.2, 420.4. Once these player intersection locations 420.2, 420.4 are determined in step 420, each player intersection locations 420.2, 420.4 is given a unique point identification value or number in step 430. The unique point identification value or number will enable data collected within this step and other steps to be compared to one another. It should be understood that the same two vector arrays that were used in connection with the computerized helmet template 200.99 should be used this step; otherwise, determination of the player line lengths becomes extremely difficult to calculate.

Once the player intersection locations 420.2, 420.4 are determined and labeled 430.2, this information is exported and associated with the locations of the helmet template reference point(s) 207.2.99, 207.4.99. The associated between these locations 420.2, 420.4, 207.2.99, 207.4.99 enables the system 10 to determine the distance between these points. In particular, the system 10 uses the Pythagorean Theorem of the square root of $a^2+b^2+c^2$ to determine these player line lengths 440.2, 440.4 in steps 450, 470. FIG. 45 shows a graphical display of a file that contains: (i) the helmet template reference points 207.2.99, 207.4.99, (ii) the player intersection locations 420.2, 420.4, and (iii) the determined player line lengths 440.2, 440.4, which extend between the helmet template reference point(s) 207.2.99, 207.4.99 and the player intersection locations 420.2, 420.4.

Figure 47:
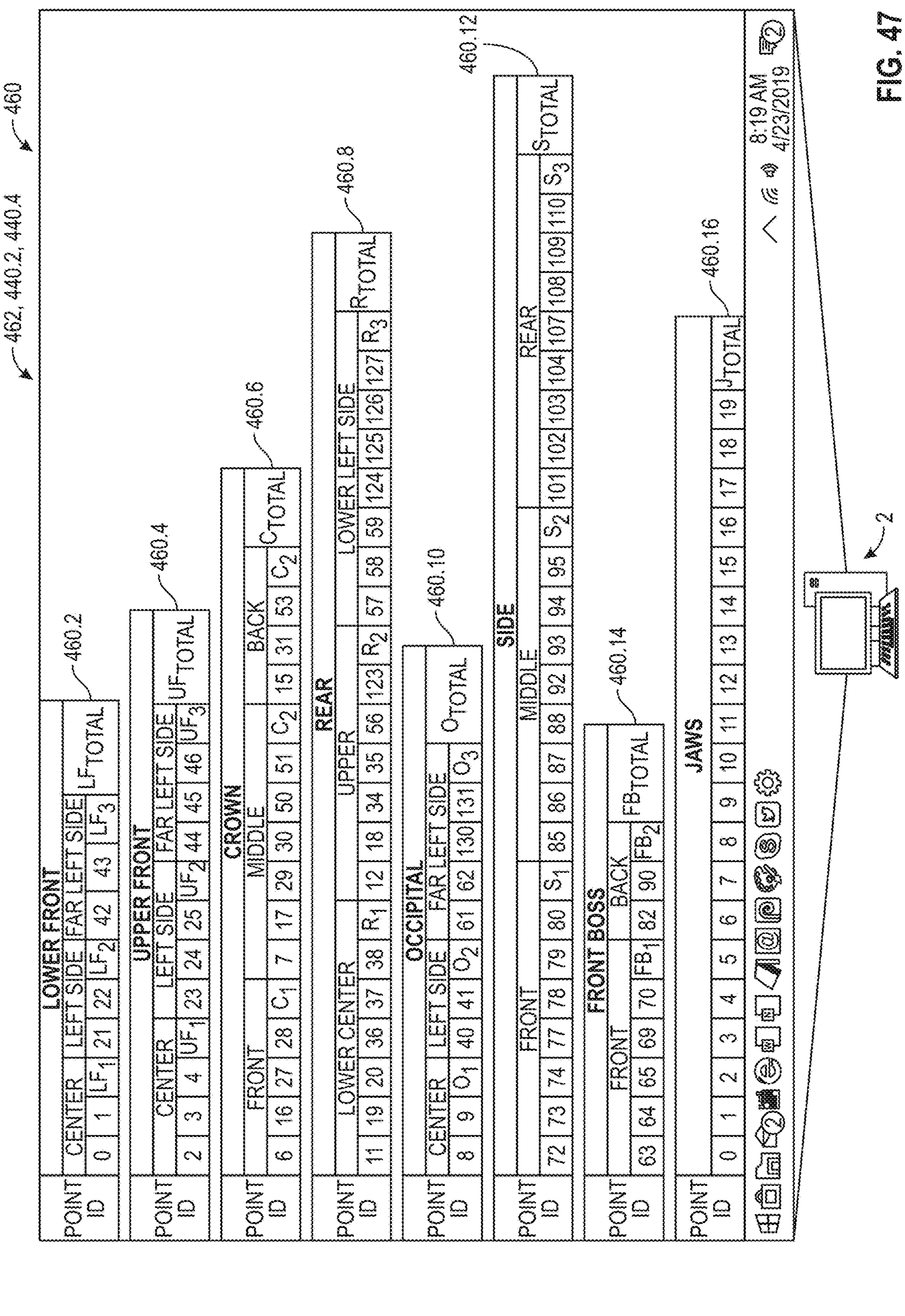
FIG. 47 shows the electronic device displaying a file that illustrates how the average player line lengths for various regions of the player head data are calculated.

As shown in FIG. 47, step 460 will output an average player line length 462 (e.g., 460.2-460.16). In particular FIG. 46 shows, location H0 associated with point identification 0 is averaged with H1 associated with point identification 1 to determined HA1, location H21 associated with point identification 21 is averaged with H22 associated with point identification 22 to determined HA2, and location H42 associated with point identification 42 is averaged with H43 associated with point identification 43 to determined HA3. HA1, HA2, and HA3 are then average to determine HLFA. This process is then repeated for other regions shown in FIG. 47. It should be understood that in other embodiments, that the averages may not be calculated based upon the rectangles shown in Figures; Instead, all points may be compared to one another, each average may include additional points, or other changes that are obvious based on this disclosure.

In summary, step 400 will output eight average player line lengths 460.2-460.16. Said average player line lengths 460.2-460.16 include: (i) lower front average player line length 460.2, (ii) upper front average player line length 460.4, (iii) crown average player line length 460.6, (iv) rear average player line length 460.8, (v) occipital average player line length 460.10, (vi) side average player line length 460.12, (vii) front boss average player line length 460.14, and (viii) jaw average player line length 460.16. It should be understood that in other embodiments, there may be more than eight averages (e.g., 40), there may be less than eight averages (e.g., 2), more or less points may be considered within each of the averages, or other changes that are obvious based on this disclosure.

I. CHECK SCAN ALIGNMENT

Referring to FIGS. 3 and 48, the alignment of the complete head model 120.99 with the computerized helmet template 200.99 is checked in step 500 by subtracting the player line lengths 460.2-460.16 associated with points located on the right side of the sagittal plane of the complete head model 120.99 with player line lengths 460.2-460.16 associated with points located on the left side of the sagittal plane of the complete head model 120.99 in step 510. If the complete head model 120.99 is symmetrical and adequately aligned, the differences between these line lengths should be zero. However, because player heads are not typically symmetrical, these values will not be zero and will have slight variation between them. Nevertheless, if the variation between the left and right values is greater than a predetermined value (e.g., 5 mm), then the alignment of the complete head model 120.99 should be reviewed to ensure that it is properly aligned in the computerized helmet template 200.99. In this embodiment, the complete head model 120.99 is properly aligned in the computerized helmet template 200.99 because the values shown in FIG. 46 are minimal and are less than the predetermined threshold value. It should be understood that this step may be skipped in certain embodiments.

J. SELECT HELMET SHELL SIZE

Figure 49:
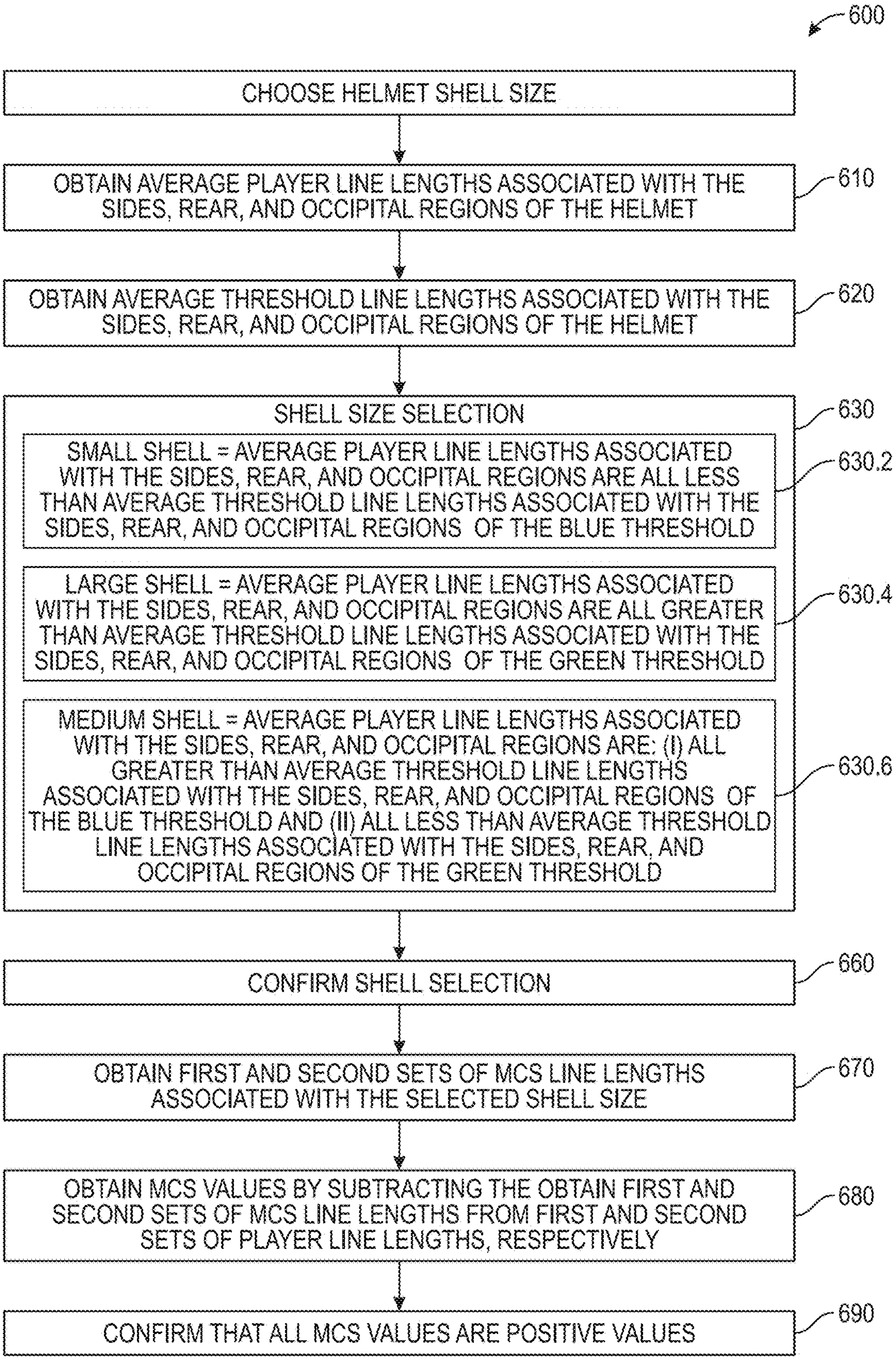
FIG. 49 is a flow chart of the system showing the method of selecting the helmet shell size for the specific player.
Figure 50:
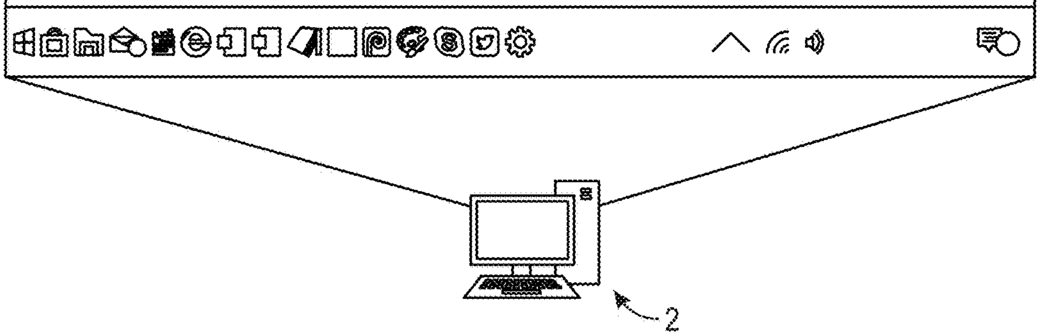
FIG. 50 shows the electronic device displaying a file that contains: (i) the average player line lengths in the side, rear, and occipital regions and (ii) average threshold line lengths in the side, rear, and occipital regions of the helmet shell.
Figure 51:
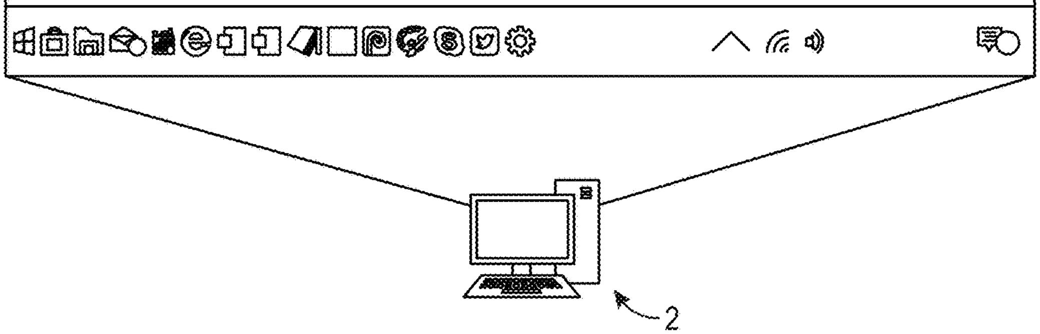
FIG. 51 shows the electronic device displaying considerations that are undertaken to determine which shell size is chosen for the specific player.

Referring to FIGS. 3 and 49, the next step (600) in this method 1 is selecting the helmet shell size. Like other steps herein, step 600 includes multiple sub-steps that are shown in FIGS. 50-51. Referring to FIG. 49, the first steps in this sub-process are obtaining the average player line lengths 462 that are associated with the side, rear, and occipital regions of the shell in step 610 and obtaining the average threshold line lengths 276 associated with the side, rear, and occipital regions of each threshold surface in step 620. Once this data is obtained in steps 610, 620, then the average line lengths 462, 276 can be compared according to the criteria shown in step 630 and FIG. 50. In particular, a small shell size will be selected if the average for side region, the average for the rear region, and the average for the occipital region of the player line lengths are less than the average for side region, the average for the rear region, and the average for the occipital region of the threshold line lengths of the blue threshold surface 224.2, respectively. Meanwhile, a large shell size will be selected if the average for side region, the average for the rear region, and the average for the occipital region of the player line lengths are greater than the average for side region, the average for the rear region, and the average for the occipital region of the threshold line lengths of the green threshold surface 224.4, respectively. Finally, a medium shell size will be selected if the player line lengths fall are dimensioned such that they do not fall into the small or large shell sizes described above.

If the optional MCS line lengths were determined and included within the computerized helmet template 200.99 and the designer determines it would be valuable to consider this information, then the designer may perform steps 660-690. Otherwise, steps 660-690 may be skipped in this process 1. Assuming that steps would be helpful, the system 10 next confirms the shell selection made in connection with step 630 may obtain the line lengths associated with the MCS of the selected size of the helmet shell. The MCS line lengths are obtained in step 670 and then subtracted from the player line lengths in step 680. Overall, it is preferable to use all line lengths, instead of just average line lengths, to ensure that the computerized model of the player's head does not extend passed the MCS in any manner. If the complete helmet model 120.99 extends passed the MCS, then the MCS is not satisfied and a larger shell needs to be selected. In other words, if any of the player line lengths are larger than the MCS line lengths, then the MCS is not satisfied and a larger shell needs to be selected. Alternatively, if the complete helmet model 120.99 does not extend past the MCS, the MCS is satisfied and no other shell sections need to be made.

K. SELECT ENERGY ATTENUATION MEMBERS

Figure 52:
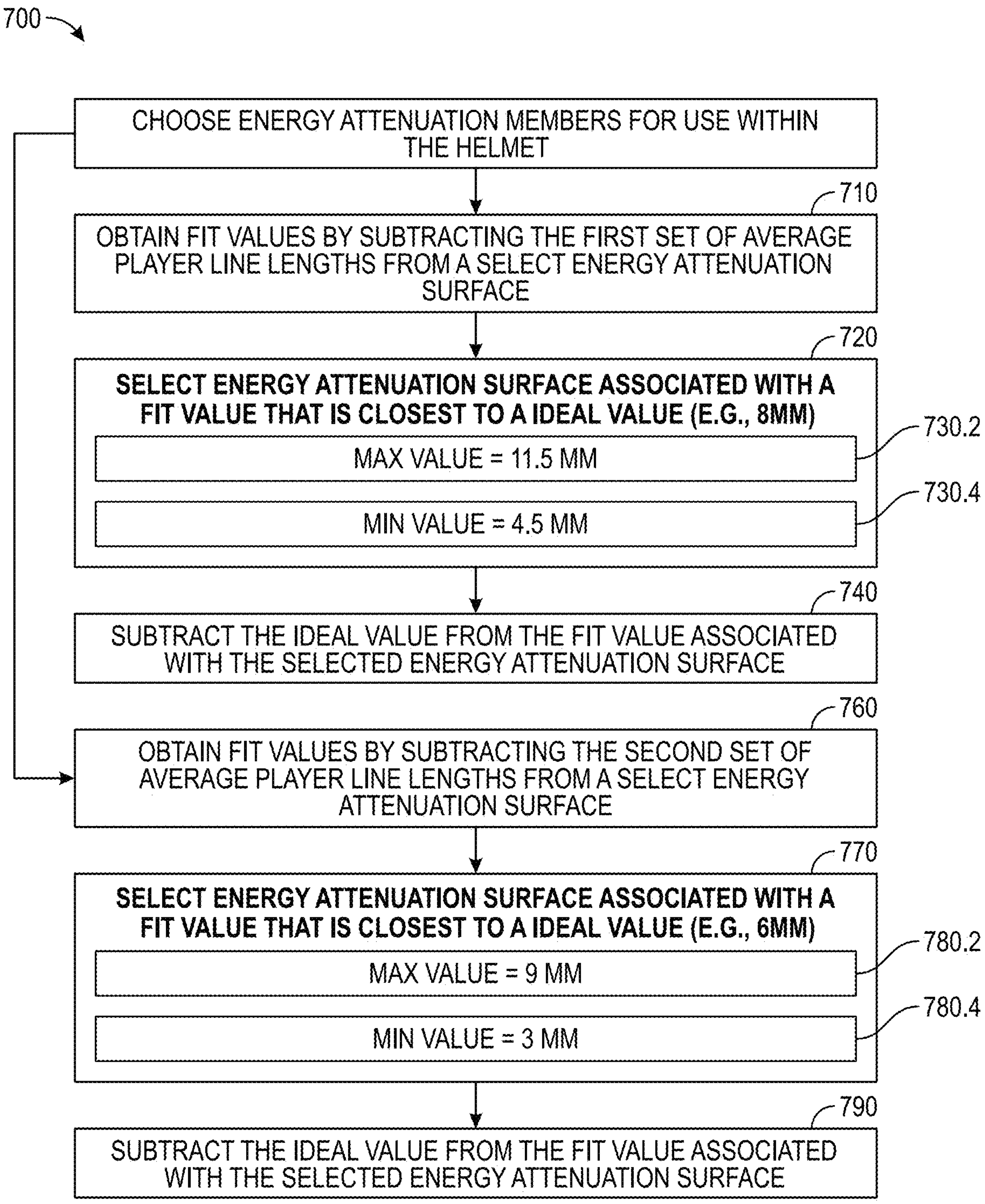
FIG. 52 is a flow chart of the system showing the method of selecting the configuration of energy management members for the specific player.
Figure 54:
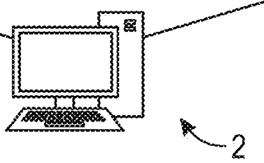
FIG. 54 shows the electronic device displaying a file that contains: (i) the average player line lengths and (ii) average energy attenuation line lengths for one energy attenuation member, and (iii) the equation that is utilized to determine the player-surface line lengths.
Figure 55:
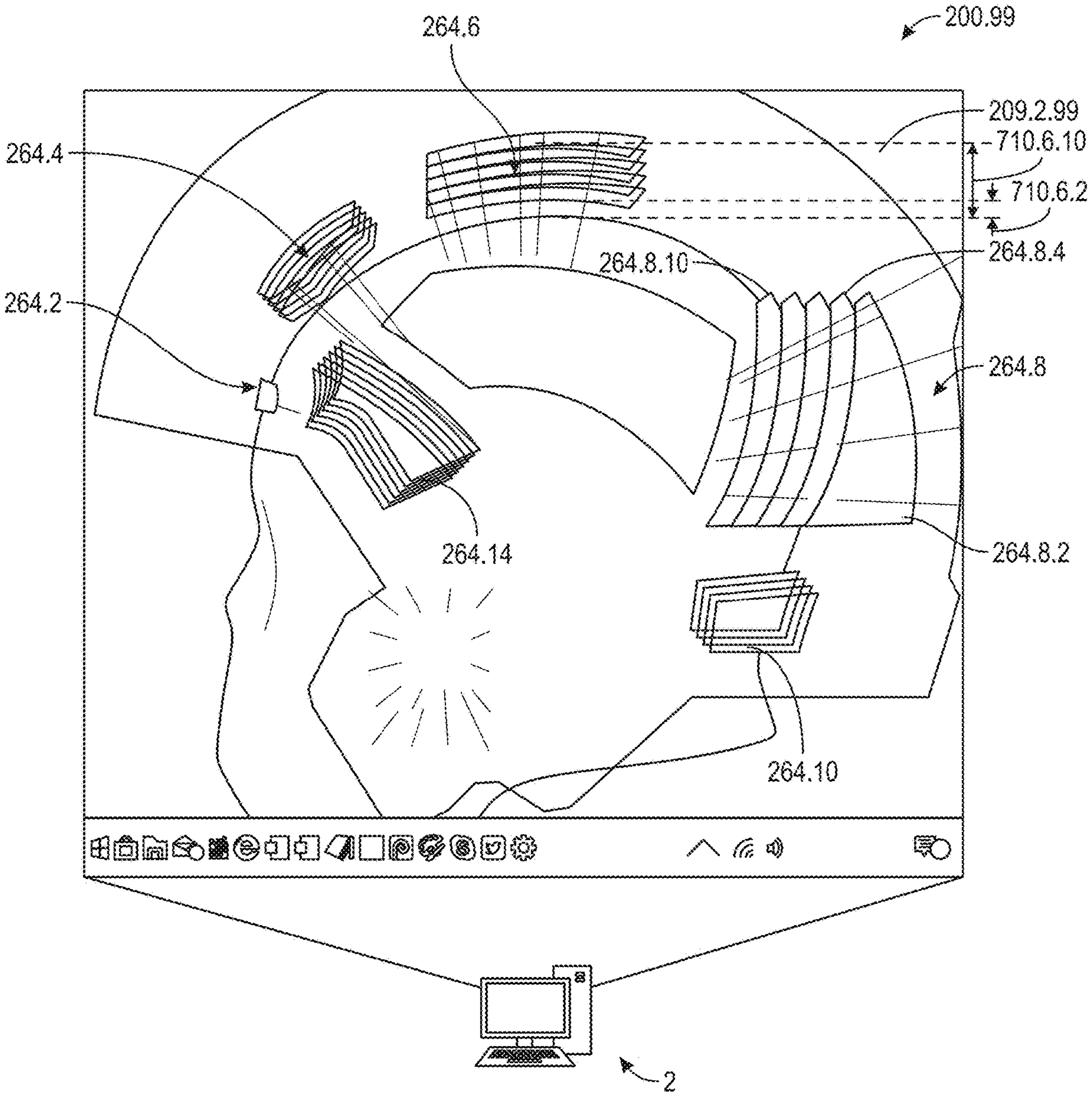
FIG. 55 shows the electronic device displaying the determined player-surface line lengths between an outer surface of a complete player head model and various energy attenuation surfaces within the computerized helmet template.
Figure 56:
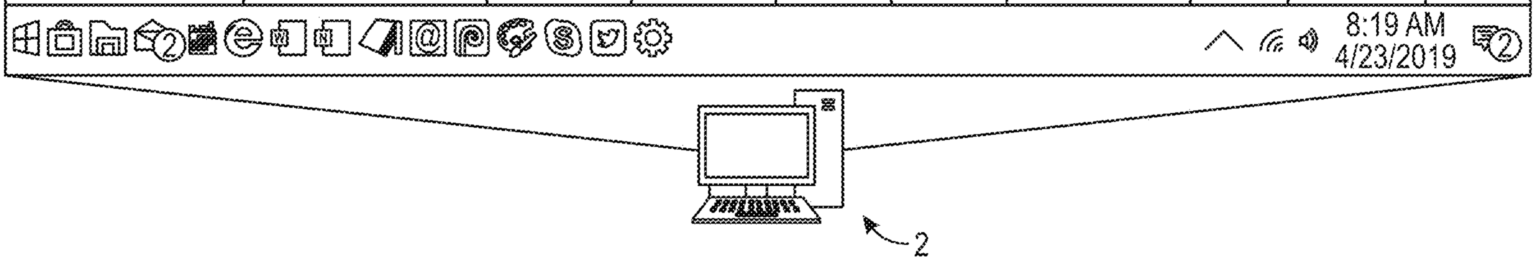
FIG. 56 shows the electronic device displaying a file that contains the player-surface line lengths for various regions of the player head data.
Figure 57:
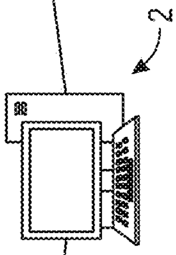
FIG. 57 shows the electronic device displaying a file that selects the configuration of energy management members for the specific player based upon the player-surface line lengths and to be installed within the helmet.
Figure 59A:
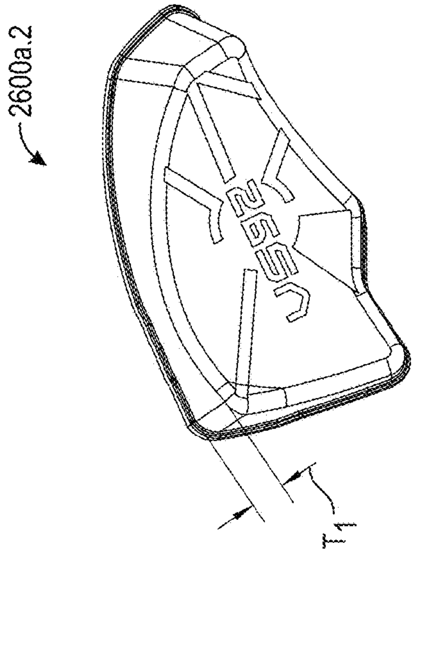
FIGS. 59A-59E are perspective views of five distinct configurations of a left side component of the variable layer of the energy management assembly to be installed within the helmet.
Figure 59B:
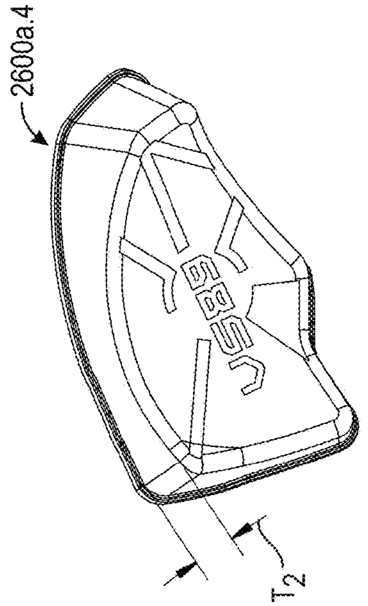
Figure 59C:
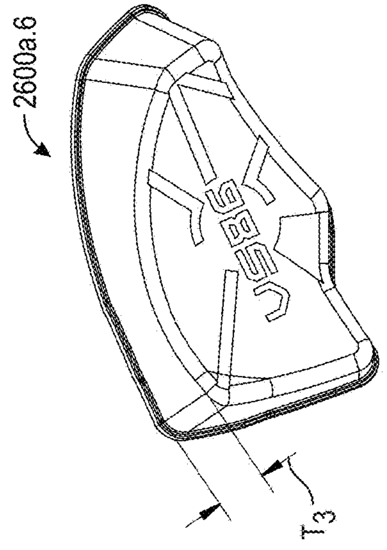
Figure 59D:
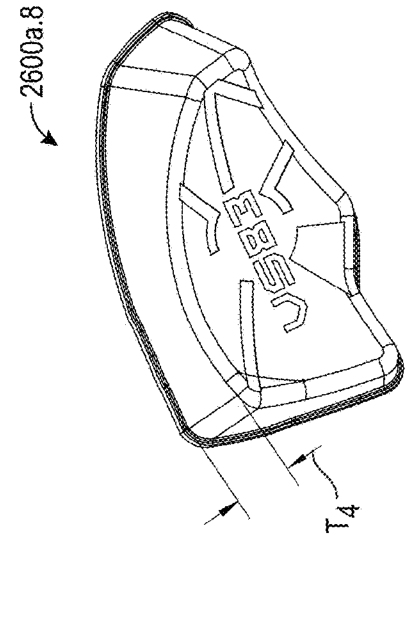
Figure 59E:
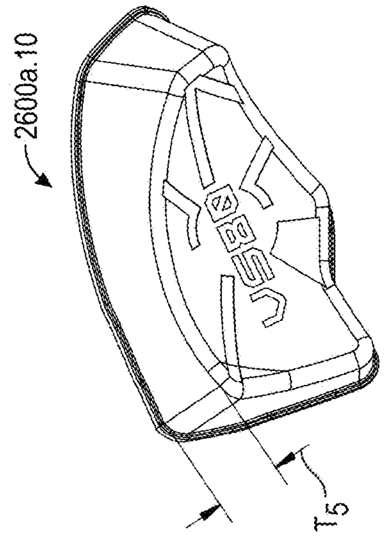
Figure 61:
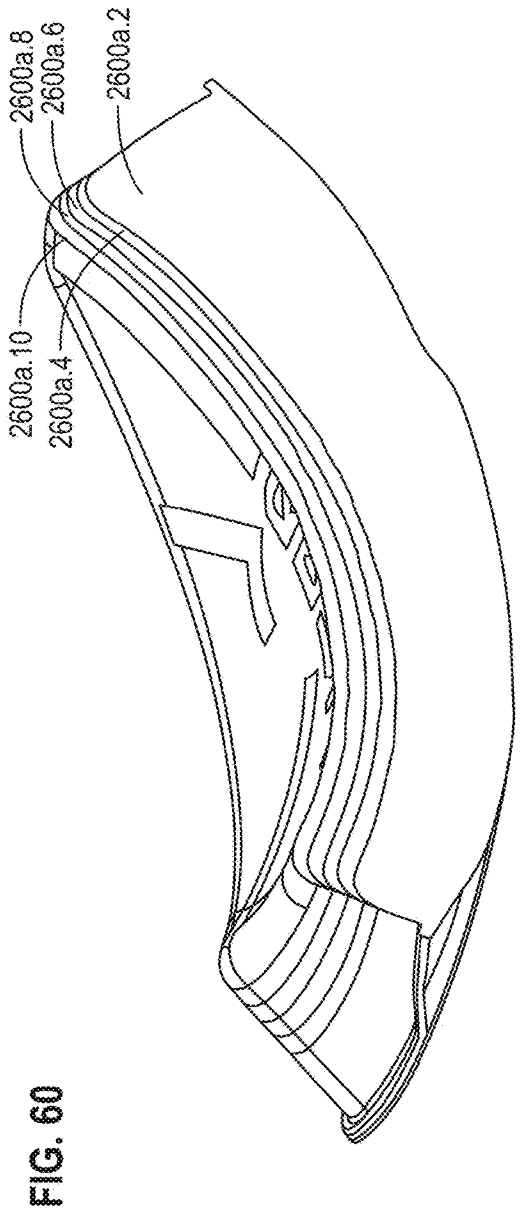
FIG. 61 is a cross-section view of the left side components of the variable layer taken along line 60-60 of FIG. 61.

Referring back to FIG. 3, the next step (700) in this method 1 is selecting the components of the variable layer 2000. Like other steps herein, step 700 includes multiple sub-steps that are shown in FIGS. 52-58. Referring to FIG. 52, the first step in this sub-process is to obtain fit values 710.2.X-710.16.X. For example, the fit values 710.6.2-710.6.12 for the crown region are calculated by subtracting the average crown player line length 460.6 from the average crown energy attenuation line lengths 274.6.2-274.6.10. These fit values 710.2.X-710.16.X (where X is the number of energy attenuation surfaces, which correspond to the number of pre-manufactured energy attenuation components). In another example, the fit values 710.2.2-710.2.16 for the lower front region are calculated by subtracting the average lower front player line length 460.2 from the average lower front energy attenuation line lengths 274.2.2-274.2.16 (shown in FIGS. 53-54). These fit values 710.2.X-710.16.X (where X is the number of energy attenuation surfaces, which correspond to the number of energy attenuation components) can then be arranged within a table, as shown in FIG. 54, and compared against three preset values to determine which configuration of the energy attenuation component will be selected. In particular, the three preset values include: (i) an ideal value, (ii) a min value, and (iii) max value. The system 10 will attempt to select the fit values 710.2.X-710.16.X that is closest to the ideal value, while being greater than the min value and less than the max value.

In this embodiment, a predefined hood thickness of 1.5 mm is assumed to be added to the player's head due to the data collection process described above. The addition of this hood thickness, sets the: (i) ideal value for the non-jaw areas to 8 mm (providing 6.5 mm interference fit), the min value to 4.5 mm (providing 3 mm interference fit), and the max value to 11.5 mm (providing 10 mm interference fit), and ideal value for the jaw areas to 6 mm (providing 4.5 mm interference fit), the min value to 3 mm (providing 1.5 mm interference fit), and the max value to 9 mm (providing 7.5 mm interference fit). As described above, the fit value 710.2.X-710.16.X that is closest to the ideal value, is selected for each component to provide a configuration of the variable layer 2000 that best fits the player. It should be understood that the ideal value will not always be achievable for each and every player because pre-manufactured energy attenuation components are being selected for installation in the helmet and said energy attenuation components are not custom manufactured with a custom surface. This being said, the system 10 will do its best to find the closest value. Also, it should be understood the above values may be reduced if a different data collection system was utilized that did not add an offset (i.e., hood) to the player's head or may be increased if the offset is larger or another layer (e.g., skull cap) is included between the fixed layer 1000 and the player's head.

Here, the closest values to ideal were found in connection with: (i) the fourth configuration for the jaw variable components 2800*a, b*, (ii) the fifth configurations for the upper front variable component 2200, the crown variable component 2300, the side variable components 2600*a, b*, and the front boss components 2700*a, b*, (iii) the sixth configuration for the lower front variable component 2100, and (iv) the seventh configurations for the rear variable component 2400 and occipital component 2500. This is shown in connection with the table displayed in FIG. 57, where a "1" indicates the selected configuration for at component. It should be understood that the ideal fit value is chosen based on the configuration of the helmet 5000 in order to ensure that the helmet 5000 will create an between 0.25 psi and 10 psi, preferable between 0.75 psi and 5 psi and most preferable 1 psi and 3 psi. In this embodiment, distances are utilized to determine the pressure that will be applied on the player's head in this state because distances are easier to obtain and check. As such, the disclosed system 10 calculates fit value 710.2.X-710.16.X and compares said fit value 710.2.X-710.16.X to the ideal fit value in order to find the an pre-manufactured energy attenuation component that will be compressed an idea amount when the helmet 5000 is in the worn, but pre-impact state in order to help ensure that said compressed amount will provide the desired interference fit (i.e., pressure) with the player's head.

Once the components of the variable layer 2000 are selected, obtain the fit value associated with the selected components and subtract the ideal value from said fit value to determine fitment error value (see FIG. 58). Compare these fitment error value to a predefined under limit (e.g., 1.5 mm) and a predefined over value (e.g., 5 mm) to ensure that the selected components will not apply too much pressure or too little pressure on a player's head, when the helmet is worn. These fitment error values provide additional information about the fit of the helmet for the specific player because the fitment error values may affect how the American football helmet 5000 fits in another region. For example, if the upper front has a high fitment error value, this may push the helmet rearward on the player's head; thereby affecting the rear component. Thus, minimizing the fitment error values helps ensure that the American football helmet 5000 properly fits the player.

It should be understood that the ideal values, max values, min values, predefined under values, and predefined over values are primarily based on the CD of the energy attenuation assembly 3000. As such, if the CD of the energy attenuation assembly 3000 changes, then all of these values need to be recalculated based on the CD of this new energy attenuation assembly 3000 to ensure that the proper interference fit is created between the player and the helmet. As such, the ideal value may range from 2 mm to 15 mm, depending on the properties of the components contained within the fixed and variable layers 1000, 2000, in order to form an interference fit with the player's head when the helmet is in the helmet worn, but pre-impact state, wherein this interference fit causes the helmet 5000 to apply between 0.25 psi and 10 psi, preferable between 0.75 psi and 5 psi and most preferable 1 psi and 3 psi on the player's head.

L. OBTAIN AND INSTALL SELECTED ENERGY ATTENUATION MEMBERS WITHIN THE SELECTED HELMET SHELL

Referring back to FIG. 3, after the system 10 has digitally determined the proper size helmet shell and selected the components of the variable layer, then the system 10 outputs a digital file that can be used to inform an installer of the pre-manufactured physical components that are needed to build the specific player's American football helmet 5000 in steps 800 and 900. In particular, the digital file may include a reference to a pre-manufactured shell size, namely, a small shell 5010.2, a medium shell 5010.4, or a large shell 5010.6. Examples of the helmet shells 5010.2, 5010,4, 5010.6, visors 6000, chin bar 7000, chin straps 8000, other components and their configuration are disclosed in connection with U.S. patent application Ser. Nos. 17/327,641, 17/647,459, 29/829,992, 29/839,498, U.S. Provisional applications Nos. 63/079,476, 63/157,337, 63/188,836, and U.S. Pat. Nos. D946,833, D939,782 D939,151, each of which are hereby incorporated by reference. Additionally, the control module assembly 3200 includes an impact sensor assembly (not shown) that is positioned between the layers 1000, 3000 and an impact control module 3210. Said features and functionality of the control module assembly 3200 is disclosed in U.S. patent application Ser. No. 16/712,879, which is incorporated herein by reference.

After the proper size helmet shell 5010 is obtained, the assembler may reference the digital file to determine the pre-manufactured components needed to assemble the fixed layer 1000. As discussed above, the components of the fixed layer 1000 are at least standard across a particular helmet shell size and maybe standard across multiple helmet shell sizes. In other words, at least all player's that wear medium helmet shells 5010, will have the same fixed layer 1000. In particular, the fixed layer 1000 includes: (i) front fixed component 1100, (ii) crown fixed component 1200, (iii) rear fixed component 1300, and (iv) opposed left and right side fixed components 1400*a, b*. Each of these components have a substantially uniform or constant CD that is equal to or less than the CD of the components contained within the variable layer 2000, and a configuration that prevents the component to be properly positioned multiple regions of the helmet.

Figure 65:
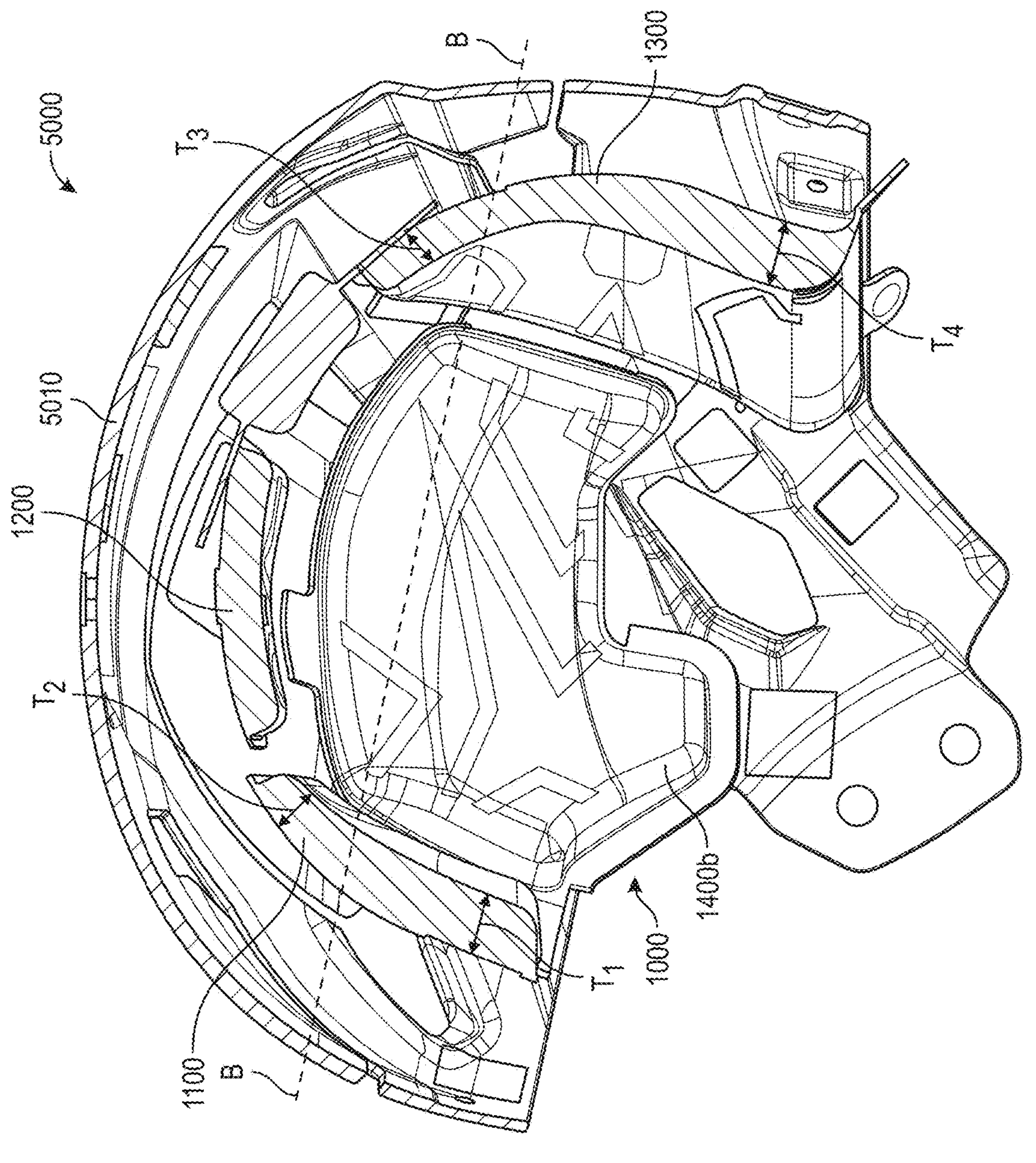
FIG. 65 is a cross-section view of the helmet shell with the fixed layer of the energy management assembly for the protective sports helmet taken along line 65-65 of FIG. 64.
Figure 64:
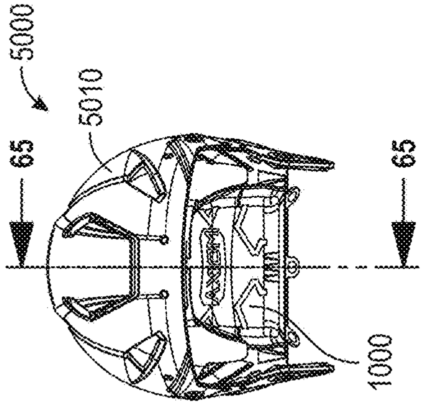
FIG. 64 is a front view of a helmet shell with the fixed layer of the energy management assembly for the protective sports helmet of FIGS. 62-63.
Figure 67:
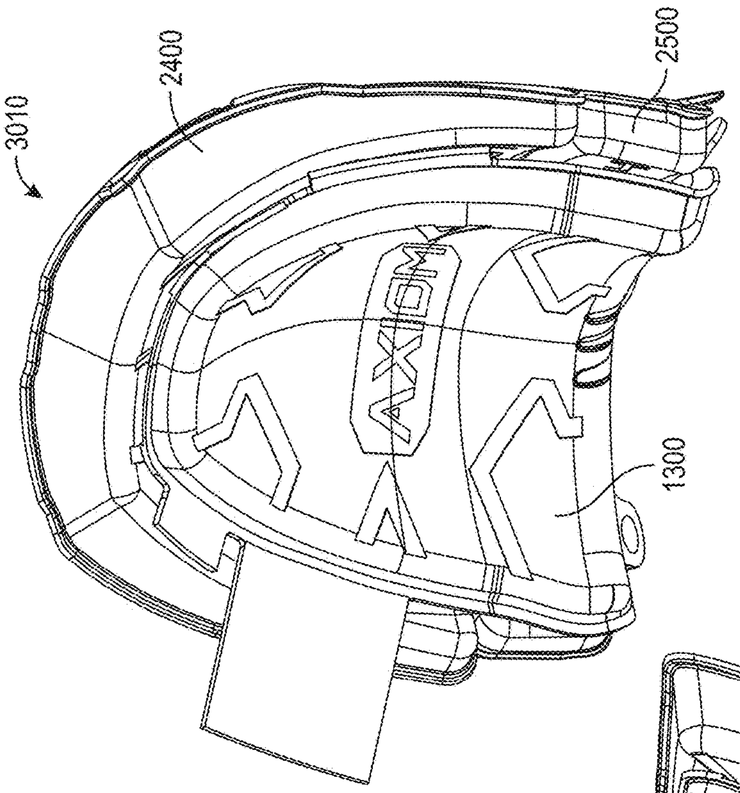
FIG. 67 is a perspective view of a rear member of the energy management assembly, where the rear member includes: (i) a fixed layer, and (ii) a variable layer, both positionally arranged as described in FIG. 66.
Figure 68:
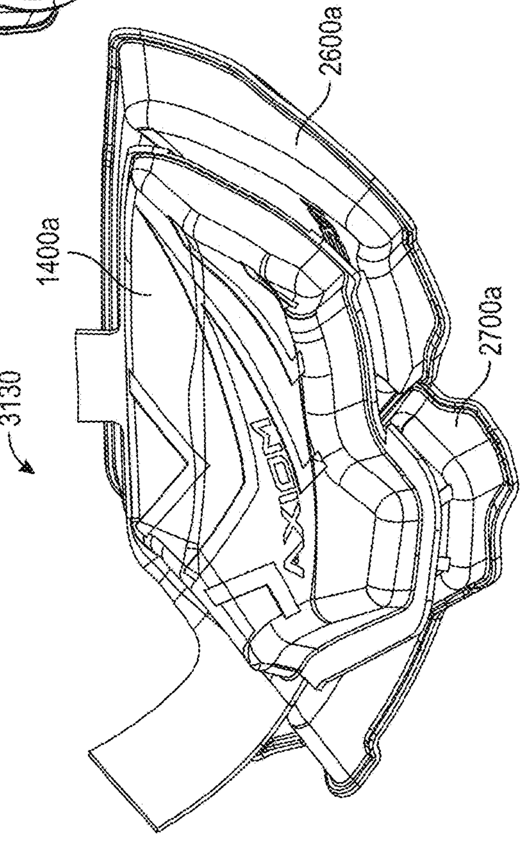
FIG. 68 is a perspective view of a side member of the energy management assembly, where the side member includes: (i) a fixed layer, and (ii) a variable layer, both positionally arranged as described in FIG. 66.
Figure 66:
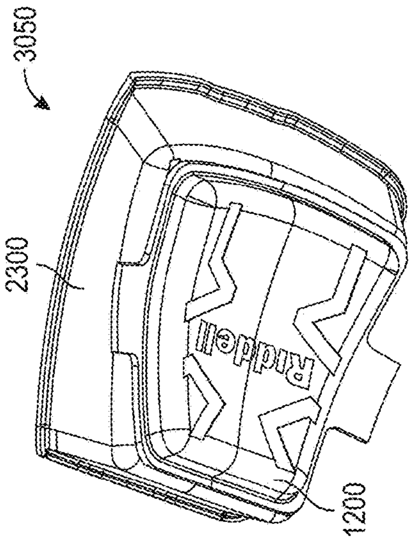
FIG. 66 is a perspective view of a crown member of the energy management assembly, where the crown member includes: (i) a fixed layer, and (ii) a variable layer, wherein the fixed layer resides against the player's head when the helmet is worn and the variable layer resides between the fixed layer and the helmet shell.
Figure 70:
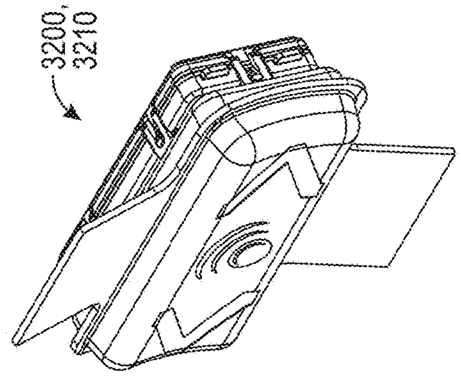
FIG. 70 is a perspective view of a control module assembly.
Figure 71:
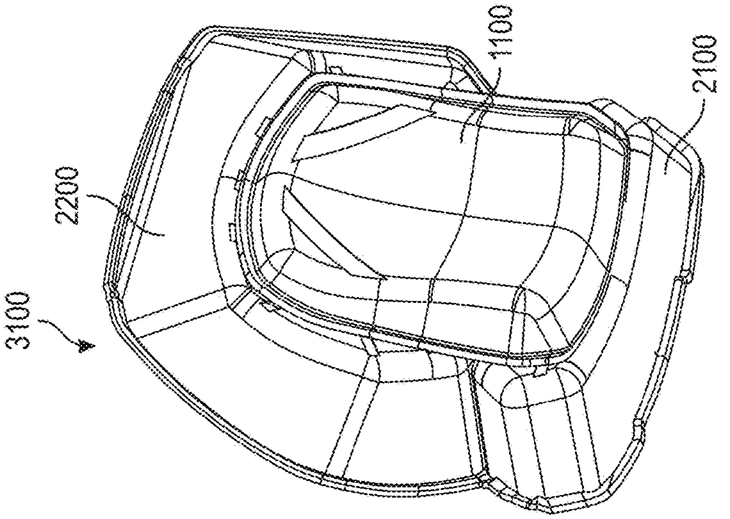
FIG. 71 is a perspective view of a front member of the energy management assembly, where the front member includes: (i) a fixed layer, and (ii) a variable layer both positionally arranged as described in FIG. 66.
Figure 69:
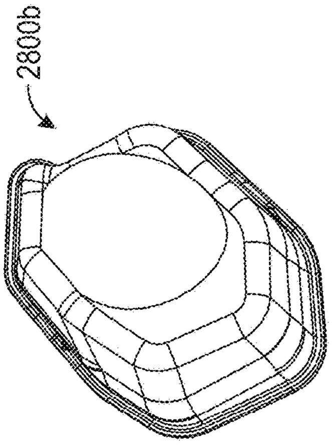
FIG. 69 is a perspective view of a jaw component or member.
Figure 72:
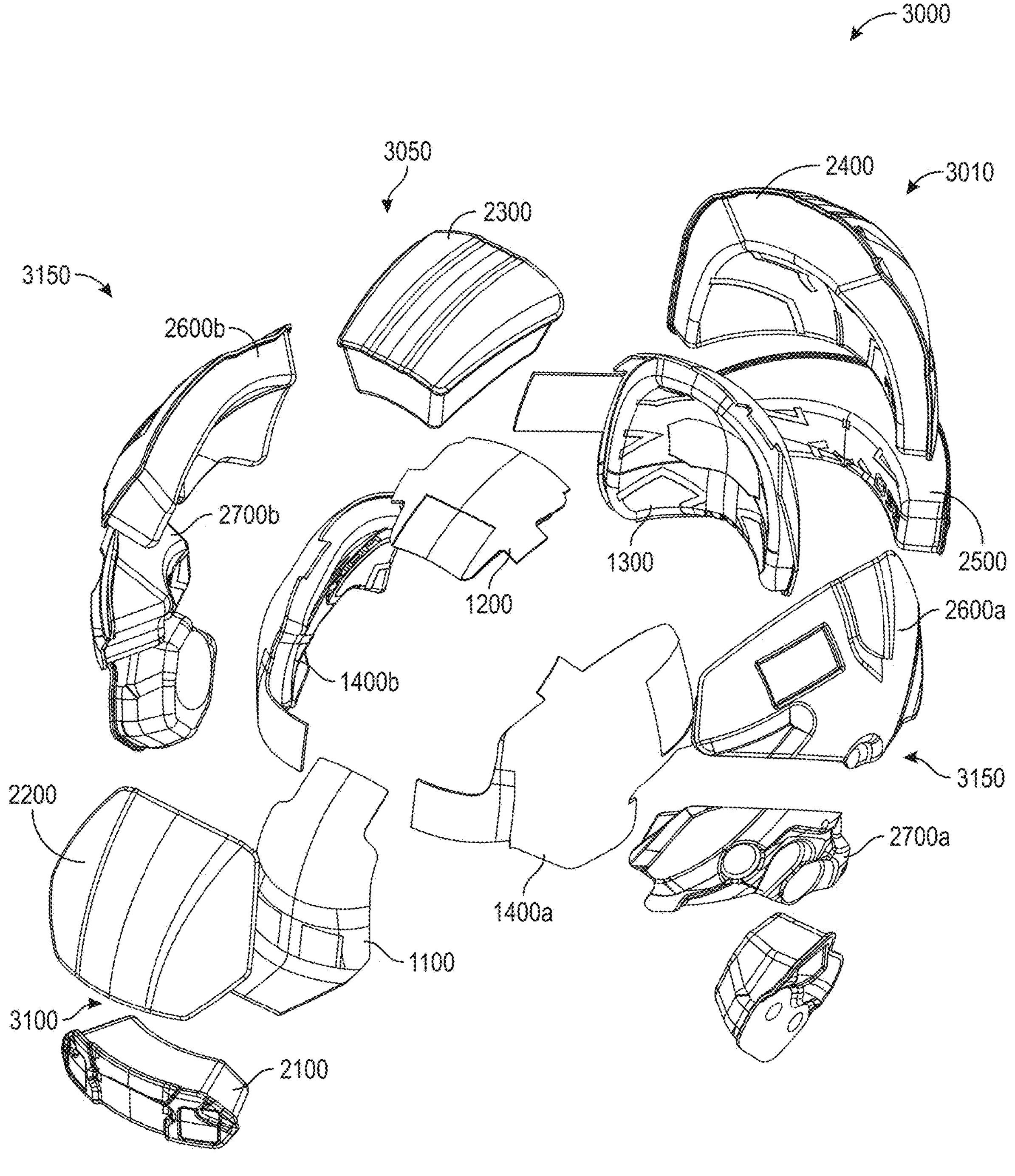
FIG. 72 is an exploded view of the energy management assembly for the protective sports helmet, where the energy management assembly includes a plurality of fixed layer and variable layer.

As best shown in FIG. 65, the thickness of the fixed layer 1000 changes between components and even within components. For example, the front fixed component 1100 has a thickness that changes from $T_1$ (e.g., 19.5 mm) at a first point at to $T_2$ (e.g., 13.5 mm) at a second point, where $T_2$ is less (e.g., 30%) than $T_1$. Additionally, the rear fixed component 1300 has a thickness that changes from $T_3$ (e.g., 13.5 mm) at a first point at to $T_4$ (e.g., 19.5 mm) at a second point, where $T_3$ is less (e.g., 30%) than $T_4$. The non-uniformity or variability of the thickness of the fixed layer 1000 is beneficial over uniform or consistent thicknesses because it applies less pressure on the player's head H above line B-B, when the helmet is worn by the player P. Application of less pressure on the player's head H above line B-B is beneficial because it helps ensure that the helmet does not "ride up" or require the chin strap to keep the helmet 5000 in the proper location on the player's head. In other words, the helmet 5000 may apply: (i) between 0.5 psi and 10 psi, preferable between 1 psi and 5 psi and most preferable 1 and 3 psi on the player's head below line B-B, and (ii) between 0 psi and 5 psi, preferable between 0 psi and 3 psi and most preferable 0 and 2 psi on the player's head above line B-B. As shown in FIG. 65, line B-B is parallel with the frontal edge of the shell 5010 opening. Nevertheless, in other configurations the fixed layer 1000 may have a uniform or consistent thicknesses and the variable layer 2000 may be altered to adjusted to apply less pressure above line B-B. In further configurations, the line B-B may not be parallel with the frontal edge of the shell 5010.

FIGS. 62-79 show various views of this fixed layer 1000 in different orientations and installations. To note, the fixed layer 1000 is configured to be positioned adjacent to the player's head when the helmet is worn by the specific player. This configuration is: (i) opposite of conventional football helmets that place the variable layer adjacent to the player's head, and (ii) beneficial because it helps ensure that the helmet is positioned in the same place for all players. Positioning in a constant place for all players is beneficial because it helps optimize the field of view for all players and helps ensure that the helmet is properly configured for optimal impact absorption. Once the shell 5010 and fixed layer 1000 are obtained, the assembler can obtain the components for the variable layer 2000. It should be understood that in other embodiments, the components of the fixed layer 1000 may not have: (i) a non-uniformity or variability thickness (e.g., thickness may be constant across the entire layer 1000), (ii) a substantially uniform or constant CD (e.g., CD may vary throughout the layer 1000, may vary between components, or may vary within a single component), and/or (iii) may have a CD that is equal to or greater than the CD of the components contained within the variable layer 2000 (e.g., the CD of the crown variable component may be less than the CD of the crown fixed component).

Figure 60:
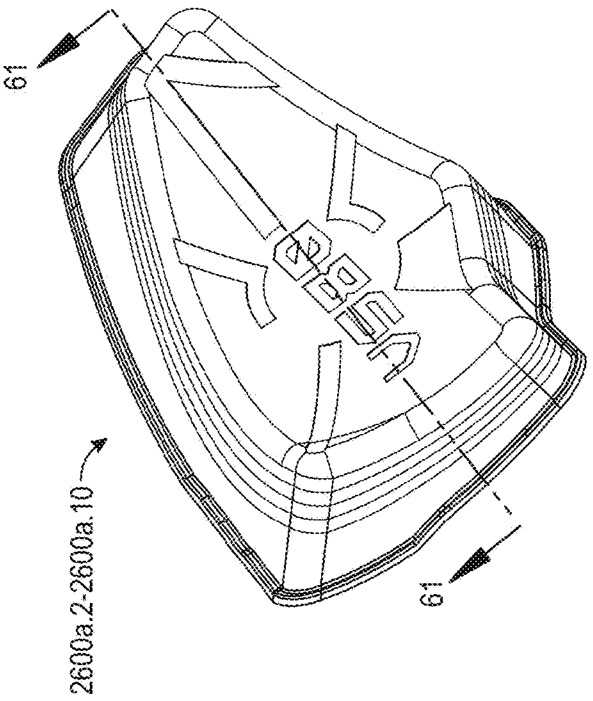
FIG. 60 is a perspective view of the left side components of the variable layer of the energy management assembly to be installed within the helmet, wherein the five configurations of the left side components of the variable layer shown in FIGS. 60A-60E have been vertically arranged to illustrate differing thicknesses.
Figure 63:
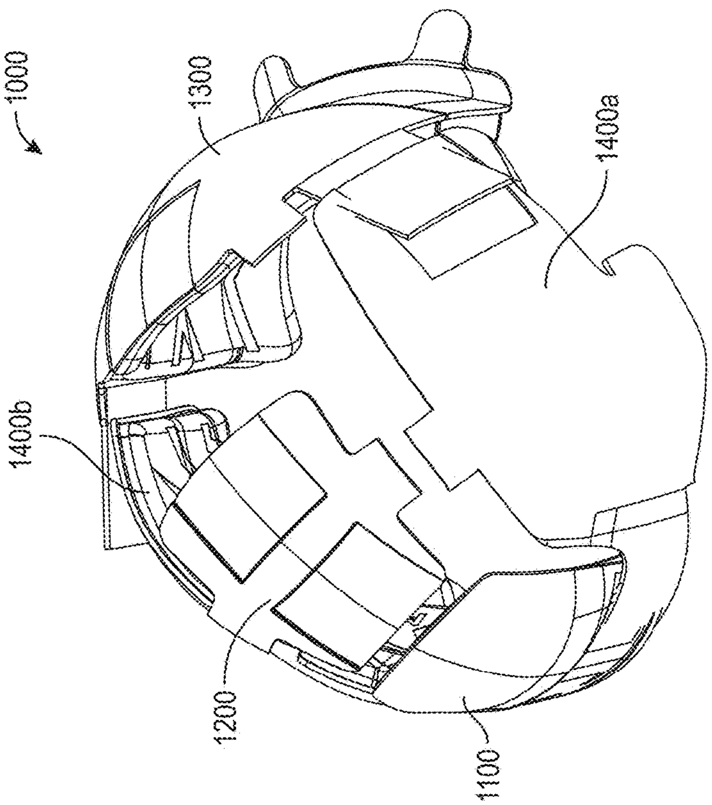
FIG. 63 is a top perspective view of the fixed layer of the energy management assembly for the protective sports helmet.
Figure 62:
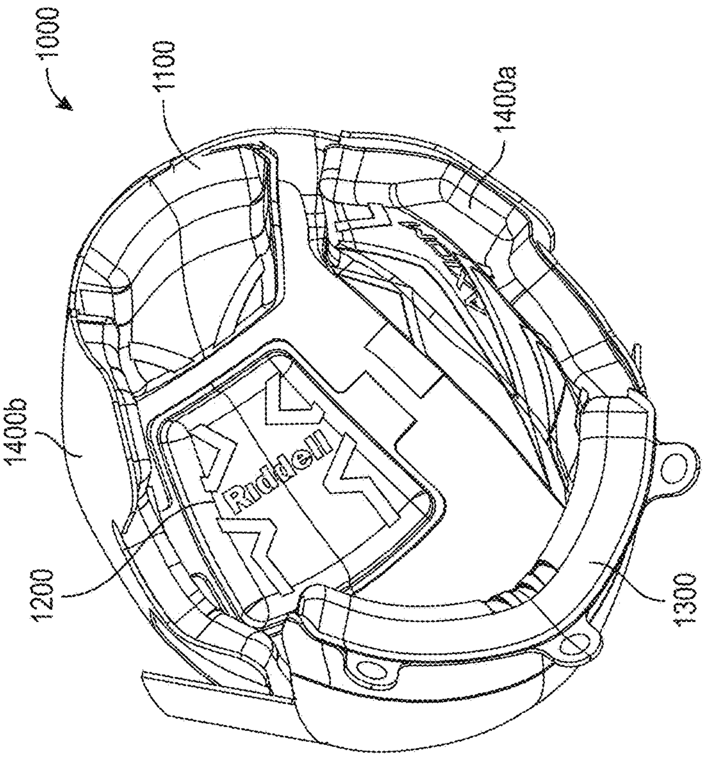
FIG. 62 is a bottom perspective view of the fixed layer of the energy management assembly for the protective sports helmet.

After the proper size helmet shell 5010 is obtained and the components of the fixed layer 1000 are selected, the assembler may reference the digital file to determine the pre-manufactured components needed to assemble the variable layer 2000. As described in detail above, each component contained in the variable layer 2000: (i) includes multiple configurations (e.g., between one and ten configurations, preferably seven configurations), (ii) does not have uniform thicknesses across the components, (iii) each configuration of a component has a different configuration (e.g., thickness, CD, etc.), and (iv) has a CD that is equal to or greater than the CD of most of the components contained within the fixed layer 1000. For example, FIGS. 59A-59E shows five different configurations 2600*a*.2-2600*a*. 10 of the left side variable component 2600*a*. Here, the thinnest configuration 2600*a*.2 has a thickness $T_1$ at one point, approximately 16.3 mm, while the thickest configuration 2600*a*. 10 has a thickness $T_5$ at the same point that is approximately 31.1 mm. In other words, there is approximately a 14 mm (i.e., 52%) difference between these components 2600*a*.2, 2600*a*. 10 at this specific location. Additionally, the changes in these thickness profiles can be seen in FIG. 60, wherein the thinnest configuration 2600*a*.2 is shown in yellow and the thickness configuration 2600*a*. 10 is shown in blue. It should be understood that the thicknesses disclosed in connection with the left side variable component 2600*a* are only exemplary and are non-limiting. As such, the thicknesses of this component may be increased or decreased.

It should be understood that similar configurations and thickness variations that are shown in connection with the left side variable component 2600*a* are also contained within the configurations associated with the upper front component 2200, crown component 2300, rear component 2400, occipital component 2500, sides component 2600*a*-2600*b*, frontal boss variable component 2700*a*-2700*b*, and jaw component 2800*a*-2800*b*. It should be understood in alternative embodiments, components contained in the variable layer 2000: (i) may include a single configuration (e.g., lower front component), (ii) has a uniform thickness across at least one component, (iii) has a substantially uniform or constant CD or may have a CD that varies throughout the component, and/or (iv) may have a CD that is equal to or less than the CD of the components contained within the fixed layer 1000 (e.g., the CD of the crown variable component may be less than the CD of the crown fixed component).

Figure 73:
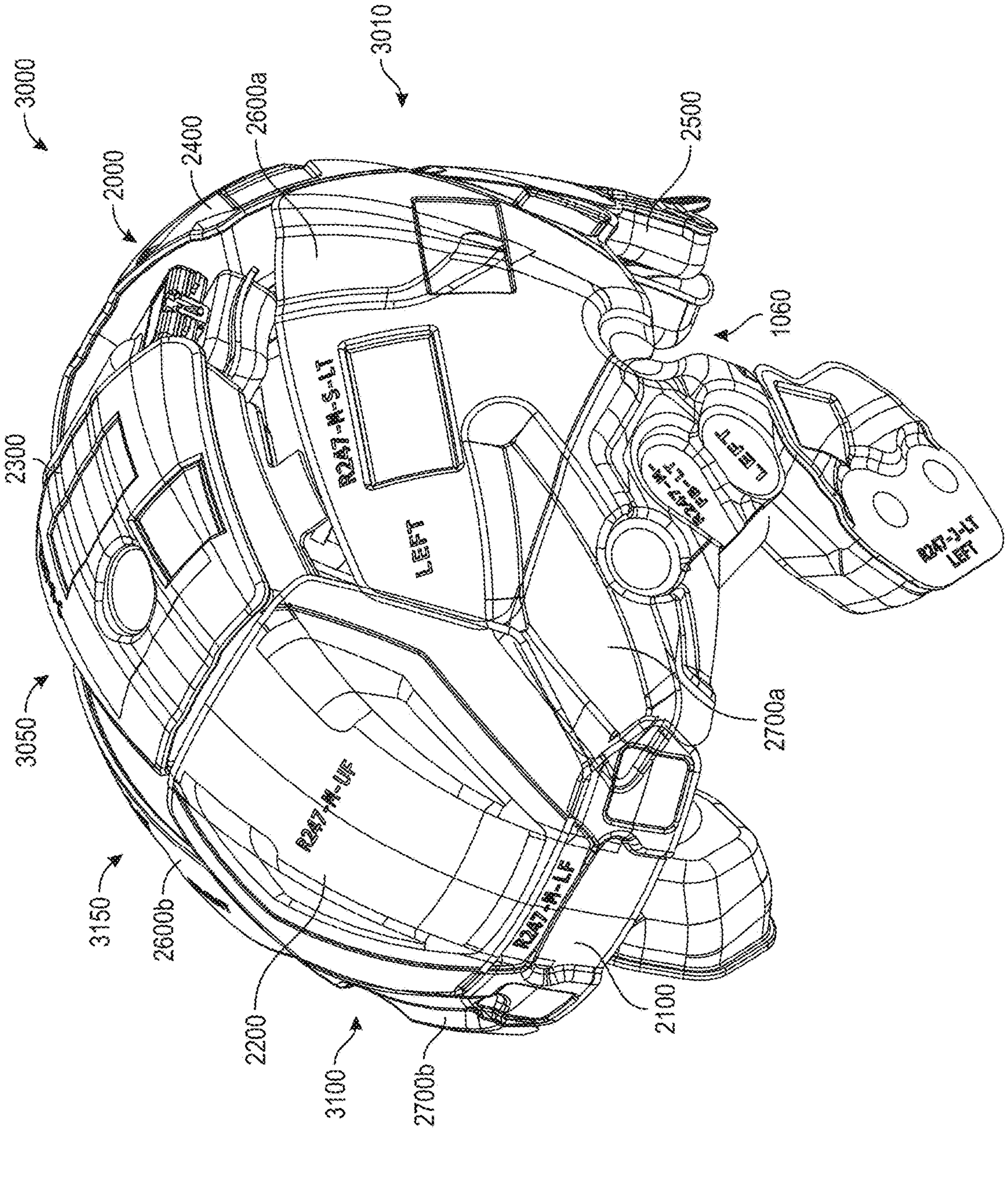
FIG. 73 is a perspective view of the fully assembled components of the fixed layer of the energy management assembly for the protective sports helmet.
Figure 75:
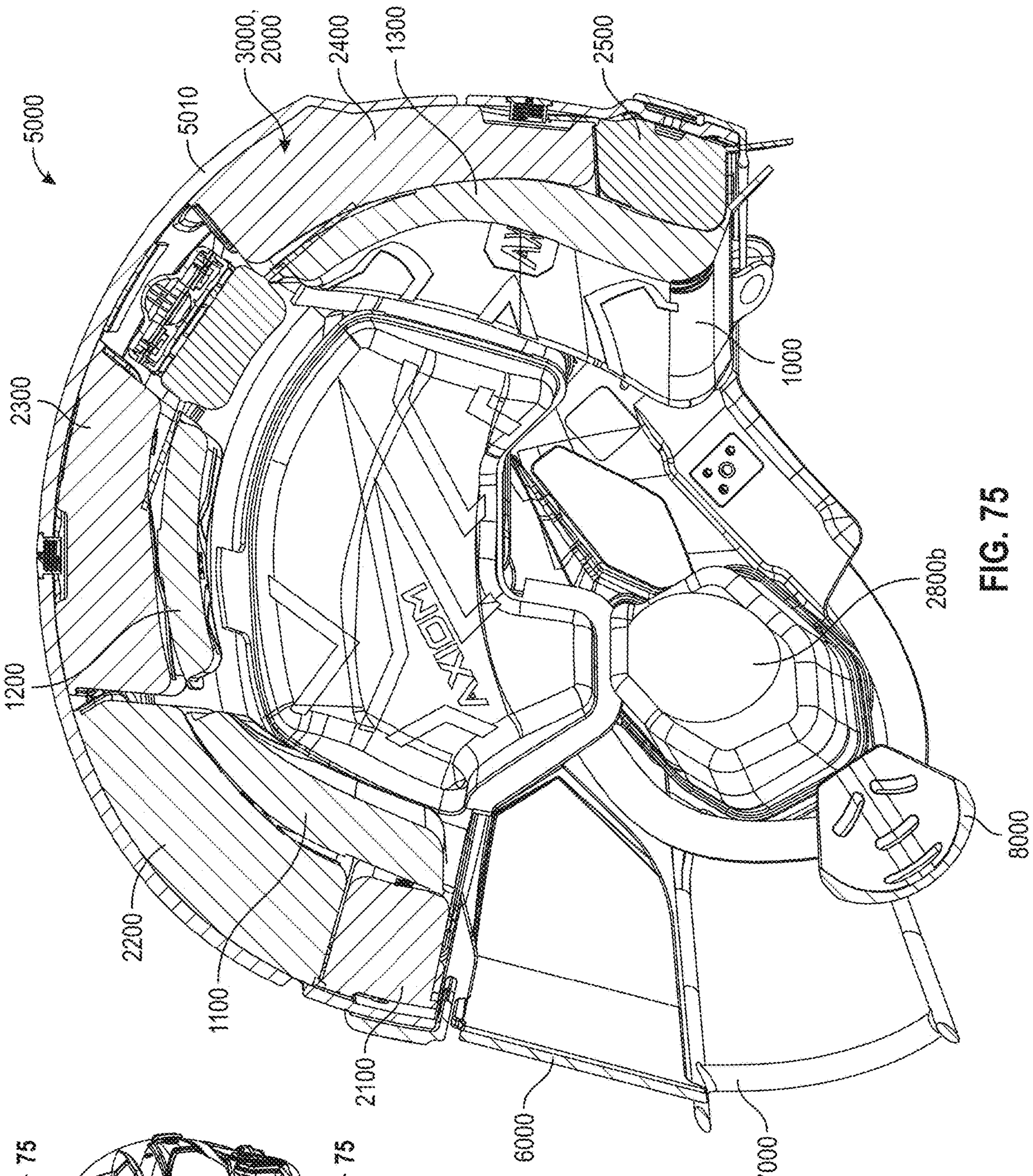
FIG. 75 is a cross-section view of the helmet shell and the energy management assembly taken along line 75-75 of FIG. 74.
Figure 74:
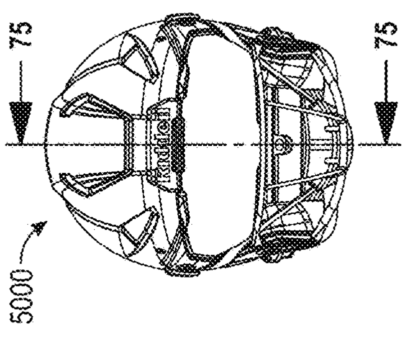
FIG. 74 is a front view of the helmet shell and the energy management assembly for the protective sports helmet.
Figure 77:
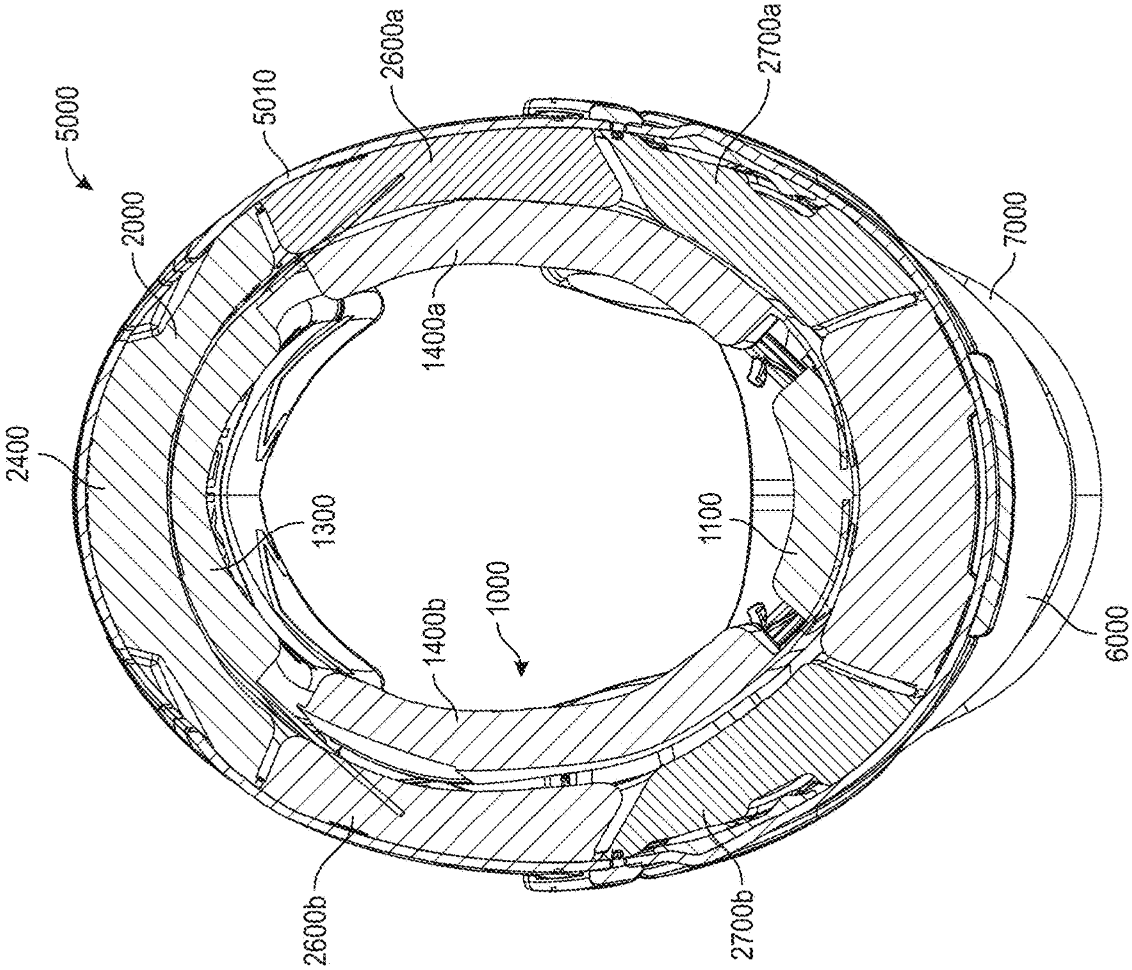
FIG. 77 is a cross-section view of the helmet shell and the energy management assembly taken along line 77-77 of FIG. 76.
Figure 76:
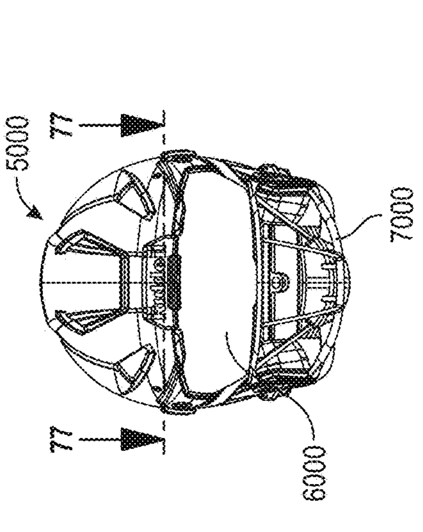
FIG. 76 is a front view of the helmet shell and the energy management assembly for the protective sports helmet.
Figure 79:
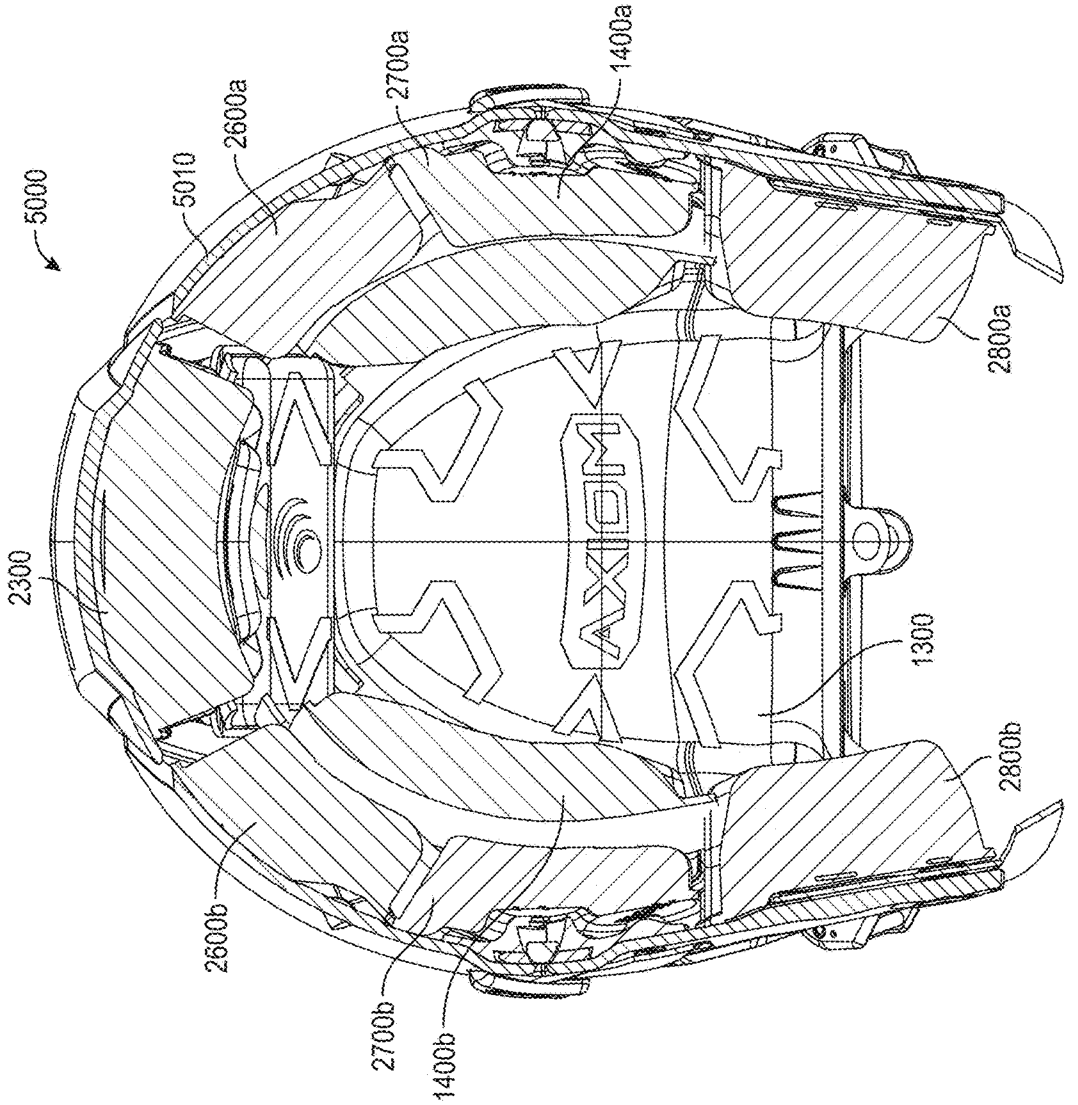
FIG. 79 is a cross-section view of the helmet shell and the energy management assembly taken along line 79-79 of FIG. 78.
Figure 78:
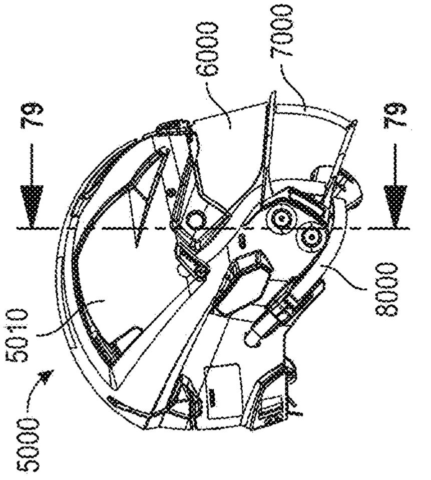
FIG. 78 is a side view of the helmet shell and the energy management assembly for the protective sports helmet.

Once the components of the variable layer 2000 and the components of the fixed layer 1000 have been obtained, the energy attenuation assembly 3000 may be created by combining the components of the fixed layer 1000 and components of the variable layer 2000. In particular, the energy attenuation assembly 3000 include: (i) a rear energy attenuation member 3010 comprised of: (a) rear fixed component 1300, and (b) rear variable component 2400 and occipital variable component 2500, (ii) left and right side energy attenuation member 3150 comprised of: (a) side fixed component 1400*a, b*, and (b) side variable component 2600*a, b* and frontal boss variable component 2700*a, b*, (iii) a crown energy attenuation member 3050 comprised of: (a) crown fixed component 1200, and (b) a crown variable component 2300, and (iv) a front energy attenuation member 3100 comprised of: (a) fixed front component 1100, and (b) a lower front component 2100 and a upper front component 2200. Each of the rear, sides, crown, and front members 3010, 3050, 3100, and 3150 and the control module assembly 3200 can be assembled to form the energy attenuation assembly 3000, which is shown in FIG. 73. It should be understood that the energy attenuation assembly 3000 may have more or less components described herein. Once the energy attenuation assembly 3000 has been assembled, it can be installed in the selected helmet shell 5010 and secured therein by the energy attenuation connector 3300. Said energy attenuation connector 3300 is disclosed in U.S. Pat. No. 11,399,588 and is incorporated herein by reference.

It should be understood that the inner surface of the fixed layer 1000 does not have a topography that substantially matches the topography of the payer's head in an uncompressed state. In other words, the energy attenuation assembly 3000 is not bespoke for the player; Instead, the pre-manufactured components that provide an optimal fit for the player have been selected based on the head data that was obtained from the player. As such, the pressure exerted on the player's head by the energy attenuation assembly 3000, when the helmet is in a worn, but pre-impact state, may have slight variations between the energy attenuation members 3010, 3050, 3100, 3150. Nevertheless, these compressions and pressures should be isotropic, homogeneous, or even as possible. Additionally, said compressions and pressures should be: (i) between 0.25 psi and 10 psi, preferable between 0.75 psi and 5 psi and most preferable 1 and 3 psi and (ii) between 1.5 mm and 10 mm, preferable between 2.5 mm and 6 mm most preferable between 3.5 mm and 6.5 mm. These compressions and pressures can be accurately determined due to the unique configuration of the energy attenuation assembly and do not require complex calculations that are prone to inaccuracies.

M. ALTERNATIVE EMBODIMENTS

While a first embodiment of the method for selecting an optimal combination of pre-manufactured components that "best fit" the player's head is disclosed above, it should be understood that other methods of accomplishing this same goal are contemplated by this disclosure. For example, a first alternative embodiment for selecting an optimal combination of pre-manufactured components includes: (i) obtaining head data, (ii) forming a complete head model 120.99, (iii) providing a computerized helmet template 200.99 that includes: (a) threshold intersection coordinates 226.2, 226.4, (b) energy attenuation intersection coordinates 266.2, 266.4, (iv) importing and aligning the complete head model 120.99, (v) determining player intersection coordinates 420.2, 420.4, (vi) calculating the: (a) shell fit values by determining the distance between the threshold intersection coordinates 226.2, 226.4 and the player intersection coordinates 420.2, 420.4, and (b) energy attenuation fit values by determining the distance between the energy attenuation intersection coordinates 266.2, 266.4 and the player intersection coordinates 420.2, 420.4, (vii) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (viii) compare the energy attenuation fit values against the preset ideal value in order to determine the energy attenuation fit values that are closest to the preset ideal value, (ix) identify the energy attenuation components that are associated with the selected energy attenuation fit values; and (x) obtain the selected pre-manufactured helmet shell and install in said shell the: (a) identified pre-manufactured energy attenuation components (e.g., variable layer components), and (b) the pre-manufactured components of the fixed layer 1000. It should be understood that in this alternative embodiment, the threshold intersection coordinates 226.2, 226.4, energy attenuation intersection coordinates 266.2, 266.4, and the player intersection coordinates 420.2, 420.4 are determined using the same method that is disclosed above (e.g., intersections of the vector arrays 209.2.99, 209.4.99 that extend from helmet template reference point(s) 207.2.99, 207.4.99).

In a second alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) energy attenuation surfaces 264.12.2-264.12.14, (iv) importing and aligning the complete head model 120.99, (v) calculating the: (a) shell fit values by determining distances between the outer surface of the complete head model 120.99 and the threshold surfaces 224.2, 224.4 and normal to the outer surface of the complete head model 120.99, and (b) energy attenuation fit values by determining the distances between the outer surface of the complete head model 120.99 and the energy attenuation surfaces 264.12.2-264.12.14 and normal to the outer surface of the complete head model 120.99, (vii) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (viii) compare the energy attenuation fit values against the preset ideal value in order to determine the energy attenuation fit values that are closest to the preset ideal value, (ix) identify the energy attenuation components that are associated with the selected energy attenuation fit values; and (x) obtain the selected pre-manufactured helmet shell and install in said shell the: (a) identified pre-manufactured energy attenuation components (e.g., variable layer components), and (b) the pre-manufactured components of the fixed layer 1000.

In a third alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) energy attenuation surfaces 264.12.2-264.12.14, (iv) importing and aligning the complete head model 120.99, (v) calculating the: (a) shell fit values by determining distances between the outer surface of the complete head model 120.99 and the threshold surfaces 224.2, 224.4 and normal to the threshold surfaces 224.2, 224.4, and (b) energy attenuation fit values by determining the distances between the outer surface of the complete head model 120.99 and the energy attenuation surfaces 264.12.2-264.12.14 and normal to the energy attenuation surfaces 264.12.2-264.12.14, (vii) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (viii) compare the energy attenuation fit values against the preset ideal value in order to determine the energy attenuation fit values that are closest to the preset ideal value, (ix) identify the energy attenuation components that are associated with the selected energy attenuation fit values; and (x) obtain the selected pre-manufactured helmet shell and install in said shell the: (a) identified pre-manufactured energy attenuation components (e.g., variable layer components), and (b) the pre-manufactured components of the fixed layer 1000.

In a fourth alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) energy attenuation surfaces 264.12.2-264.12.14, (iv) importing and aligning the complete head model 120.99, (v) calculating the shell fit values by determining distances between the outer surface of the complete head model 120.99 and the threshold surfaces 224.2, 224.4, (vi) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (vii) obtaining a digital representation of the selected helmet shell, (viii) calculating: (a) energy attenuation line lengths by determining the distances between the inner surface of the selected helmet shell and energy attenuation surfaces 264.12.2-264.12.14, and (b) player line lengths by determining the distances between the inner surface of the selected helmet shell and the outer surface of the complete head model 120.99, (ix) calculating energy attenuation fit values by subtracting the player line lengths from the energy attenuation line lengths, (x) compare the energy attenuation fit values against the preset ideal value in order to determine the energy attenuation fit values that are closest to the preset ideal value, (ix) identify the energy attenuation components that are associated with the selected energy attenuation fit values; and (x) obtain the selected pre-manufactured helmet shell and install in said shell the: (a) identified pre-manufactured energy attenuation components (e.g., variable layer components), and (b) the pre-manufactured components of the fixed layer 1000.

In a fifth alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) energy attenuation surfaces 264.12.2-264.12.14, (iv) importing and aligning the complete head model 120.99, (v) calculating the shell fit values by determining distances between the outer surface of the complete head model 120.99 and the threshold surfaces 224.2, 224.4, (vi) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (vii) generate an ideal offset surface, wherein said surface is positioned an ideal offset distance or outward (e.g., 8 mm for non-jaw areas and 6 mm for jaw areas) from the outer surface of the complete head model 120.99, (viii)

determine the ideal offset surface distances by calculating the distance between the ideal surface and each of the energy attenuation surfaces 264.12.2-264.12.14, (ix) identify the smallest ideal surface distances and said energy attenuation components that are associated with the identified smallest distances; and (x) obtain the selected pre-manufactured helmet shell and install in said shell the: (a) identified pre-manufactured energy attenuation components (e.g., variable layer components), and (b) the pre-manufactured components of the fixed layer 1000. It should be understood that calculating the distances between the ideal offset surface and each of the energy attenuation surfaces 264.12.2-264.12.14 can be accomplished in any manner described herein (e.g., described in the main embodiment or any of alternative embodiments one, two, three, or four).

In a sixth alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) interior energy attenuation surfaces that are based on the interior surface of energy attenuation members (e.g., the inner surface of the combination of the fixed and variable components), (iv) importing and aligning the complete head model 120.99, (v) calculating the shell fit values by determining distances between the outer surface of the complete head model 120.99 and the threshold surfaces 224.2, 224.4, (vi) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (vii) generate an inset ideal surface, wherein said surface is positioned an ideal inset distance or inward (e.g., 6.5 mm for non-jaw areas and 1.5 mm for jaw areas) from the outer surface of the complete head model 120.99, (viii) determine the ideal surface distances by calculating the distance between the ideal inset surface and each of the interior energy attenuation surfaces, (ix) identify the smallest ideal surface distances and said energy attenuation components that are associated with the identified smallest distances; and (x) obtain the selected pre-manufactured helmet shell and install in said shell the: (a) identified pre-manufactured energy attenuation components (e.g., variable layer components), and (b) the pre-manufactured components of the fixed layer 1000. It should be understood that calculating the distances between the ideal inset surface and each of the interior energy attenuation surfaces can be accomplished in any manner described herein (e.g., described in the main embodiment or any of alternative embodiments one, two, three, or four). It should further be understood that this embodiment is configured to allow this method to apply to a monolithic energy attenuation member. Or in other words, an energy attenuation member that does not include both a fixed layer and a variable layer.

In a seventh alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, and (b) energy attenuation surfaces 264.12.2-264.12.14, (iv) importing and aligning the complete head model 120.99, (v) taking cross-sections of the combination of the complete head model 120.99 and the computerized helmet template 200.99 at predetermined locations, (vi) for each cross-section, calculating the shell fit values by determining distances between the outer surface of the complete head model 120.99 and the threshold surfaces 224.2, 224.4, (vi) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (vii) for each cross-section, calculating the energy attenuation values by determining distances between the outer surface of the complete head model 120.99 and the energy attenuation surfaces 264.12.2-264.12.14, (vii) compare the energy attenuation fit values against the preset ideal value in order to determine the energy attenuation fit values that are closest to the preset ideal value, (ix) identify the energy attenuation components that are associated with the selected energy attenuation fit values; and (x) obtain the selected pre-manufactured helmet shell and install in said shell the: (a) identified pre-manufactured energy attenuation components (e.g., variable layer components), and (b) the pre-manufactured components of the fixed layer 1000.

In an eighth alternative embodiment for selecting an optimal combination of pre-manufactured components includes: (i) obtaining head data, (ii) forming a complete head model 120.99, (iii) providing a computerized helmet template 200.99 that includes: (a) threshold surfaces 224.2, 224.4, (b) energy attenuation surfaces 264.12.2-264.12.14, and (c) energy attenuation envelopes that extend between a mid-point positioned between a set of energy attenuation surfaces 264.12.2-264.12.14, and a mid-point positioned between an adjacent set of energy attenuation surfaces 264.12.2-264.12.14, (iv) importing and aligning the complete head model 120.99, (v) calculating the shell fit values by determining distances between the outer surface of the complete head model 120.99 and the threshold surfaces 224.2, 224.4, (vi) if the shell fit values: (a) in connection with threshold surface 224.2 are negative then select the small size shell, (b) in connection with threshold surface 224.4 are positive then select the large size shell, and (c) in connection with threshold surface 224.2 are positive and in connection with threshold surface 224.4 are negative, then select the medium size shell, (vii) generate an ideal offset surface, wherein said surface is positioned an ideal offset distance or outward (e.g., 8 mm for non-jaw areas and 6 mm for jaw areas) from the outer surface of the complete head model 120.99, (viii) determining the energy attenuation envelope that the ideal offset surface is positioned within, (ix) identify the energy attenuation components that are associated with the energy attenuation envelope that the ideal offset surface is positioned within; and (x) obtain the selected pre-manufactured helmet shell and install in said shell the: (a) identified pre-manufactured energy attenuation components (e.g., variable layer components), and (b) the pre-manufactured components of the fixed layer 1000.

N. CROSS-REFERENCE TO OTHER APPLICATIONS

U.S. Pat. Nos. 10,362,829, 10,506,841, 10,561,193, 10,721,987, 10,780,338, 10,932,514, 10,948,898, 11,033, 796, U.S. patent application Ser. Nos. 16/543,371, 16/691, 436, 16/712,879, 16/813,294, 17/135,099, 17/164,667, 17/327,641, 17/647,459, U.S. Provisional Patent Application Ser. Nos. 61/754,469, 61/812,666, 61/875,603, 61/883, 087, 63/079,476, 63/157,337, 63/188,836, U.S. Design Pat. Nos. D603,099, D764,716, D850,011, D850,012, D850,013, D946,833, D939,782 D939,151, U.S. Design patent application Ser. Nos. 29/797,439, 29/797,453, 29/797,458, 29/829,992, 29/839,498, the disclosure of which are hereby incorporated by reference in their entirety for all purposes.

O. INDUSTRIAL APPLICATION

In addition to applying to protective contact sports helmets-namely, football, hockey and lacrosse helmets—the disclosure contained herein may be applied to design and develop helmets for: baseball player, cyclist, polo player, equestrian rider, rock climber, auto racer, motorcycle rider, motocross racer, skier, skater, ice skater, snowboarder, snow skier and other snow or water athletes, skydiver. The method, system, and devices described herein may be applicable to other heads (e.g., shins, knees, hips, chest, shoulders, elbows, feet and wrists) and corresponding gear or clothing (e.g., shoes, shoulder pads, elbow pads, wrist pads).

As is known in the data processing and communications arts, a general-purpose computer typically comprises a central processor or other processing device, an internal communication bus, various types of memory or storage media (RAM, ROM, EEPROM, cache memory, disk drives etc.) for code and data storage, and one or more network interface cards or ports for communication purposes. The software functionalities involve programming, including executable code as well as associated stored data. The software code is executable by the general-purpose computer. In operation, the code is stored within the general-purpose computer platform. At other times, however, the software may be stored at other locations and/or transported for loading into the appropriate general-purpose computer system.

A server, for example, includes a data communication interface for packet data communication. The server also includes a central processing unit (CPU), in the form of one or more processors, for executing program instructions. The server platform typically includes an internal communication bus, program storage and data storage for various data files to be processed and/or communicated by the server, although the server often receives programming and data via network communications. The hardware elements, operating systems and programming languages of such servers are conventional in nature, and it is presumed that those skilled in the art are adequately familiar therewith. The server functions may be implemented in a distributed fashion on a number of similar platforms, to distribute the processing load.

Hence, aspects of the disclosed methods and systems outlined above may be embodied in programming. Program aspects of the technology may be thought of as "products" or "articles of manufacture" typically in the form of executable code and/or associated data that is carried on or embodied in a type of machine-readable medium. "Storage" type media includes any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

A machine-readable medium may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the disclosed methods and systems. Volatile storage media include dynamic memory, such as main memory of such a computer platform. Tangible transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards, paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

It is to be understood that the invention is not limited to the exact details of construction, operation, exact materials or embodiments shown and described, as obvious modifications and equivalents will be apparent to one skilled in the art. While the specific embodiments have been illustrated and described, numerous modifications come to mind without significantly departing from the spirit of the invention, and the scope of protection is only limited by the scope of the accompanying Claims.

The invention claimed is:

1. A method of designing and assembling an American football helmet for a specific player from a collection of pre-manufactured energy attenuation components selected for the head of the specific player, the method comprising:

obtaining anatomical data of a specific player's head using a scanning device;

creating a body part model of the specific player's head from the obtained anatomical data within a computer software program, wherein said body part model includes an outer surface;

providing a computerized template that includes a plurality of energy attenuation surfaces, wherein the energy attenuation surfaces are individually associated with a group of pre-manufactured energy attenuation components;

aligning the body part model of the player's head within the computerized template;

determining a plurality of fit values, wherein each of the plurality of fit values is defined as a distance extending from the outer surface of the body part model of the player's head to an energy attenuation surface of the plurality of energy attenuation surfaces;

comparing each of the plurality of fit values to a predefined ideal fit value;

selecting a fit value that is closest to the predefined ideal fit value;

identifying a pre-manufactured energy attenuation component from amongst the group of the pre-manufactured energy attenuation components that corresponds to the selected fit value; and installing the identified pre-manufactured energy attenuation component within a helmet shell.

2. The method of claim 1, wherein photogrammetry is utilized with the scanning device to obtain the anatomical data of the specific player's head that is used to create said body part model.

3. The method of claim 1, wherein the outer surface of the body part model substantially matches the outer surface of the specific player's head with a hood disposed thereover.

4. The method of claim 1, wherein an energy attenuation surface represents an inner surface of the pre-manufactured energy attenuation component from amongst the group of the pre-manufactured energy attenuation components.

5. The method of claim 1, wherein the identified pre-manufactured energy attenuation component is not interchangeable with another pre-manufactured energy attenuation component in said group.

6. The method of claim 1, wherein each pre-manufactured energy attenuation component is configured to be installed in a specific location within the helmet shell and cannot be installed in a different location within the helmet shell.

7. The method of claim 1, wherein the pre-manufactured energy attenuation components form a variable layer when said components are installed in the helmet shell, and wherein the variable layer is configured to be different between helmets for different players in order to account for anatomical differences amongst the different players.

8. The method of claim 7, wherein the variable layer includes the following pre-manufactured energy attenuation components: (i) a lower front variable component, (ii) an upper front variable component, (iii) a rear variable component, (iv) an occipital variable component, (v) a side variable component, and (vi) a frontal boss variable component.

9. The method of claim 1, wherein the group of pre-manufactured energy attenuation components includes a plurality of upper front variable components, and wherein each of the upper front variable components has a unique physical configuration.

10. The method of claim 9, wherein the group of pre-manufactured energy attenuation components further includes a single lower front variable component.

11. The method of claim 9, wherein the group of pre-manufactured energy attenuation components further includes a plurality of rear variable components, and wherein each rear variable component has a unique thickness.

12. The method of claim 1, wherein based upon the selected fit value, the installed and identified pre-manufactured energy attenuation component applies a pressure of between 0.75 psi and 5.0 psi upon the head of the specific player when the American football helmet is in a worn, pre-impact state.

13. The method of claim 1, wherein based upon the selected fit value, the installed and identified pre-manufactured energy attenuation component applies pressure to form an interference fit with the head of the specific player when the American football helmet is in a worn, pre-impact state.

14. A method of designing and assembling an American football helmet for a specific player from a collection of pre-manufactured energy attenuation components are selected for the head of the specific player, the method comprising:

obtaining anatomical data of a specific player's head using a scanning device;

creating a model of the specific player's head from the obtained anatomical data within a computer software program, wherein said model includes an outer surface;

aligning the model of the player's head within the computer software program;

providing a plurality of energy attenuation line lengths, wherein an energy attenuation line length corresponds to a pre-manufactured energy attenuation component determining a plurality of player line lengths within the computer software program;

determining a first fit value by assessing a difference between a first player line length and a corresponding first energy attenuation line length;

comparing the first fit value to a predefined first ideal fit value;

based upon said comparing, selecting a first pre-manufactured energy attenuation component from amongst a group of the pre-manufactured energy attenuation components; and installing the first pre-manufactured energy attenuation component within a helmet shell.

15. The method of claim 14, comprising:

determining a second fit value by assessing the difference between a second player line length and a corresponding second energy attenuation line length;

comparing the second fit value to a predefined second ideal fit value;

based upon said comparing, selecting a second pre-manufactured energy attenuation component from amongst the group of the pre-manufactured energy attenuation components; and, installing the second pre-manufactured energy attenuation component within the helmet shell.

16. The method of claim 15, wherein (i) the first pre-manufactured energy attenuation component is installed within a first region of the helmet shell and (ii) the second pre-manufactured energy attenuation component is installed within a second region of the helmet shell.

17. The method of claim 14, further comprising:

determining a second fit value by assessing the difference between a second player line length and a corresponding second energy attenuation line length;

comparing the second fit value to a predefined second ideal fit value;

based upon said comparing, selecting from amongst (i) a first pre-manufactured energy attenuation component or (ii) a second pre-manufactured energy attenuation component from amongst the group of the pre-manufactured energy attenuation components; and, installing the selected first or second pre-manufactured energy attenuation component within the helmet shell.

18. The method of claim 14, wherein each energy attenuation line length is defined as extending between a reference point and an energy attenuation surface of a plurality of energy attenuation surfaces individually associated with the group of the pre-manufactured energy attenuation components.

19. The method of claim 18, wherein each energy attenuation surface represents an inner surface of the pre-manufactured energy attenuation component from amongst the group of the pre-manufactured energy attenuation components.

20. The method of claim 14, wherein each player line length is defined as extending between a reference point within the computer software program to an outer surface of the model of the specific player's head.

21. The method of claim 14, wherein based upon the first fit value, the first pre-manufactured energy attenuation component applies a pressure of between 0.75 psi and 5.0 psi upon the head of the specific player when the American football helmet is in a worn, pre-impact state.

22. The method of claim 14, wherein based upon the first fit value, the first pre-manufactured energy attenuation component applies pressure to form an interference fit with the head of the specific player when the American football helmet is in a worn, pre-impact state.

23. The method of claim 14, wherein the selected first pre-manufactured energy attenuation component is configured to be installed in only one specific location within the helmet shell and cannot be installed in a different location within the helmet shell.

* * * * *